(12) United States Patent
Muto et al.

(10) Patent No.: US 8,138,600 B2
(45) Date of Patent: Mar. 20, 2012

(54) SEMICONDUCTOR DEVICE AND METHOD OF MANUFACTURING THE SAME

(75) Inventors: Akira Muto, Tokyo (JP); Ichio Shimizu, Tokyo (JP); Tetsuo Iljima, Tokyo (JP); Toshiyuki Hata, Tokyo (JP); Katsuo Ishizaka, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 241 days.

(21) Appl. No.: 11/776,393

(22) Filed: Jul. 11, 2007

(65) Prior Publication Data

US 2008/0012045 A1 Jan. 17, 2008

(30) Foreign Application Priority Data

Jul. 12, 2006 (JP) ................. 2006-191830

(51) Int. Cl.
*H01L 23/34* (2006.01)
(52) U.S. Cl. ............... 257/724; 257/E25.012
(58) Field of Classification Search ........... 257/133, 257/143, 144, 149, 150, 152, 173, 177, 182, 257/723, 724, E25.012
See application file for complete search history.

(56) References Cited

U.S. PATENT DOCUMENTS

| 6,642,576 B1 | 11/2003 | Shirasawa et al. | |
| 6,885,096 B2 * | 4/2005 | Hirahara et al. | 257/692 |
| 6,960,825 B2 * | 11/2005 | Mamitsu et al. | 257/718 |
| 7,247,929 B2 * | 7/2007 | Miura et al. | 257/675 |
| 2004/0070072 A1 * | 4/2004 | Mamitsu et al. | 257/718 |
| 2005/0121701 A1 * | 6/2005 | Hirano et al. | 257/287 |
| 2005/0212101 A1 * | 9/2005 | Funato et al. | 257/666 |

FOREIGN PATENT DOCUMENTS

| JP | 2004-47850 A | 2/2004 |
| JP | 2005-167075 A | 6/2005 |
| JP | 2005-243685 A | 9/2005 |
| JP | 2005-277150 A | 10/2005 |
| JP | 2005-286187 A | 10/2005 |

* cited by examiner

*Primary Examiner* — Ha Tran T Nguyen
*Assistant Examiner* — Vongsavanh Sengdara
(74) *Attorney, Agent, or Firm* — Miles & Stockbridge P.C.

(57) ABSTRACT

A semiconductor device is provided, which is capable of improving mounting flexibility relatively and increasing general versatility, as well as realizing heat radiation characteristics and low on-resistance. Moreover, the semiconductor device is provided, which is capable of improving reliability, performing processing in manufacturing processes easily and reducing manufacturing costs. Also, the semiconductor device capable of decreasing the mounting area is provided. A semiconductor chip in which an IGBT is formed and a semiconductor chip in which a diode is formed are mounted over a die pad. Then, the semiconductor chip and the semiconductor chip are connected by using a clip. The clip is arranged so as not to overlap with bonding pads formed at the semiconductor chip in a flat state. The bonding pads formed at the semiconductor chip are connected to electrodes by using wires.

29 Claims, 44 Drawing Sheets

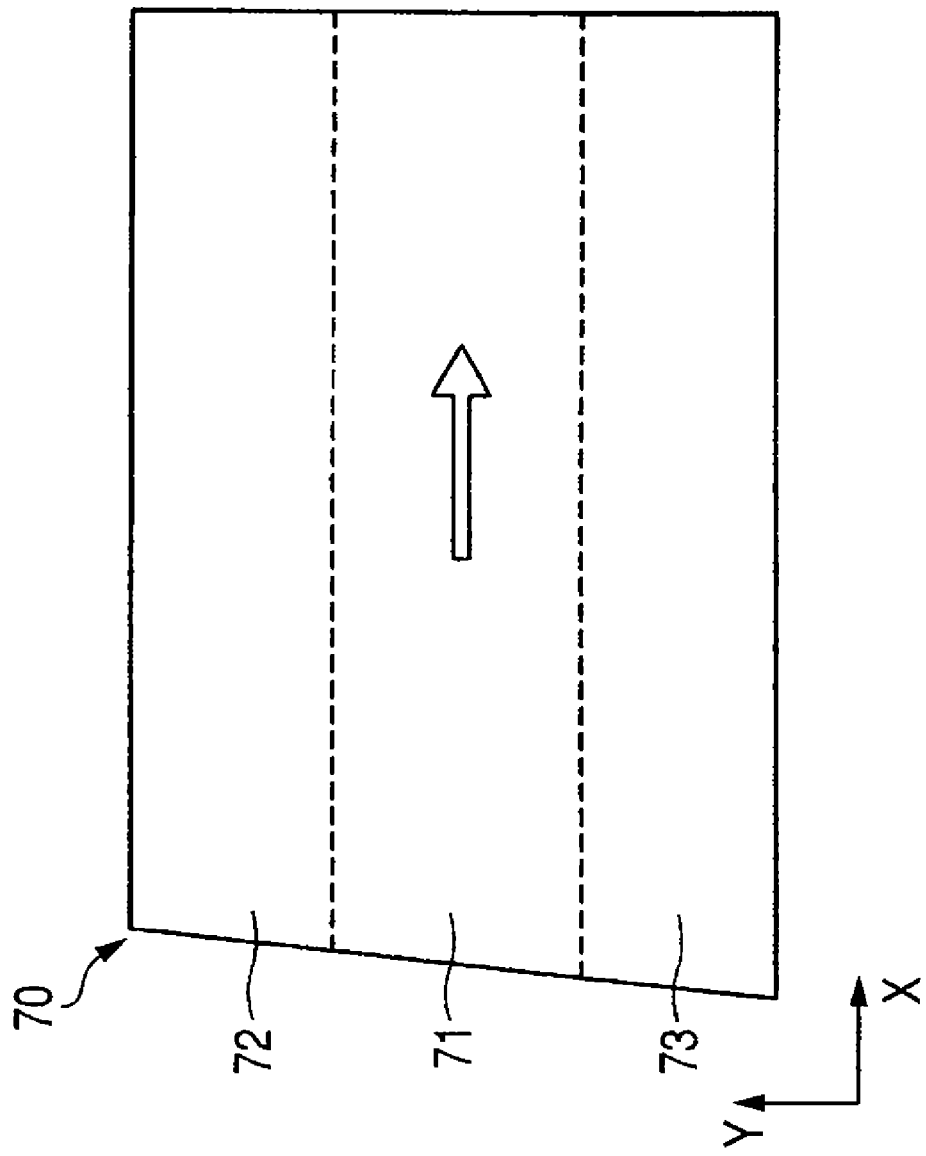

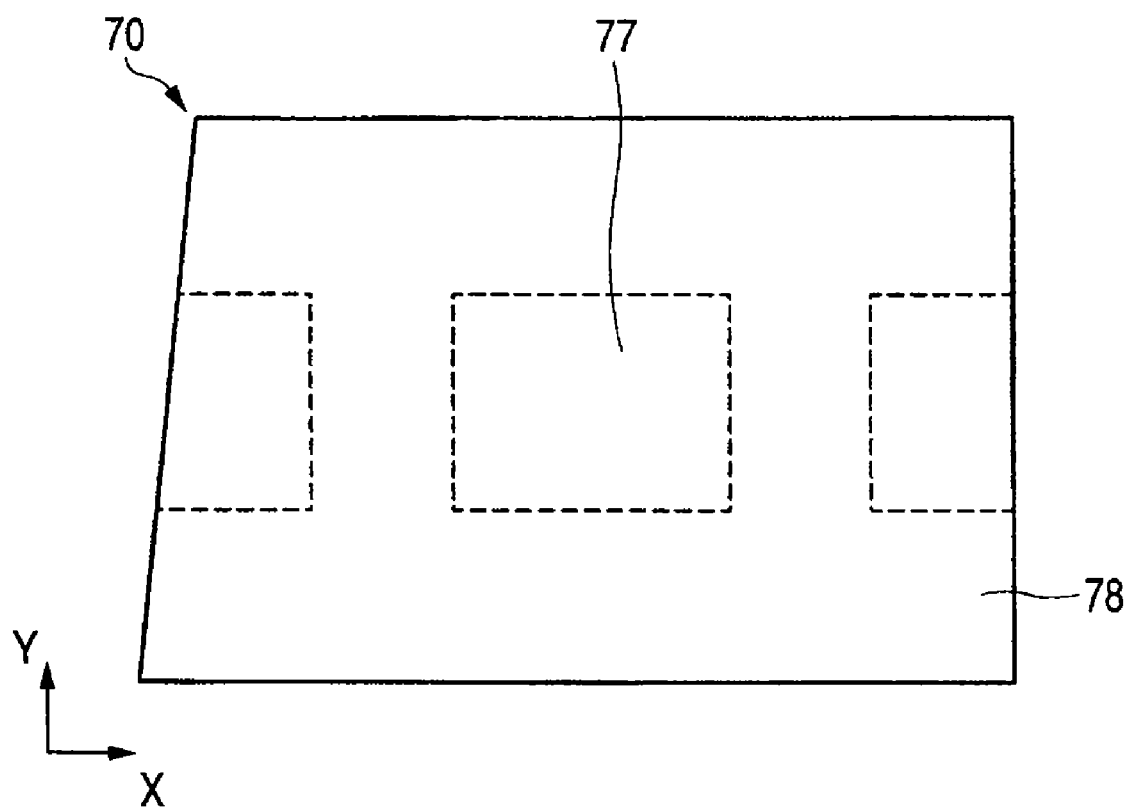

FIG. 29A
FIG. 29B
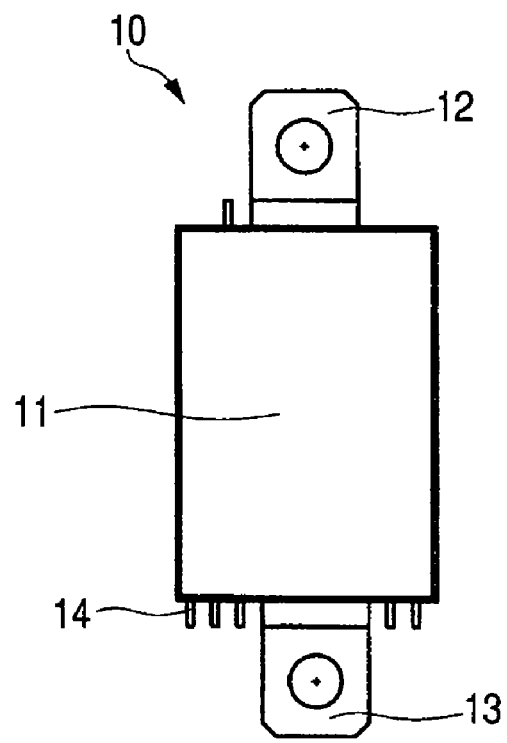
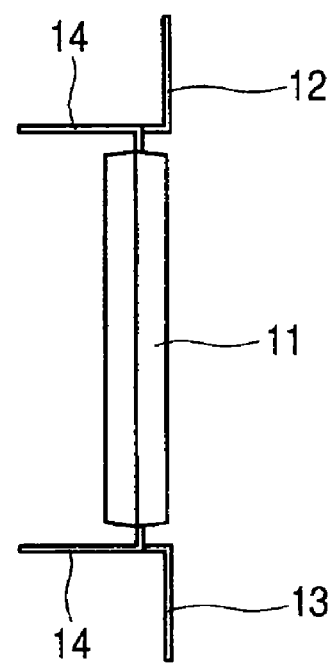

SEMICONDUCTOR DEVICE AND METHOD OF MANUFACTURING THE SAME

CROSS-REFERENCE TO RELATED APPLICATIONS

The disclosure of Japanese Patent Application No. 2006-191830 filed on Jul. 12, 2006 including the specification, drawings and abstract is incorporated herein by reference in its entirety.

BACKGROUND OF THE INVENTION

1. Field of the Invention

The invention relates to a semiconductor device and a manufacturing technology of the same, for example, relates to a technology which is effective when applied to a semiconductor device and manufacture thereof used for on-vehicle motor control.

2. Background Art

In Japanese patent laid-open No. 2005-243685 (Patent Document 1), a semiconductor device in which one IGBT (Insulated Gate Bipolar Transistor) is formed in one package is disclosed.

In Japanese patent laid-open No. 2004-47850 (Patent Document 2), a structure in which two IGBTs and two diodes are formed in one package and a wire is not used for connection between IGBTs and diodes is disclosed.

In Japanese patent laid-open No. 2005-167075 (Patent Document 3), Japanese patent laid-open No. 2005-277150 (Patent Document 4) and Japanese patent laid-open No. 2005-286187 (Patent Document 5), a structure in which one IGBT and one diode are formed in one package and a clip is used for connecting between the IGBT and the diode is disclosed. In addition, a detection circuit for IGBT is provided, and terminals of the detection circuit and bonding pads of a semiconductor chip in which the IGBT is formed are connected through wires. In this case, the clip is formed just over the bonding pads. That is, the clip is formed over the bonding pads connected by wires. Here, the clip and the bonding pads are arranged at a region in which they overlap in a flat state and formed so that the wires connected to the bonding pads do not touch to the clip by sandwiching a spacer between the clip and the semiconductor chip.

[Patent Document 1]
Japanese patent laid-open No. 2005-243685
[Patent Document 2]
Japanese patent laid-open No. 2004-47850
[Patent Document 3]
Japanese patent laid-open No. 2005-167075
[Patent Document 4]
Japanese patent laid-open No. 2005-277150
[Patent Document 5]
Japanese patent laid-open No. 2005-286187

SUMMARY OF THE INVENTION

For example, two IGBTs and two diodes (free-wheel diodes) are connected to each phase of a three-phase motor. Namely, six IGBTs and six diodes are connected to the three-phase motor. In the case that the semiconductor device in which one IGBT is formed in one package is used such as the one disclosed in Patent Document 1, in the three-phase motor, six semiconductor devices in which each device includes one IGBT formed in one package and six semiconductor devices in which each device includes one diode formed in one package are respectively necessary. Therefore, there is a problem that the mount area for IGBTs and diodes becomes large or a problem that the number for mounting processes in which semiconductor devices such as IGBTs and diodes are mounted over a mounting substrate increases.

There is a semiconductor device in which two IGBTs and two diodes are formed in one package corresponding to each phase of the three-phase motor. The semiconductor device can reduce the mount area for IGBTs and diodes, as well as reduce the number of processes for mounting the semiconductor devices such as IGBTs and diodes over the mounting substrate.

However, in the semiconductor device in which two IGBTs and two diodes are formed in one package, wiring flexibility at the time of being mounted to the mounting substrate decreases. The layout structure of the mounting substrate is often changed according to products, and when two IGBTs and two diodes are formed in one package corresponding to each phase, there is a problem that it is difficult to arrange the semiconductor devices efficiently with respect to the change of wiring layout. In short, there is a problem that mounting flexibility deteriorates. And further, there is a problem that heating value increases because two IGBTs and two diodes are integrated. Particularly, the IGBTs and diodes are connected by wires such as gold wires, therefore, there is a problem that heat radiation efficiency is reduced or a problem that on-resistance increases. In addition, there is a problem that general versatility is insufficient because two IGBT and two diodes are formed in one package.

There is a structure in which two IGBTs and two diodes are formed in one package and a wire is not used for connection between IGBTs and diodes as described in Patent Document 2. The structure can prevent cutting of wires as well as can improve reliability and heat radiation efficiency. However, the problem that mounting flexibility deteriorates and the problem that the general versatility deteriorates still exist.

For example, in a three-phase motor for on-vehicle use, such as the one mounted on a hybrid car, high reliability is required even under severe conditions, therefore, overcurrent and abnormal temperature increase are detected by providing a current detection circuit and a temperature detection circuit at the IGBT to protect the IGBT. However, since these detection circuits are not described in the technology described in Patent Document 2, there is a problem that it is difficult to increase reliability of the IGBT. That is, it is difficult to be used for on-vehicle use and the like requiring high reliability. In addition, in the technology described in Patent Document 2, a control electrode which controls a gate electrode is formed at an edge crossing a pair of edges where an emitter electrode for external connection and a collector electrode for external connection are formed. This is because it is difficult to arrange the control electrode at the same edge since the widths of the emitter electrode for external connection and the collector electrode for external connection are large.

Consequently, in the technology described in Patent Document 2, the control electrode which controls the gate electrode and the emitter electrode for external connection (or collector electrode for external connection) are formed at edges crossing each other. That is, wiring is drawn from edges of semiconductor device, which crosses each other. In such structure, there is a problem that processing is difficult as well as the mount area increases in manufacturing processes of the semiconductor device. There is a process in which a lead frame having a multiple structure is processed in manufacturing processes of the semiconductor device. When the electrodes (wiring) are formed at edges crossing each other, it is difficult to form repeating patterns of the lead frame (a pattern which forms one semiconductor device) close to each other, namely, difficult to form the lead frame efficiently. Specifically, since an electrode pattern (wiring pattern) is formed at edges crossing each other, the repeating patterns adjacent to each other have to be separated for spaces where the electrode patterns are formed, therefore, it becomes difficult to form the repeating patterns closely. Therefore, there is a problem that efficiency of using the lead frame deteriorates and manufacturing costs increase.

According to technologies described in Patent Documents 3 to 5, since one IGBT and one diode are formed in one package, deterioration of mounting flexibility and deterioration of general versatility can be suppressed. Further, since the current detection circuit and the temperature detection circuit are provided at the IGBT, reliability of the IGBT can be improved.

According to technologies described at Patent Documents 3 to 5, the clip is formed over the bonding pads connected by wires. The clip and the bonding pads are arranged at a region in which they overlap in a flat state and formed so that the wires connected to the bonding pads do not touch to the clip by sandwiching a spacer between the clip and the semiconductor chip. When manufacturing such structure, it is necessary to form the clip by providing the spacer after the wires connecting to the bonding pads are formed.

However, in the method of forming the clip after forming the wires, inconvenience shown below occurs. Specifically, the clip is connected using by solder, and in this case, it is necessary to reflow the solder and heat treatment will be applied. At this time, there is a problem that heat loads are added to the wires already formed and an alloy layer is formed at junctions of the wires to weaken the junction strength. Therefore, there is a problem that junctions between the wires and the bonding pads are cut to deteriorate reliability of the semiconductor device. Further, since the clip and the wires are formed at the region in which they overlap in a flat state, there is a problem that the risk in which the clip touches the wires to cause short-circuit failure increases when variations of the height of the spacer and the like are considered.

An object of the invention is to provide a semiconductor device which can relatively improve mounting flexibility and increase general versatility, as well as can realize heat radiation characteristics and low on-resistance. Also, an object thereof is provide a semiconductor device which can improve reliability, in which processing in manufacturing processes is easy and manufacturing costs can be reduced. Further, an object thereof is to provide a semiconductor device which can reduce the mount area.

The above objects, the other objects and novel characteristics of the invention will be clarified from the description of the specification and the attached drawings.

Summary of typical inventions in inventions disclosed in the application will be simply explained as follows.

A semiconductor device according to the invention is a semiconductor device including a first semiconductor chip in which an IGBT is formed and a second semiconductor chip in which a diode is formed, having (a) a die pad over which the first semiconductor chip and the second semiconductor chip are mounted and (b) a collector electrode for external connection integrally formed with the die pad. The device has (c) a plate electrode connecting an emitter electrode arranged at a principal surface of the IGBT to an anode electrode arranged at a principal surface of the diode, (d) an emitter electrode for external connection connected to the plate electrode and (e) a gate electrode for external connection connected to a gate electrode of the IGBT. The device further has (f) a plurality of detection electrodes provided for detecting a state of the IGBT and (g) a plurality of wires connecting between part of a plurality of bonding pads in the first semiconductor chip in which the IGBT is formed and the detection electrodes, and connecting between part of the bonding pads and the gate electrode for external connection. The bonding pads of the first semiconductor chip are formed at a region in which the bonding pads do not overlap with the plate electrode in a flat state.

A method of manufacturing a semiconductor device according to the invention includes the steps of (a) forming a first solder at a first region and a second region over a die pad of a lead frame and (b) mounting a first semiconductor chip in which an IGBT is formed including an emitter electrode thereover at the first region over the die pad in which the first solder is formed. The method further includes the steps of (c) mounting a second semiconductor chip in which a diode is formed including an anode electrode thereover at the second region over the die pad in which the first solder is formed and (d) after the step (c), forming a second solder over the first semiconductor chip and the second semiconductor chip. The method further includes a step of (e) mounting a plate electrode so as to extend over the first semiconductor chip and the second semiconductor chip to connect the emitter electrode of the first semiconductor chip to the anode electrode of the second semiconductor chip through the second solder. After that, the method includes a step of (f) after the step (e), connecting the die pad to the first semiconductor chip and the second semiconductor chip by performing heat treatment to melt and fix the first solder, and connecting the first semiconductor chip and the second semiconductor chip to the plate electrode by melting and fixing the second solder. Then, the method includes a step of (g) after the step (f), connecting a plurality of bonding pads to a plurality of leads by using a plurality of wires, which are formed at a region in which the bonding pads do not overlap with the plate electrode in a flat state in the first semiconductor chip.

An advantage obtained by typical inventions in inventions disclosed in the application will be briefly explained as follows.

The first semiconductor chip in which one IGBT is formed and the second semiconductor chip in which one diode is formed are formed in one package, therefore, mounting flexibility can be relatively improved and general versatility can be increased. Since the IGBT and the diode are connected not by wires but the plate electrode (clip), heat radiation efficiency can be improved and on-resistance can be reduced. The current detection circuit and the temperature detection circuit are provided at the IGBT and the diode, thereby detecting overcurrent or abnormal temperature increase to improve reliability of the IGBT and the diode. In addition, the gate electrode for external connection and the electrode for current detection and the electrode for temperature detection are formed at the first edge which is the same side of the emitter electrode for external connection or at the second edge which is opposite to the first edge, therefore, processing in the manufacturing processes is easy and manufacturing costs can be reduced. Moreover, since the plural bonding pads of the first semiconductor chip are formed at the region in which the bonding pads do not overlap with the clip in a flat state, it is possible to prevent wires connecting to the bonding pads from touching the clip. Since the clip can be formed before the wires, it is possible to prevent the wires from having heat load, and to prevent the junction connection of wires from reducing. The position of the second region of the clip between the first semiconductor chip and the second semiconductor chip is apart from the die pad as compared with the position of the first region of the clip which touches the first semiconductor chip or the second semiconductor chip, therefore, short-circuit failure caused by the solder entering to the side surface of the first semiconductor chip or the second semiconductor chip can be reduced.

BRIEF DESCRIPTION OF THE DRAWINGS

FIG. 20A is a plan view showing a lead frame material in Embodiment 1, and FIG. 20B is a side view of the lead frame material;

FIG. 22 is a plan view showing a lead frame material in a study example;

FIG. 29A is a plan view showing a manufacturing process of the semiconductor device continued from FIG. 28A, and FIG. 29B is a side view of FIG. 29A;

DESCRIPTION OF THE PREFERRED EMBODIMENTS

In the following embodiments, explanation will be performed by dividing into plural sections or embodiments when necessary as a matter of convenience, however, these are not irrelevant to each other and one has relationships of a modification example, the details, additional explanation and the like with part or all of the other without the case particularly specified.

In the following embodiments, when referring to the number of elements (including the number of pieces, numerals, quantity, range and the like), it is not limited to the particular number, and not more than or not less than the particular number except the case particularly specified or the case clearly limited to the particular number in principle.

Furthermore, in the following embodiments, it goes without saying that structural components (including component steps) are not always essential except the case clearly specified or the case considered to be clearly essential in principle.

In the same manner, in the following embodiments, when referring to the shape of structural components and the like, positional relationship and the like, components substantially approximate or similar to the shape and the like are included except the case clearly specified or the case considered to be clearly different in principle. This is the same to the number or the range.

In all drawings for explaining the embodiments, the same numerals are put to the same members in principle and repeated explanation will be omitted. There is a case that hatching is given even it is a plan view for make the drawings easy to understand.

Embodiment 1

Figure 1:
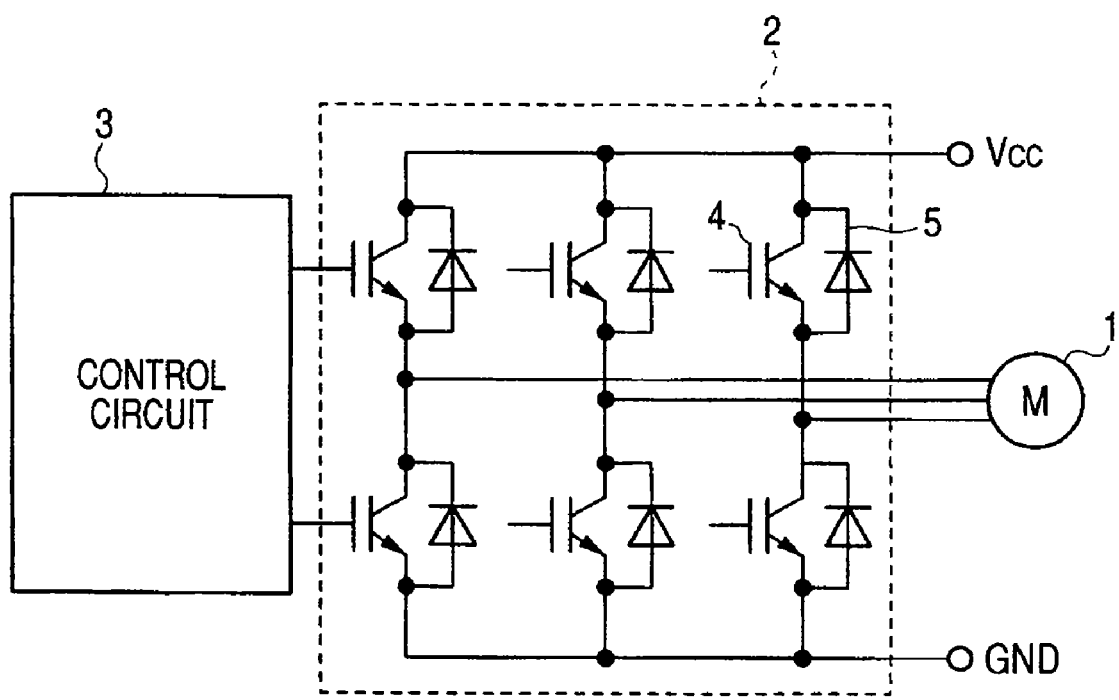
FIG. 1 is a view showing a circuit diagram of a three-phase motor in Embodiment 1 of the invention.

A semiconductor device in Embodiment 1 is used, for example, to a drive circuit of a three-phase motor applied to a hybrid car and the like. FIG. 1 is a view showing a circuit diagram of a three-phase motor in Embodiment 1. In FIG. 1, the three-phase motor includes a three-phase motor 1, a power semiconductor device 2, and a control circuit 3. The three-phase motor 1 is configured to be driven by three phase voltages of different phases. The power semiconductor device 2 is provided with IGBTs 4 and diodes 5 corresponding to three phases. Specifically, in each single phase, the IGBT 4 and the diode 5 are connected in inverse parallel between the power source potential (Vcc) and the input potential of the three-phase motor, and the IGBT 4 and the diode 5 are connected in inverse parallel also between the input potential of the three-phase motor and the ground potential (GND). That is, two IGBTs 4 and two diodes 5 are provided at each phase, namely, six IGBTs 4 and six diodes 5 are provided in three phases. A gate electrode of each IGBT 4 is connected to the control circuit 3, and the IGBTs 4 are controlled by the control circuit 3. In the drive circuit of the three-phase motor thus configured, the three-phase motor 1 is rotated by controlling electric current flowing at the IGBTs 4 included in the power semiconductor device 2 by the control circuit 3.

The semiconductor device in Embodiment 1 relates to the power semiconductor device 2 of FIG. 1, which is the device in which one IGBT 4 and one diode 5 included in the power semiconductor device 2 are formed in one package. That is, the power semiconductor device 2 which drives the three-phase motor 1 is formed by using six semiconductor devices in Embodiment 1.

Figure 2:
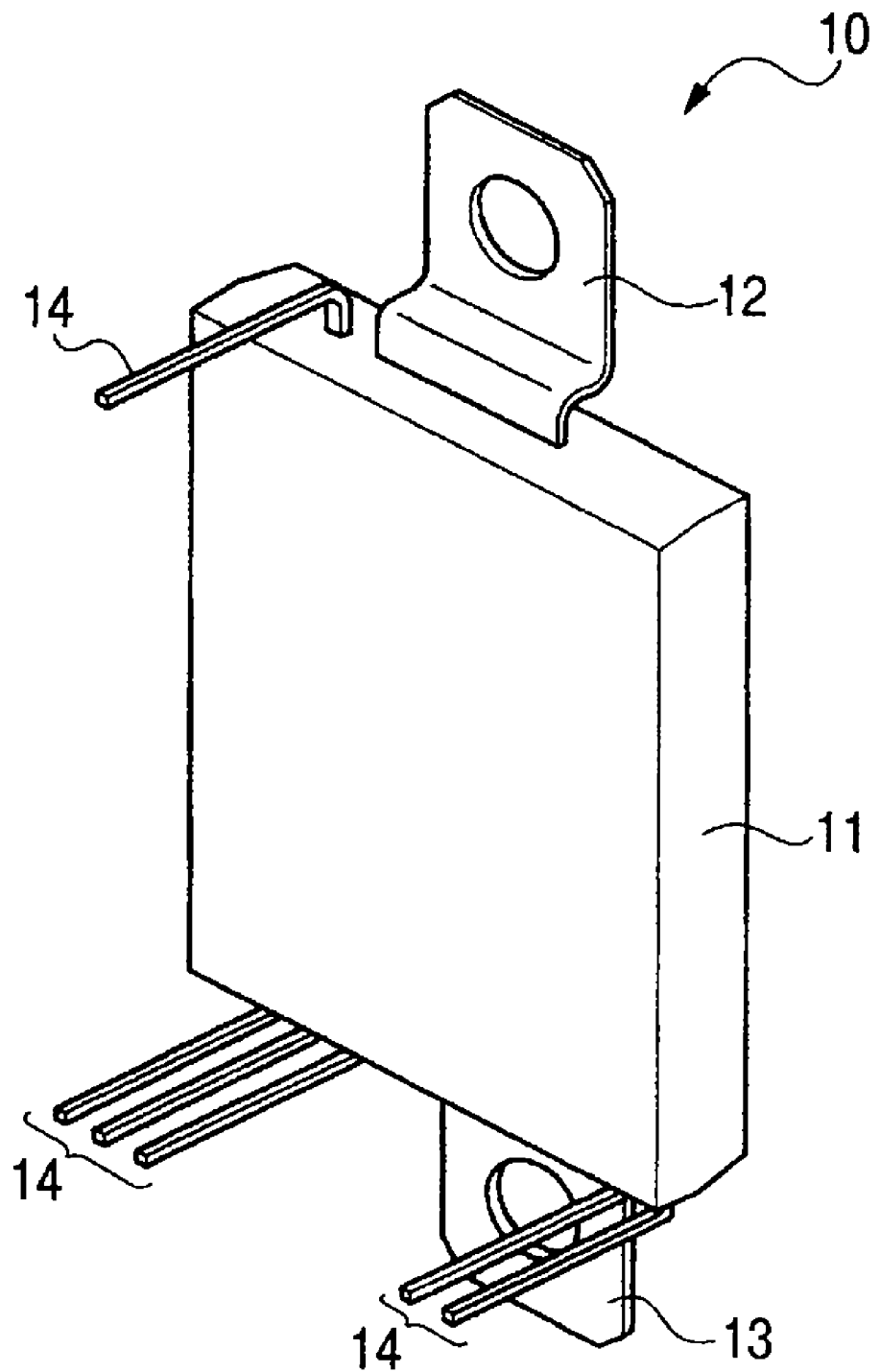
FIG. 2 is a perspective view seen from an external surface side of a semiconductor device in Embodiment 1.
Figure 3:
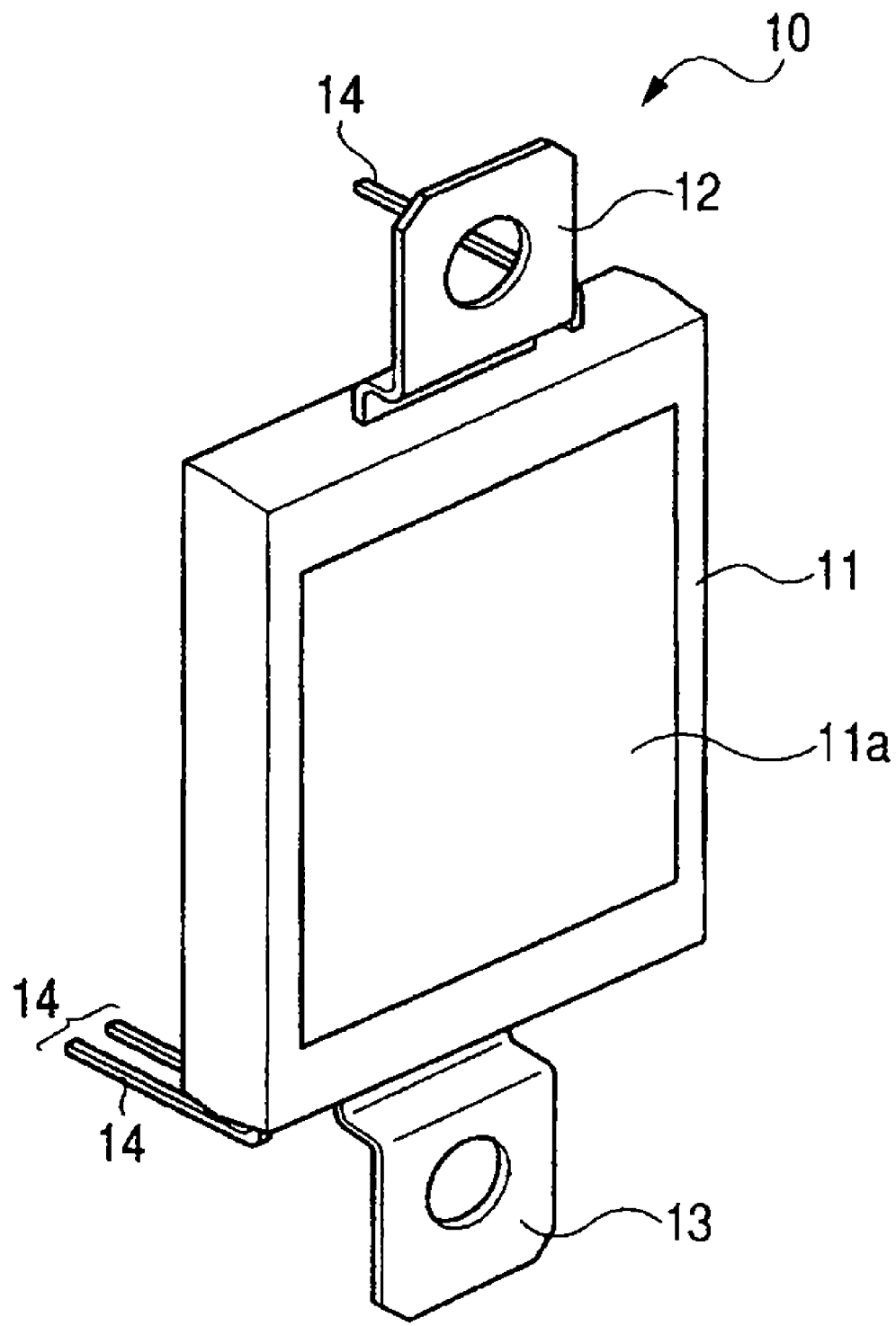
FIG. 3 is a perspective view seen from an external rear surface side of the semiconductor device in Embodiment 1.

FIG. 2 is a perspective view seen from an external surface side of a semiconductor device 10 in Embodiment 1. In FIG. 2, a resin 11 whose planar shape is almost rectangular is formed at the center of the semiconductor device 10, and at a second edge side of an upper part of the resin 11, an collector electrode for external connection 12 and part of signal electrodes 14 are provided. At a first edge side which is opposite to the second edge of the resin 11, where the collector electrode for external connection 12 is formed, an emitter electrode for external connection 13 and part of signal electrodes 14 are formed. FIG. 3 is a perspective view seen from an external rear surface side of the semiconductor device. As shown in FIG. 3, a die pad 11a is exposed at the rear surface side of the resin 11. The die pad 11a is exposed at the rear surface of the resin 11 for improving heat radiation efficiency when the semiconductor device 10 is operated.

Figure 4:
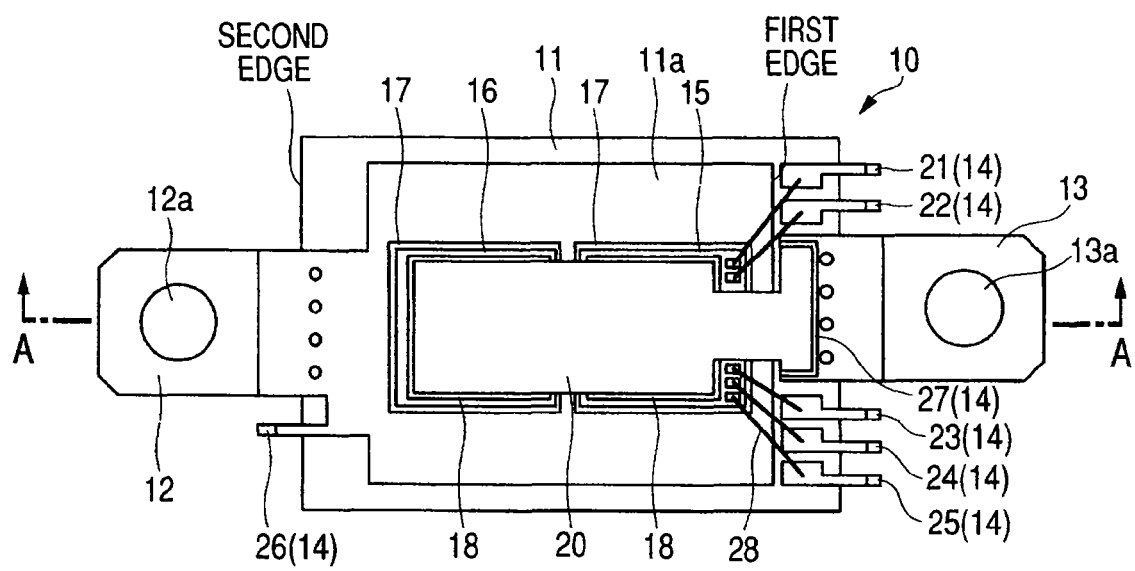
FIG. 4 is a plan view showing the inside of the semiconductor device in Embodiment 1.
Figure 5:
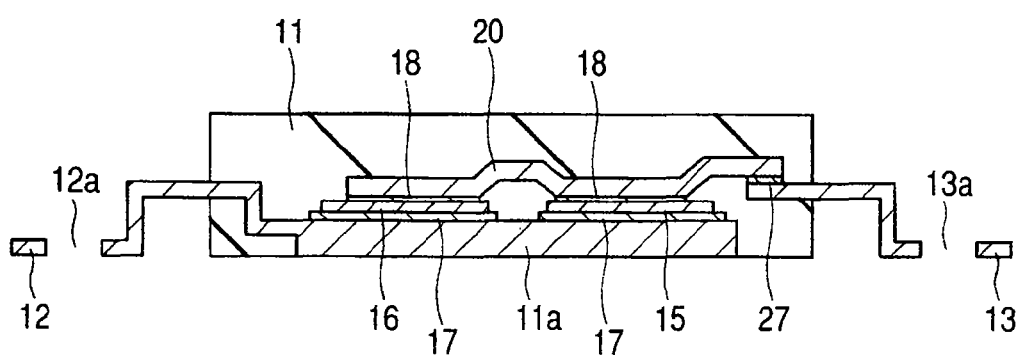
FIG. 5 is a cross-sectional view showing a cross section taken along an A-A line in FIG. 4.

Next, an internal structure of the semiconductor device 10 will be explained. FIG. 4 is a plan view showing the inside of the semiconductor device 10. FIG. 5 is a cross-sectional view showing a cross section taken along an A-A line of FIG. 4. In FIG. 4, the resin 11 covering the surface of semiconductor device 10 is not shown to show the internal structure.

In FIG. 4 and FIG. 5, the die pad 11a is provided inside the resin 11, and the collector electrode for external connection 12 is integrally formed at the die pad 11a. The collector electrode for external connection 12 is exposed from the resin 11, having a screw opening 12a.

A semiconductor chip (first semiconductor chip) 15 in which the IGBT is formed through a solder 17 and a semiconductor chip (second semiconductor chip) 16 in which a diode is formed through the solder 17 so as to adjacent to the semiconductor chip 15 in which the IGBT is formed over the die pad 11a. A collector electrode is formed at the rear surface side of the semiconductor chip 15 in which the IGBT is formed, and the collector electrode is connected to the die pad 11a through the solder 17. That is, the collector electrode formed at the rear surface of the semiconductor chip 15 is electrically connected to the collector electrode for external connection 12 through the die pad 11a, which is integrally formed with the die pad 11a. On the other hand, a cathode is formed at the rear surface side of the semiconductor chip 16 in which the diode is formed, and the cathode is electrically connected to the collector electrode for external connection 12 through the die pad 11a. Consequently, the collector electrode of the IGBT and the cathode of the diode are electrically connected.

At the upper surface (principal surface) side of the semiconductor chip 15 in which the IGBT is formed, the emitter electrode and a plurality of bonding pads are formed. At the upper surface (principal surface) side of the semiconductor chip 16 in which the diode is formed, an anode electrode is formed. The emitter electrode formed at the upper surface side of the semiconductor chip 15 in which the IGBT is formed and the anode electrode formed at the upper surface side of the semiconductor chip 16 in which the diode is formed are connected by a clip 20 having a flat plate shape through a solder 18. Therefore, the emitter electrode of the IGBT and the anode electrode of the diode are electrically connected by the clip 20. The clip 20 is also referred to as a plate electrode. Hereinafter, a word "clip 20" is used as the plate electrode. In addition, the principal surface of the semiconductor chip 15 in which the IGBT is formed indicates the upper surface of the semiconductor chip 15 in which the IGBT is formed. That is, the principal surface of the semiconductor chip 15 in which the IGBT is formed indicates the surface opposite to the surface of the semiconductor chip 15, which touches the die pad 11a. Similarly, the principal surface of the semiconductor chip 16 in which the diode is formed means the upper surface of the semiconductor ship 16 in which the diode is formed. That is, the principal surface of the semiconductor chip 16 in which the diode is formed indicates the surface opposite to the surface connecting with the die pad 11a of the semiconductor chip 16.

The clip 20 is formed, for example, from a member having a flat plate shape whose main component is copper. A feature of the invention is in a point that the emitter electrode of the semiconductor chip 15 in which the IGBT is formed and the anode electrode of the semiconductor chip 16 in which the diode is formed are connected by the clip 20. In related arts, the emitter electrode of the semiconductor chip 15 in which the IGBT is formed and the anode electrode of the semiconductor chip 16 in which the diode is formed are connected by wires whose main component is aluminum. Though large current flows at the emitter electrode, there arises a problem that on-resistance increases at the wire whose main component is aluminum because of the increase of resistance by the aluminum and the increase of resistance by thin wires. Moreover, since the wires are thin, there arises a problem that the heat radiation characteristics deteriorate because heat capacity is small. According to Embodiment 1, the emitter electrode of the semiconductor chip 15 in which the IGBT is formed and the anode electrode of the semiconductor chip 16 in which the diode is formed are connected by the clip 20 having the flat plate shape whose main component is copper. Since the resistance of copper is lower than the resistance of aluminum, the on-resistance can be reduced by connecting the clip 20 including copper as the main component. The clip 20 has the wide flat plate shape, therefore, the cross-sectional area is larger than the wire. Consequently, the on-resistance can be further reduced by using the clip 20. Furthermore, since the clip 20 has the flat plate shape, heat capacity included in the clip 20 itself can be made larger than heat capacity included in the wire itself as well as the contact area between the semiconductor chips 15, 16 and the clip 20 can be made larger than the connection by the wires, as a result, heat radiation efficiency can be improved.

The clip 20 is connected to the emitter electrode for external connection 13 through a solder 27. The emitter electrode for external connection 13 is formed at the first edge side which is opposite to the second edge side of the die pad 11a, in which the collector electrode for external connection 12 is formed, not being electrically connected to the die pad 11a. Specifically, if the emitter electrode for external connection 13 is connected to the die pad 11a, the collector electrode for external connection 12 and emitter electrode for external connection 13 are directly connected to each other, therefore, it is configured not to be short-circuited. That is, the emitter electrode for external connection 13 is connected to the emitter electrode of the semiconductor chip 15 in which the IGBT is formed through the clip 20. A screw opening 13a is also formed at the emitter electrode for external connection 13 as in the collector electrode for external connection 12.

At the first edge side of the die pad 11a in which the emitter electrode for external connection 13 is formed and the second edge side which is opposite to the first edge, signal electrodes 14 shown in FIG. 2 and FIG. 3 are formed. The signal electrodes are specifically shown in FIG. 4. As shown in FIG. 4, at the first edge side of the die pad 11a, an electrode for temperature detection 21, an electrode for temperature detection 22, a gate electrode for external connection 23, an electrode for Kelvin detection 24 and an electrode for current detection 25 are formed, in addition to the emitter electrode for external connection 13. These electrodes are respectively connected to bonding pads provided at the upper surface of the semiconductor chip 15 in which the IGBT is formed by using wires 28. Therefore, the semiconductor chip 15 in which the IGBT is formed is arranged at the side closer to the first edge of the die pad 11a than the semiconductor chip 16 in which the diode is formed. By this arrangement, the bonding pads formed at the semiconductor chip 15 can be arranged close to the electrodes for temperature detection 21, 22, the gate electrode for external connection 23, the electrode for Kelvin detection 24 and the electrode for current detection 25, therefore, there is an advantage that it becomes easy to connect between the bonding pads and these electrodes by wires. At the second edge side which is opposite to the first edge of the die pad 11a, an electrode for Kelvin detection 26 connecting to the collector electrode for external connection 12 is formed. Here, a feature of the invention is in a point that the clip 20 is not formed over the bonding pads of the semiconductor chip 15, which are respectively connected to the electrodes for temperature detection 21, 22, the gate electrode for external connection 23, the electrode for Kelvin detection 24 and the electrode for current detection 25 by using the wires 28. The feature is in the point that the bonding pads of the semiconductor chip 15 are formed at a region in which the bonding pads do not overlap with the clip 20 in a flat state. In other words, the plural wires 28 are not arranged just under the clip 20.

For example, in the technologies described in Patent Documents 3 to 5, a structure in which the clip is formed just over the bonding pads is disclosed. In this case, in order to avoid the contact between wires connected to the bonding pad and the clip, it is necessary to provide a spacer under the clip to widen the distance between the wires connected to the bonding pads and the clip. However, when the spacer is provided under the clip, the thickness of the semiconductor device becomes thick for the thickness of the provided spacer and it is difficult to be miniaturized. Moreover, even when the spacer is provided, there is a fear that the wires touch the clip due to variations of the height of the spacer.

On the other hand, in the semiconductor device 10 of Embodiment 1, the clip 20 is not formed just over the bonding pads connected by the wires 28. Consequently, it is possible to prevent the wires 28 connected to the bonding pads from touching the clip 20. That is, the reliability of the semiconductor device 10 can be improved. In addition, since it is not necessary to provide a spacer under the clip 20, the thickness of the semiconductor device 10 can be thin. As a result, the miniaturization of the semiconductor device 10 can be promoted.

Next, a feature of the invention will be explained. FIG. 5 is a cross-sectional view showing a cross section taken along an A-A line in FIG. 4. As shown in FIG. 5, the semiconductor chip 15 in which the IGBT is formed and the semiconductor chip 16 in which the diode is formed respectively through the solder 17 are arranged adjacent to each other. The clip 20 is mounted over the semiconductor chip 15 and the semiconductor chip 16 through the solder 18. Here, the shape of the clip 20 has a structure (convex shape) in which a region of the clip 20 between the semiconductor chip 15 and the semiconductor chip 16 protrudes upward from a region of the clip 20 touching the semiconductor chip 15 and the semiconductor chip 16. That is, the feature is in a point that a position of the region of the clip 20 between the semiconductor chip 15 and the semiconductor chip 16 (region between chips) is apart from the die pad 11a as compared with a position of the region of the clip 20 which touches the semiconductor chip 15 or the semiconductor chip 16 (touching region).

Figure 6:
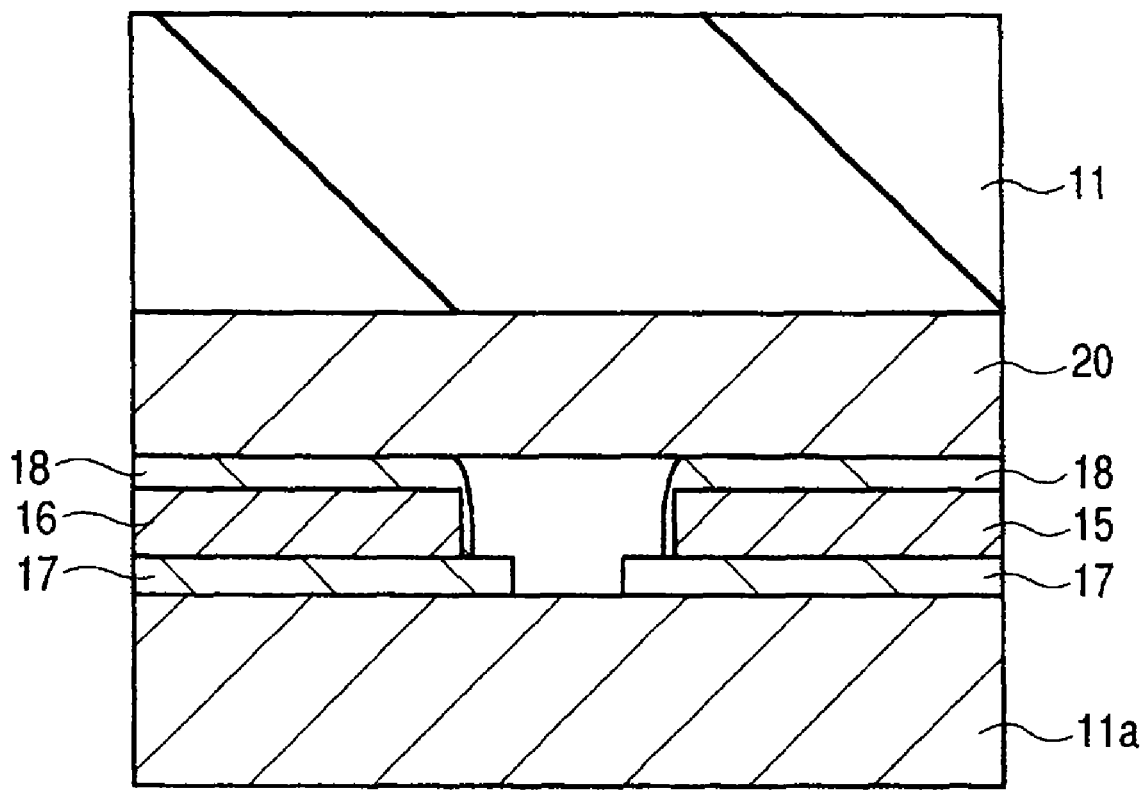
FIG. 6 is a view showing a problem in which the shape of a clip is formed to be flat.
Figure 7:
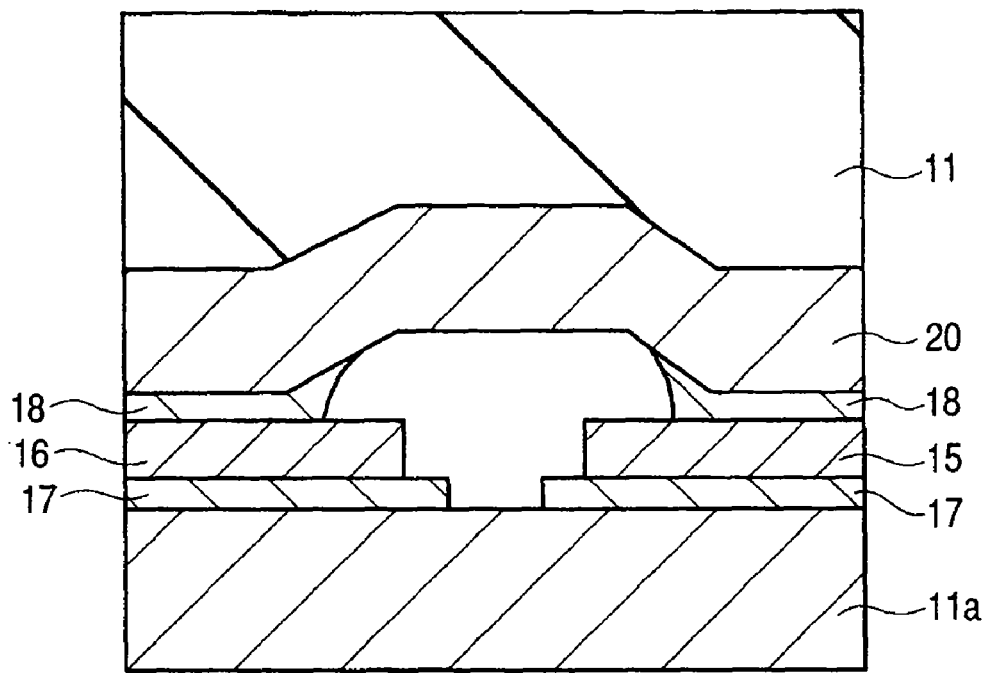
FIG. 7 is an enlarged view showing a part of the clip in Embodiment 1.

FIG. 6 is a view showing a problem in which the shape of the clip 20 is formed to be flat. As shown in FIG. 6, the clip 20 is formed so that the region between the semiconductor chip 15 and the semiconductor chip 16 becomes the same height as the region touching the semiconductor chip 15 or the semiconductor chip 16. At this time, the semiconductor chip 15 and the clip 20 are connected by using the solder 18, and when the amount of the solder 18 is large, the spilled solder 18 flows along the side surface of the semiconductor chip 15 and the solder 18 and the solder 17 are connected in the shape of the clip 20 shown in FIG. 6. Therefore, there is a problem that short-circuit failure may occur.

Consequently, Embodiment 1 applies the structure (convex shape) in which the region of the clip 20 between the semiconductor chip 15 and the semiconductor chip 16 protrudes upward from the region of the clip 20 touching the semiconductor chip 15 and the semiconductor chip 16. By this arrangement, the excessive solder 18 is absorbed in the convex shape of the clip 20. Consequently, it is possible to prevent the excessive solder 18 from flowing along the side surface of the semiconductor chip 15 and being connected to the solder 17 formed under the semiconductor chip 15.

Next, as shown in FIG. 4 and FIG. 5, in the semiconductor device 10 in Embodiment 1, the clip 20 is connected to the emitter electrode for external connection 13. At this time, the clip 20 and the emitter electrode for external connection 13 are formed by different constitutes, and the clip 20 and the emitter electrode for external connection 13 which are formed by different constitutes are connected to each other through the solder 27. A feature of the invention is in a point that the clip 20 and the emitter electrode for external connection 13 are not integrally formed but formed by different constitutes.

Figure 8:
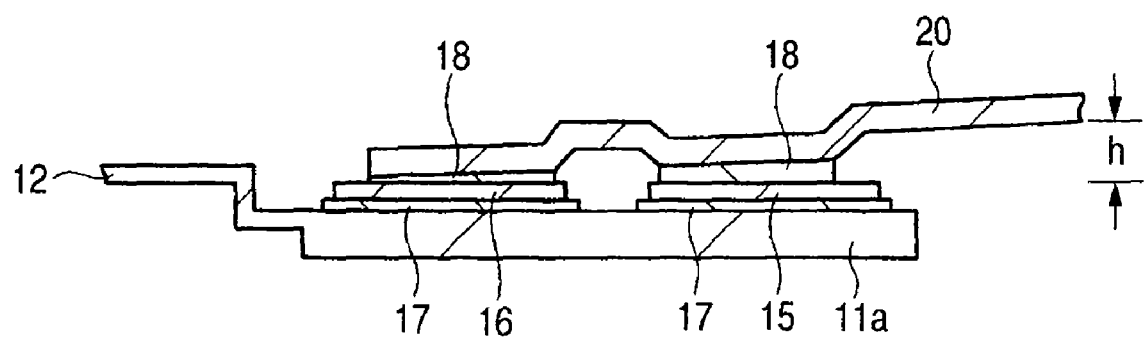
FIG. 8 is a view showing a problem in the case that the clip and an emitter electrode for external connection are integrally formed.
Figure 9:
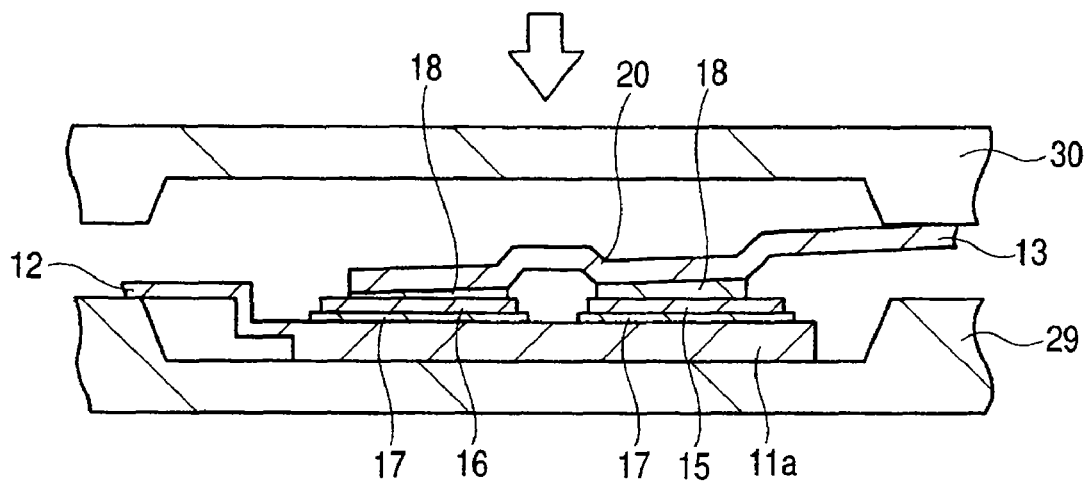
FIG. 9 is a view showing a problem in the case that the clip and the emitter electrode for external connection are integrally formed.

FIG. 8 and FIG. 9 are views showing a problem in the case that the clip 20 and the emitter electrode for external connection 13 are integrally formed. As shown in FIG. 8, assuming that the clip 20 formed over the semiconductor chip 15 and the semiconductor chip 16 through the solder 18 is inclined. In this case, for example, the right side of the clip 20 (a region corresponding to the emitter electrode for external connection 13) is displaced upward by a size "h" as compared with the case when being arranged flatly. After the clip 20 is mounted, the die pad 11a is resin packaged by using a lower mold 29 and an upper mold 30 as shown in FIG. 9. At the time of resin packaging, the die pad 11a is disposed over the lower mold 29 and the upper mold 30 is moved from above to be closely contacted with the lower mold 29. When the clip 20 and the emitter electrode for external connection 13 are integrally formed, the emitter electrode for external connection 13 which is integrally formed is displaced upward, therefore, when moving the upper mold 30, it collides with the emitter electrode for external connection 13 and destroys a junction between the solder 18 and the clip 20.

Figure 10:
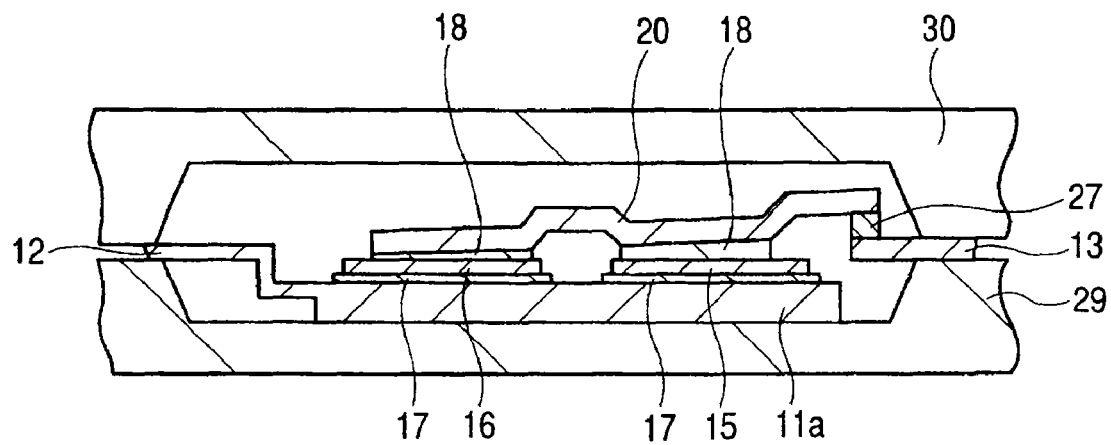
FIG. 10 is a view showing an advantage when the clip and the emitter electrode for external connection are formed by different constitutes.

In the semiconductor device 10 of Embodiment 1, the clip 20 and the emitter electrode for external connection 13 are formed by different constitutes as shown in FIG. 10, and the clip 20 and the emitter electrode for external connection 13 formed by different constitutes are connected by using the solder 27. By forming the device as described above, even when the clip 20 is formed in the obliquely inclined state, the emitter electrode for external connection 13 does not incline, therefore, it is possible to prevent destruction of the junction between the solder 18 and the clip 20 when moving the upper mold 30.

Figure 11:
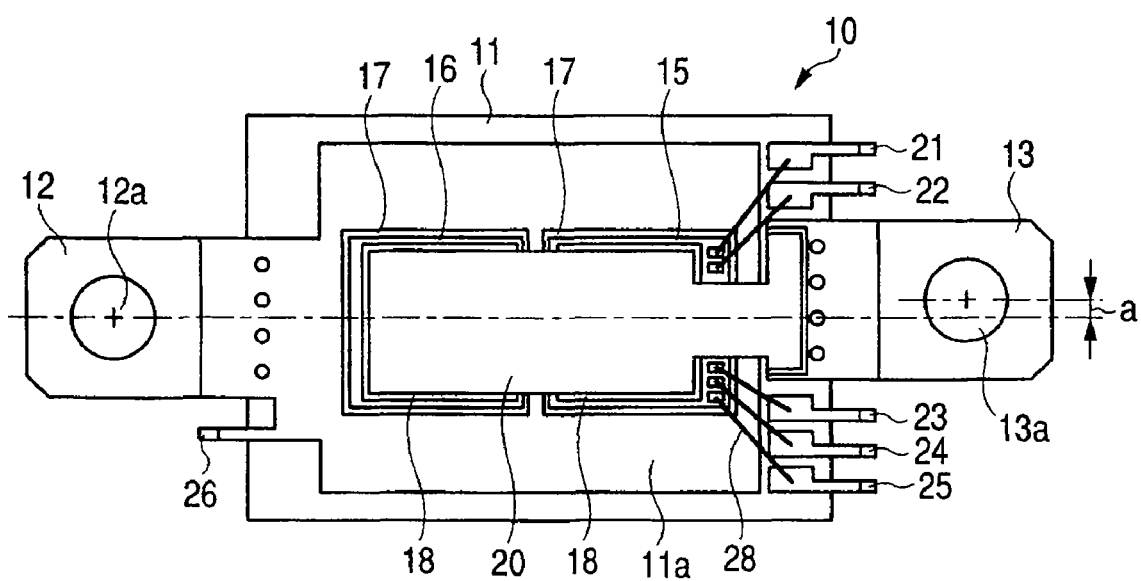
FIG. 11 is a plan view showing the inside of the semiconductor chip in Embodiment 1.

Next, in the semiconductor device 10 of Embodiment 1, the center line of the collector electrode for external connection 12 and the center line of the emitter electrode for external connection 13 are not arranged in alignment as shown in FIG. 11. Specifically, as shown in FIG. 11, the center line of the collector electrode for external connection 12 and the center line of the emitter electrode for external connection 13 are displaced by "a", and they are not symmetrical. By arranging the device in this manner, there is an advantage when the semiconductor device 10 is mounted on a mounting substrate. As shown in FIG. 11, the collector electrode for external connection 12 and the emitter electrode for external connection 13 are formed at the semiconductor device 10, and the semiconductor device 10 is mounted on the mounting substrate (casing) by inserting screws into the screw openings 12a, 13a. When the center line of the collector electrode for external connection 12 and the center line of the emitter electrode for external connection 13 are arranged in alignment, there is a risk that the device is mounted in the inverse direction with respect to the direction in which the device should be originally mounted because the device is symmetrical.

Consequently, as shown in FIG. 11, the semiconductor device 10 in Embodiment 1 is unsymmetrical by displacing the center line of the collector electrode for external connection 12 and the center line of the emitter electrode for external connection 13. When the device is unsymmetrical, it is possible to prevent the device from being mounted in the inverse direction with respect to the direction in which the device should be originally mounted. For example, in order to form the collector electrode for external connection 12 and the emitter electrode for external connection 13 in an unsymmetrical manner, the center line of the collector electrode for external connection 12 is arranged so as to correspond to the center line of the die pad 11a, and the center line of the emitter electrode for external connection 13 is arranged so as to be displaced from the center line of the die pad 11a. In order to arrange the center line of the emitter electrode for external connection 13 so as to be displaced from the center line of the die pad 11a, as shown in FIG. 11, two electrodes for temperature detection 21, 22 are arranged at even intervals at an upper side of the emitter electrode for external connection 13, and three electrodes of the gate electrode for external connection 23, the electrode for Kelvin detection 24 and the electrode for current detection 25 are arranged at even intervals at a lower side of the emitter electrode for external connection 13. That is, it is possible to displace the center line of the emitter electrode for external connection 13 from the center line of the die pad 11a by arranging the different numbers of electrodes at upper and lower sides of the emitter electrode for external connection 13 at even intervals.

Figure 12:
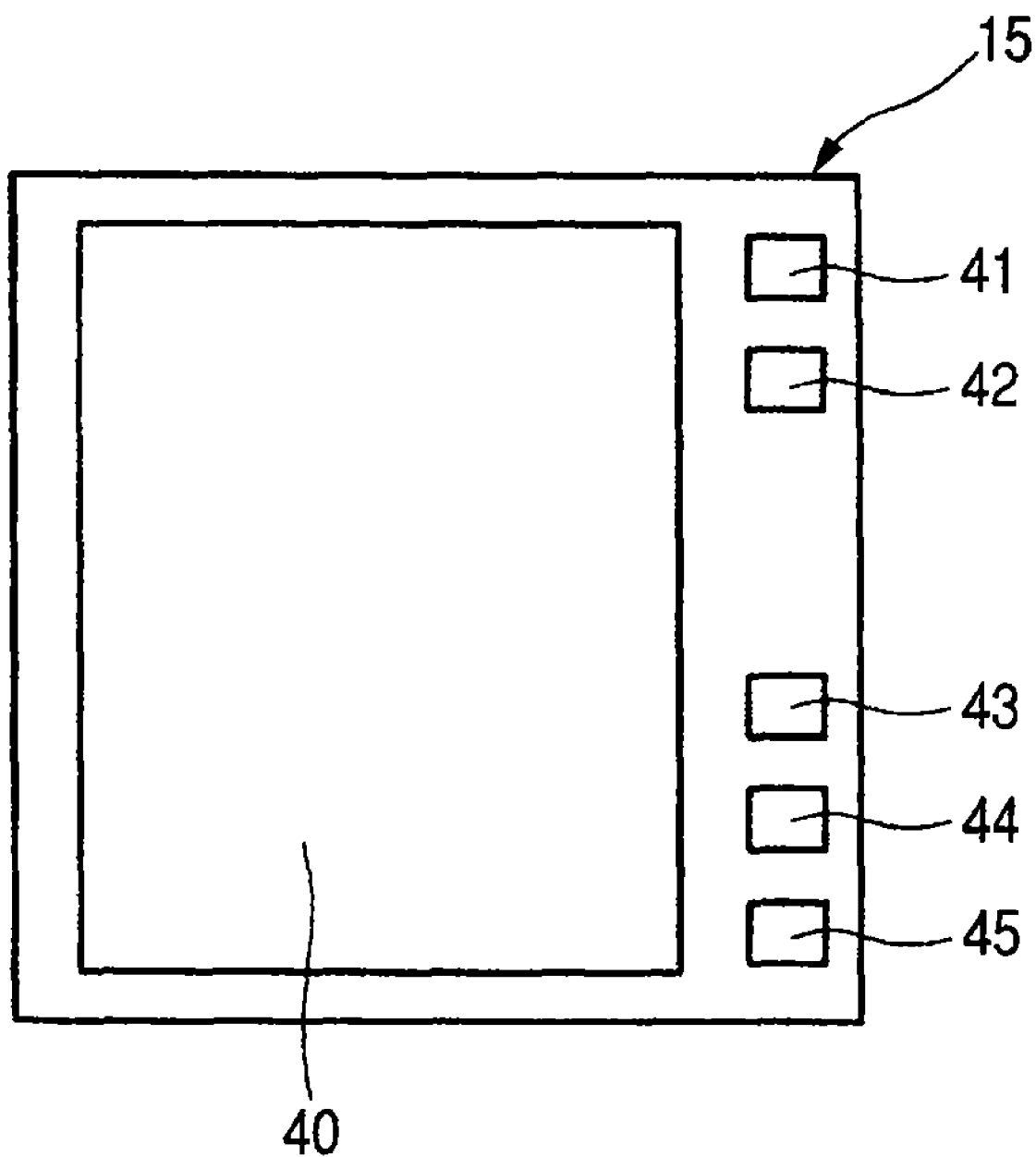
FIG. 12 is a plan view showing the structure of an upper surface side of the semiconductor chip.

Next, the structure of the semiconductor chip 15 mounted on the die pad 11a will be explained. The IGBT is formed in the semiconductor chip 15. FIG. 12 is a plan view showing the structure of an upper surface side of the semiconductor chip 15. As shown in FIG. 12, an emitter electrode 40 and boding pads 41 to 45 are formed at an upper surface of the semiconductor chip 15. The emitter electrode 40 is connected to the clip 20 shown in FIG. 4 and connected to the emitter electrode for external connection 13 through the clip 20. On the other hand, the bonding pad 41 is connected to the electrode for temperature detection 21 by using the wire 28, and the bonding pad 42 is connected to the electrode for temperature detection 22 by using the wire 28. Similarly, the bonding pad 43 is connected to the gate electrode for external connection 23 by using the wire 28, the bonding pad 44 is connected to the electrode for Kelvin detection 24 by using the wire 28 and the bonding pad 45 is connected to the electrode 25 for current detection by using the wire 28.

Figure 13:
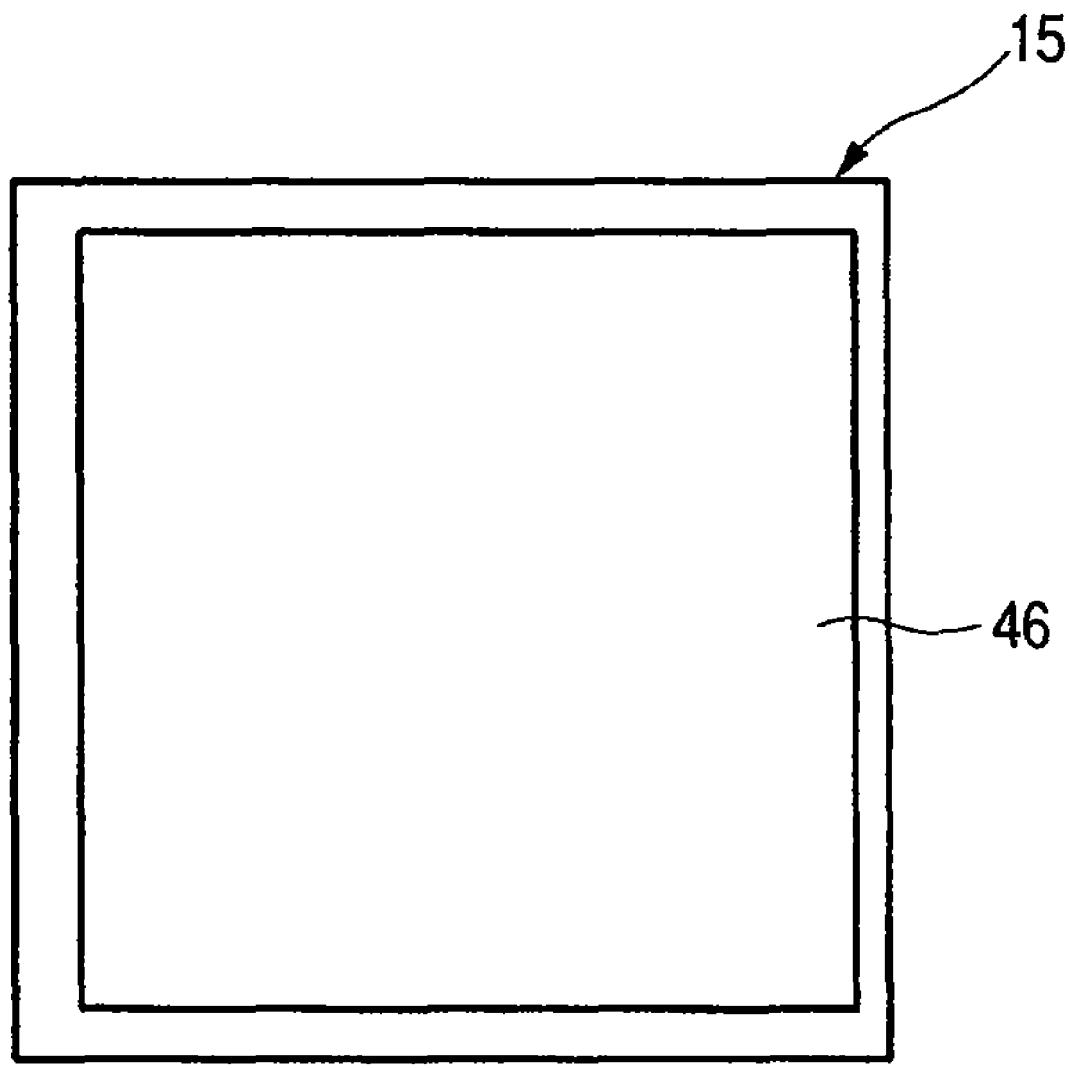
FIG. 13 is a plan view showing the structure of a rear surface side of the semiconductor chip.

FIG. 13 is a plan view showing the structure of a rear surface side of the semiconductor chip 15. As shown in FIG. 13, a collector electrode 46 is formed at the rear surface of the semiconductor chip 15. The collector electrode 46 is connected to the die pad 11a shown in FIG. 4, and connected to the collector electrode for external connection 12 integrally formed at the die pad 11a.

Figure 14:
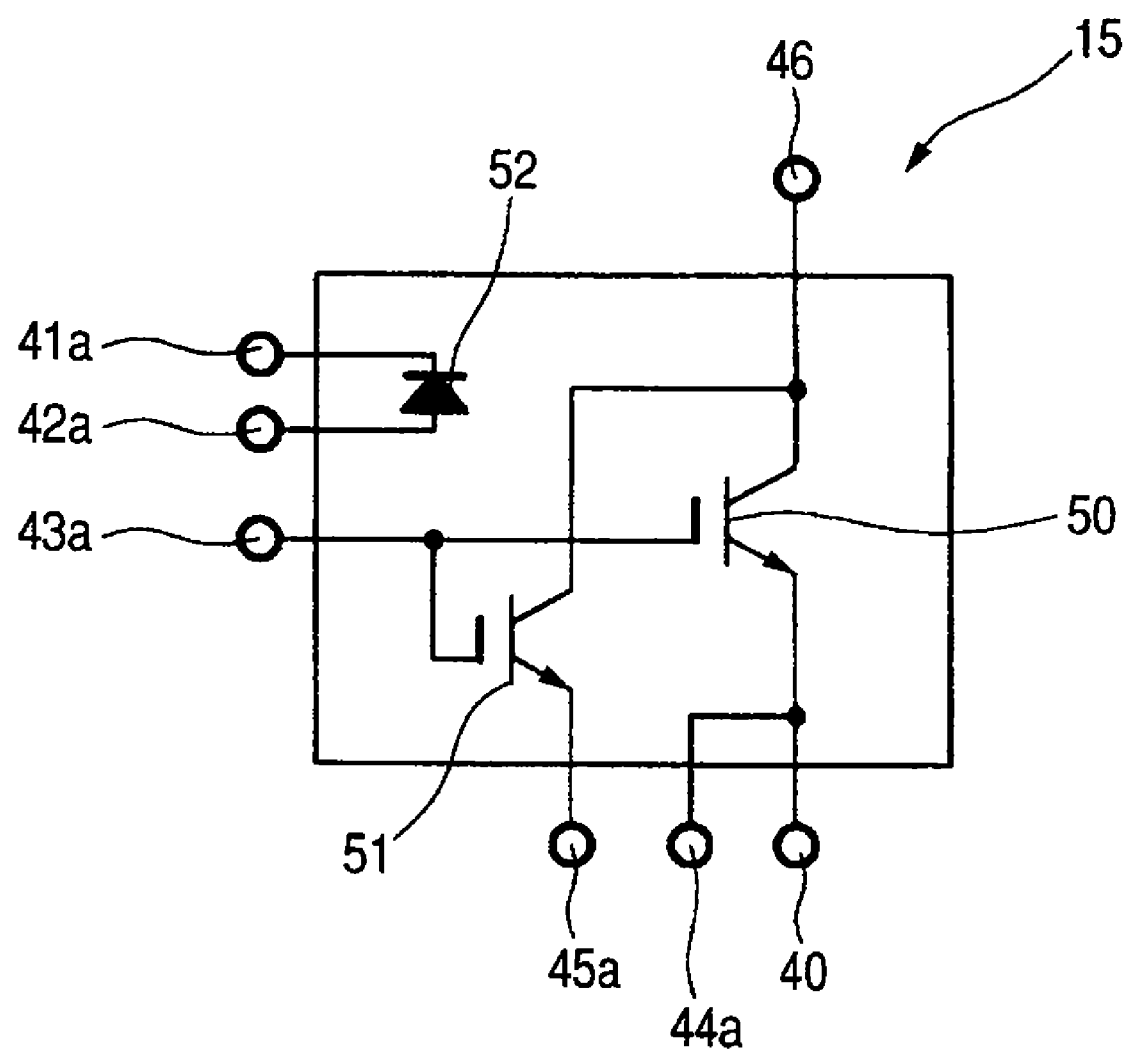
FIG. 14 is a circuit diagram showing an example of a circuit formed in the semiconductor chip.

Next, a circuit configuration of an element formed at the semiconductor chip 15 will be shown. FIG. 14 is a circuit diagram showing an example of a circuit formed in the semiconductor chip 15. As shown in FIG. 14, an IGBT 50, a detection IGBT 51 and a diode for temperature detection 52 are formed at the semiconductor chip 15. The IGBT 50 is a main IGBT, used for driving of the three-phase motor 1 shown in FIG. 1. The emitter electrode 40, the collector electrode 46 and a gate electrode 43a are formed at the IGBT 50. The gate electrode 43a is connected to the bonding pad 43 formed at the upper surface of the semiconductor chip 15 by internal wiring. Since the bonding pad 43 is connected to the gate electrode for external connection 23, the gate electrode 43a of the IGBT 50 is connected to the gate electrode for external connection 23. The gate electrode for external connection 23 is connected to the control circuit 3 shown in FIG. 1, and signals from the control circuit 3 are applied to the gate electrode 43a of the IGBT 50 through the gate electrode for external connection 23, thereby controlling the IGBT 50 from the control circuit 3.

The detection IGBT 51 is provided for detecting electric current flowing between the collector and the emitter of the IGBT 50. That is, it is provided for detecting electric current flowing between the collector and the emitter of the IGBT 50 for protecting the IGBT 50 as an inverter circuit. The detection IGBT 51 is connected to the collector electrode 46 and the gate electrode 43 as same as the IGBT 50, including a sense emitter electrode 45a. The sense emitter electrode 45a is connected to the bonding pad 45 formed at the upper surface of the semiconductor chip 15 by internal wiring. Since the bonding pad 45 is connected to the electrode for current detection 25, the sense emitter electrode 45a of the detection IGBT 51 is connected to the electrode for current detection 25 in the event. The electrode for current detection 25 is connected to a current detection circuit provided outside the semiconductor device 10. The current detection circuit detects electric current between the collector and the emitter of the IGBT 50 based on output of the sense emitter electrode 45a of the detection IGBT 51, protecting the IGBT 50 by shutting off gate signals applied to the gate electrode of the IGBT 50 when overcurrent flows.

The diode for temperature detection 52 is provided for detecting temperature of the IGBT 50. Specifically, it detects the temperature of the IGBT 50 by variations of voltage of the diode for temperature detection 52 according to the temperature of the IGBT 50. In the diode for temperature detection, a pn-junction is formed by introducing an impurity having a different conductivity type into polysilicon, and a cathode electrode 41a and an anode electrode 42a are included. The cathode 41a is connected to the bonding pad 41 formed at the upper surface of the semiconductor chip 15 by internal wiring. Similarly, the anode electrode 42a is connected to the bonding pad 42 formed at the upper surface of the semiconductor chip 15 by internal wiring. Therefore, the cathode 41a of the diode for temperature detection 52 is connected to the electrode for temperature detection 21 through the bonding pad 41, and the anode electrode 42a of the diode for temperature detection 52 is connected to the electrode for temperature detection 22 through the bonding pad 42. The electrodes for temperature detection 21, 22 are connected to a temperature detection circuit provided outside the semiconductor device 10. The temperature detection circuit indirectly detects temperature of the IGBT 50 based on output between the electrodes for temperature detection 21 and 22 connected to the cathode 41a and the anode electrode 42a of the diode for temperature detection 52, and protects the IGBT 50 by shutting off gate signals applied to the gate electrode of the IGBT 50 when the detected temperature exceeds a fixed temperature.

Next, a common emitter electrode 44a which is another terminal is drawn from the emitter electrode 40 of the IGBT 50. The common emitter electrode 44a is connected to the bonding pad 44 formed at the upper surface of the semiconductor chip 15 by internal wiring. Since the bonding pad 44 is connected to the electrode for Kelvin detection 24, the common emitter electrode 44a is connected to the electrode for Kelvin detection 24 in the event. The electrode for Kelvin detection 24 is connected to a Kelvin detection circuit provided outside the semiconductor device 10. The Kelvin detection circuit is provided for the purpose of canceling wiring resistance so as to prevent the potential of the IGBT 50 from becoming unstable by wiring and the like. That is, the wiring resistance of the emitter electrode 40 itself is cancelled based on output from the common emitter electrode 44a having the same potential as the emitter electrode 40.

In the same manner, as shown in FIG. 4, the electrode for Kelvin detection 26 which branches from the collector electrode 46 of the IGBT 50 is provided. The electrode for Kelvin detection 26 is connected to the Kelvin detection circuit provided outside the semiconductor device 10. The Kelvin detection circuit is provided also for the purpose of canceling wiring resistance so as to prevent the potential of the IGBT 50 from becoming unstable by wiring and the like. That is, the wiring resistance of the collector electrode 46 itself is cancelled based on output of the electrode for Kelvin detection 26 having the same potential as the collector electrode 46.

As described above, the semiconductor device 10 in Embodiment 1 is formed to be able to be connected to the current detection circuit, the temperature detection circuit and the Kelvin detection circuit, therefore, operational reliability of the IGBT 50 included in the semiconductor device 10 can be improved.

Figure 15:
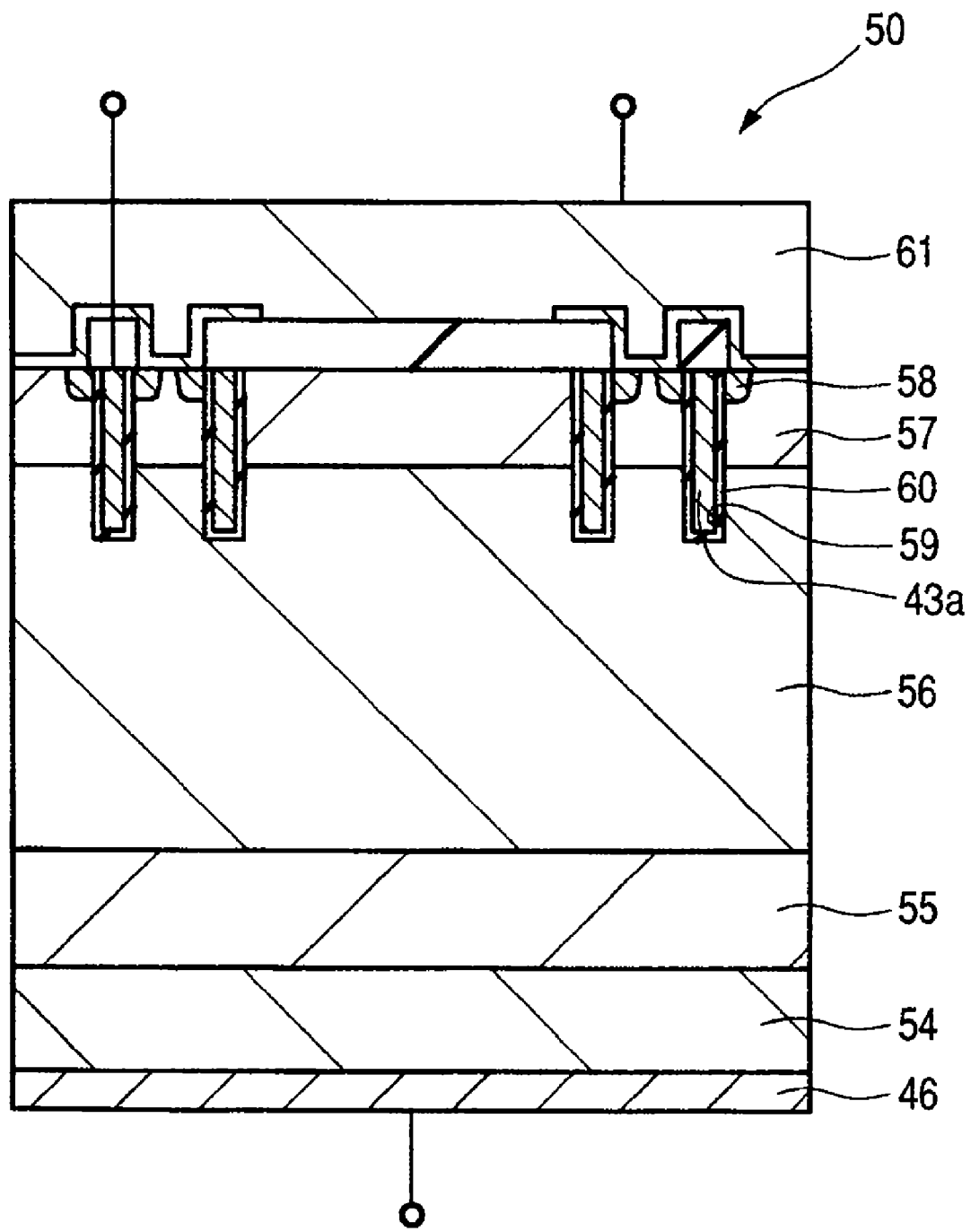
FIG. 15 is a cross-sectional view showing an IGBT formed in the semiconductor chip.

Next, the element structure of the IGBT 50 will be explained. FIG. 15 is a cross-sectional view showing a structure of the IGBT 50 in Embodiment 1. In FIG. 15, the IGBT 50 includes the collector electrode 46 formed at the rear surface of the semiconductor chip, and a $p^+$ type semiconductor region 54 is formed over the collector electrode 46. An $n^+$ type semiconductor region 55 is formed over the $p^+$ type semiconductor region 54, and an $n^-$ type semiconductor region 56 is formed over the $n^+$ type semiconductor region 55. A p type semiconductor region 57 is formed over the $n^-$ type semiconductor region 56, and trenches 59 piercing through the p type semiconductor region 57 and reaching the $n^-$ type semiconductor region are formed. Further, $n^+$ type semiconductor regions 58 to be an emitter region, matched to the trenches 59 are formed. Inside the trenches 59, a gate insulating film 60 made of, for example, a silicon oxide film is formed, and a gate electrode 43a is formed through the gate insulating film 60. The gate electrode 43a is made of, for example, a polysilicon film, formed so as to be buried in the trench 59. In the IGBT 50 thus formed, the gate electrode 43a is connected to the bonding pad 43 shown in FIG. 12 through internal wiring. Similarly, the n⁺ type semiconductor regions 58 to be the emitter region are connected to the emitter electrode 40 shown in FIG. 12 through an emitter wiring 61. The p⁺ type semiconductor region 54 to be a collector region is connected to the collector electrode 46 formed at the rear surface side of the semiconductor chip (refer to FIG. 13 and FIG. 15). The IGBT 50 has a high-speed switching characteristic and a voltage drive characteristic of a MISFET, as well as a low on-voltage characteristic of a bipolar transistor. The n⁺ type semiconductor region 55 is also referred to as a buffer layer. The n⁺ type semiconductor region 55 is provided for preventing a punch-through phenomenon in which a depletion layer developing from the p type semiconductor region 57 to the n⁻ type semiconductor region 56 when the IGBT 50 is turned off touches the p⁺ type semiconductor region 54 formed at a lower layer of the n⁻ type semiconductor region 56. The n⁺ type semiconductor region 55 is provided also for the purpose of limiting the amount of hole injection from the p⁺ type semiconductor region 54 to the n⁻ type semiconductor region 56.

Next, operations of the IGBT 50 will be explained. First, an operation that the IGBT 50 is turned on will be explained. The MISFET having a trench gate structure is turned on by applying sufficient positive voltage between the gate electrode 43a and the n⁺ type semiconductor region 58 to be the emitter region. Then, a forward bias is applied between the p⁺ type semiconductor region 54 forming the collector region and the n⁻ type semiconductor region 56, the hole injection occurs from the p⁺ type semiconductor region 54 to the n⁻ type semiconductor region 56. Next, electrons as the same number as positive charges of the injected holes are collected at the n⁻ type semiconductor region 56. Accordingly, resistance of the n⁻ type semiconductor region 56 is reduced (conductivity modulation) and the IGBT 50 turns on.

The junction voltage between the p⁺ type semiconductor region 54 and the n⁻ type semiconductor region 56 is added to the on-voltage, however, the resistance value of the n⁻ type semiconductor region 56 is reduced more than one digit by the conductivity modulation, therefore, in high withstand voltage occupying most of the on-resistance, the IGBT 50 has lower on-voltage than the MISFET. Therefore, the IGBT 50 is a device which is effective for obtaining the high withstand voltage.

Next, the operation that the IGBT 50 is turned off will be explained. The voltage between the gate electrode 43a and the n⁺ type semiconductor region 58 to be the emitter region is lowered, the MISFET having the trench gate structure is turned off. Then, the hole injection from the p⁺ type semiconductor region 54 to the n⁻ type semiconductor region 56 stops, and the holes which have been already injected expire and are reduced. The remaining holes directly flows (tail current) to the p⁺ type semiconductor region 54, and the IGBT 50 is turned off when the outflow is finished. The IGBT 50 can be operated in this manner.

Figure 16:
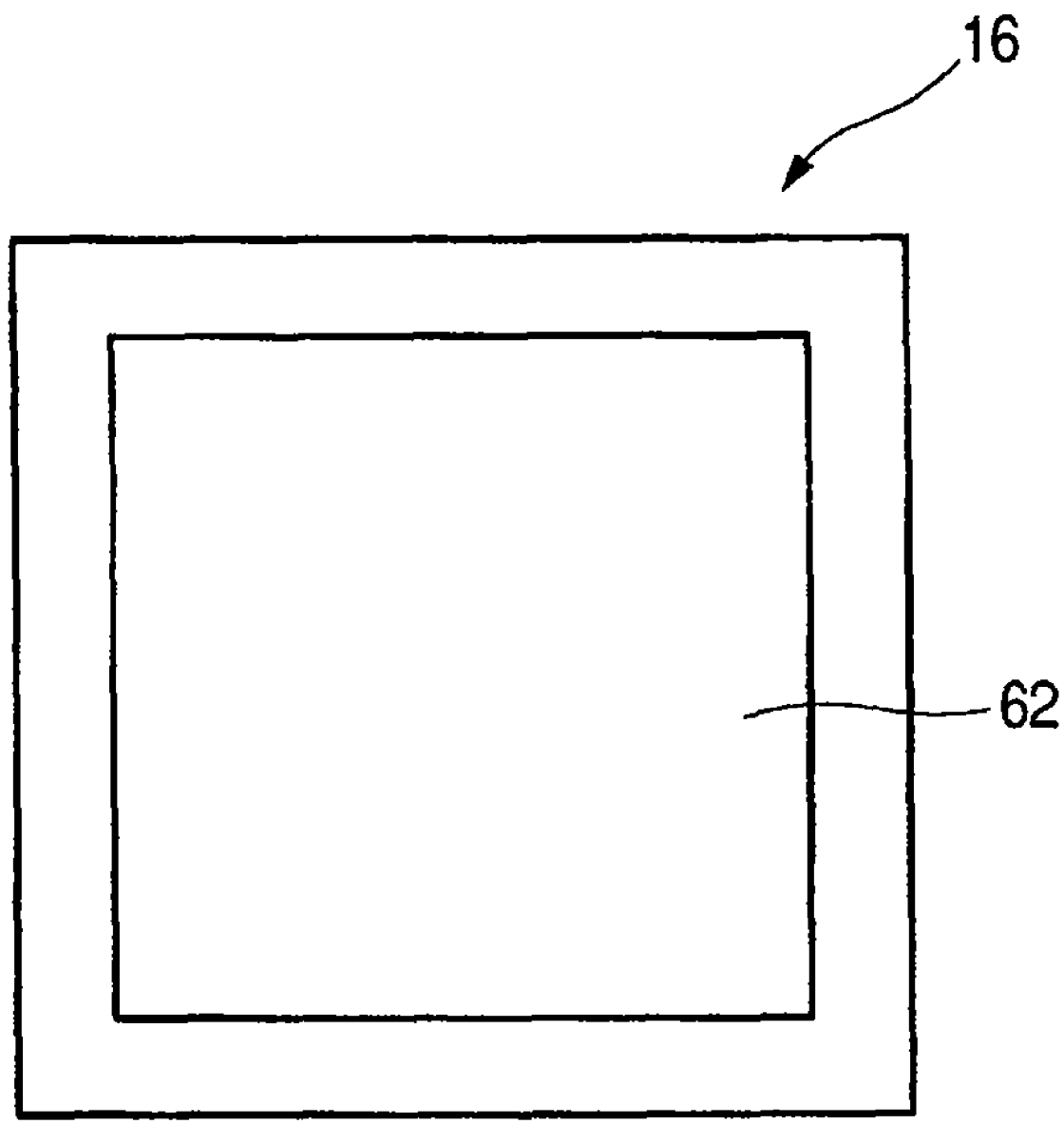
FIG. 16 is a plan view showing the structure of an upper surface side of a semiconductor chip.

Next, the structure of the semiconductor chip 16 mounted on the die pad 11a will be explained. A diode is formed over the semiconductor chip 16. FIG. 16 is a plan view showing the structure of the upper surface side of the semiconductor chip 16. As shown in FIG. 16, an anode electrode 62 is formed at the upper surface side of the semiconductor chip 16. On the other hand, through not shown, a cathode is formed at the rear surface side of the semiconductor chip 16 in the same manner.

Figure 17:
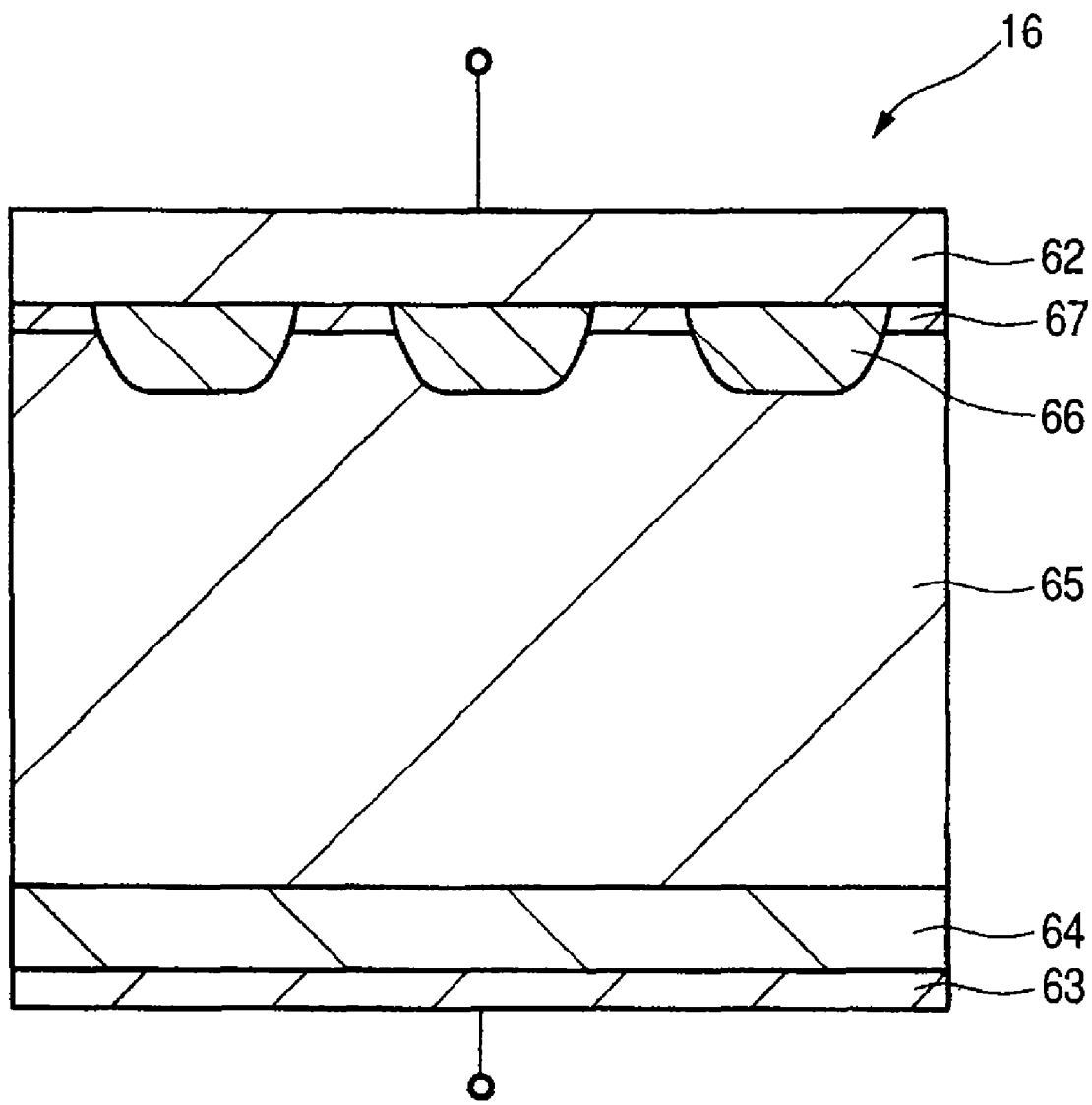
FIG. 17 is a cross sectional view showing a diode formed in the semiconductor chip.

Subsequently, the element structure of the diode will be explained. FIG. 17 is a cross-sectional view showing the element structure of the diode. In FIG. 17, a cathode 63 is formed at the rear surface of the semiconductor chip 16, and an n⁺ type semiconductor region 64 is formed over the cathode 63. An n⁻ type semiconductor region 65 is formed over the n⁺ type semiconductor region 64 and p type semiconductor regions 66 are formed over the n⁻ type semiconductor region 65 with spaces. P⁻ type semiconductor regions 67 are formed between the p type semiconductor regions 66. The anode electrode 62 is formed over the p type semiconductor regions 66 and the P⁻ type semiconductor regions 67. The anode electrode 62 is made of, for example, aluminum-silicon.

In the diode formed as the above, when positive voltage is applied to the anode electrode 62 and negative voltage is applied to the cathode 63, the pn junction between the n⁻ type semiconductor region 65 and the p type semiconductor regions 66 is forward biased and electric current flows. On the other hand, when negative voltage is applied to the anode electrode 62 and positive voltage is applied to the cathode 63, the pn junction between the n⁻ type semiconductor region 65 and the p type semiconductor regions 66 is reverse biased and electric current does not flow. Accordingly, the diode can be operated.

Here, the anode electrode 62 is formed over the upper surface of the semiconductor chip 16 in which the diode is formed, and the emitter electrode 40 is formed over the upper surface of the semiconductor chip 15 in which the IGBT is formed (refer to FIG. 12 and FIG. 16). The anode electrode 62 and the emitter electrode 40 are connected by the clip 20 (refer to FIG. 5). On the other hand, the cathode 63 is formed at the rear surface of the semiconductor chip 16, and the collector electrode 46 is formed at the rear surface of the semiconductor chip 15 (refer to FIG. 13). The cathode 63 and the collector electrode 46 are connected by the die pad 11a (refer to FIG. 5). Therefore, the IGBT and the diode are connected in inverse parallel as shown in FIG. 1. The function of the diode in this case will be explained.

When the load is a pure resistance not including inductance, the diode is unnecessary because there is no reflow energy. However, when a circuit including inductance such as a motor is connected to the load, there is a mode in which load current flows in reverse direction with respect to a switch which is turned on. In this case, the switching element itself such as the IGBT does not have the function allowing the reverse-direction current to flow, therefore, it is necessary to connect the diode to the switching element such as the IGBT in inverse parallel. Specifically, in the inverter circuit, in the case the load includes inductance such as motor control, energy accumulated in the inductance ($1/2LI^2$) have to inevitably be discharged when the switching element such as IGBT is turned off. It is difficult to allow the reverse-direction current for releasing energy accumulated in the inductance to flow only by the IGBT itself. In order to allow the electric energy accumulated in the inductance to reflow, the diode is connected to the IGBT in inverse parallel. That is, the diode has a function of allowing the reverse-direction current to flow for releasing the electric energy accumulated in the inductance. It is necessary that the diode has a high frequency characteristic in accordance with a switching frequency of the IGBT.

Figure 18:
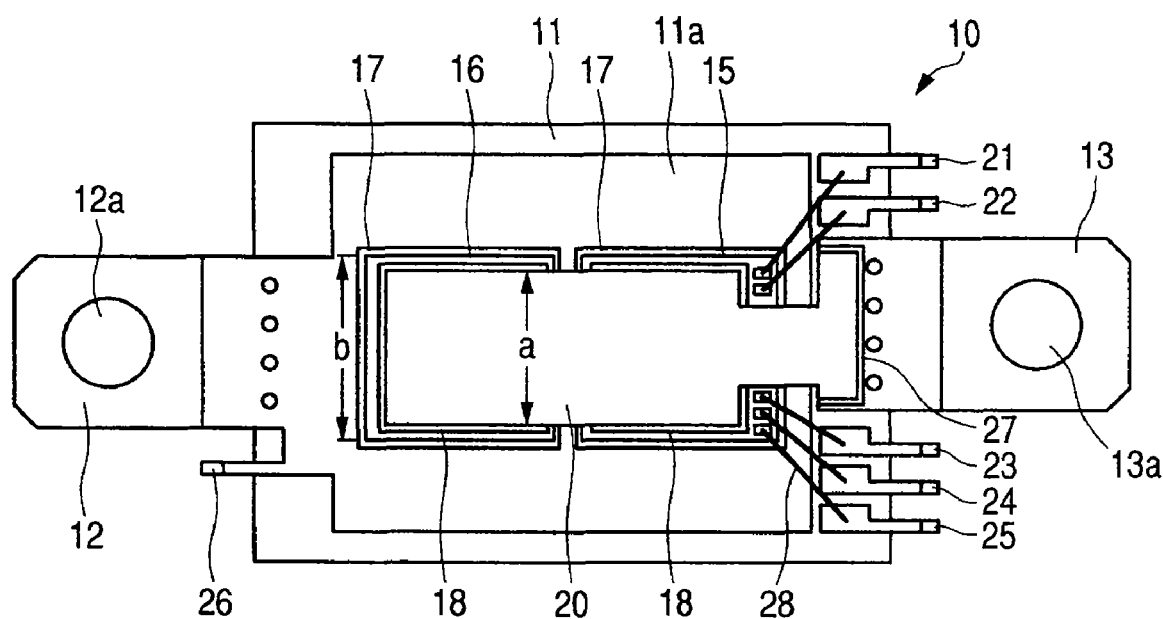
FIG. 18 is a plan view showing the inside of the semiconductor device in Embodiment 1.

Next, a feature of the invention will be explained. FIG. 18 is a plan view showing an internal structure of the semiconductor device 10 in Embodiment 1. In FIG. 18, a feature of the invention is in a point that a width "a" of the clip 20 is smaller than a width "b" of the semiconductor chip 15 and the semiconductor chip 16. That is, the width "a" of the clip 20 is smaller than the width "b" of the semiconductor chip 15 and the semiconductor chip 16 in a direction orthogonal to a direction in which the semiconductor chip 15 and the semiconductor chip 16 are aligned.

According to the above, the spread of the solder 18 formed between the clip 20 and the semiconductor chip 15, and between the clip 20 and the semiconductor chip 16 can be checked by visual inspection. Specifically, there is a process in which the solder 18 is melted and fixed by reflowing the solder after the solder 18 is formed between the clip 20 and the semiconductor chip 15, and it can be checked that the molten solder 18 is spread over the whole clip 20 by allowing the width "a" of the clip 20 to be smaller than the width "b" of the semiconductor chip 15. For example, if the width "a" of the clip 20 is formed to be larger than the width "b" of the semiconductor chip 15, it is difficult to check the semiconductor chip 15 or the solder 18 formed just under the clip 20. Therefore, it is difficult to check whether the solder 18 spreads over a contact region between the semiconductor chip 15 and the clip 20 evenly. However, according the semiconductor device 10 in Embodiment 1, since the width "a" of the clip 20 formed above the semiconductor chip 15 is smaller than the width "b" of the semiconductor chip 16, a structure under the clip 20 can be seen at visual inspection. Accordingly, it can be checked that the solder 18 spreads and protrudes from the semiconductor chip 15 by visual inspection, therefore, it can be checked that the solder 18 sufficiently spreads and junction between the semiconductor chip 15 and the clip 20 can be performed in a good condition.

In addition, the solder 18 can be formed at an region larger than the contact area between the clip 20 and the semiconductor chip 15 by allowing the width "a" of the clip 20 to be smaller than the width "b" of the semiconductor chip 15. According to this, the clip 20 is arranged so as to float in the solder 18 at the time of reflow, therefore, positioning of the clip can be performed automatically by a self-alignment function of the solder 18 at the time of melting and fixing.

Figure 19:
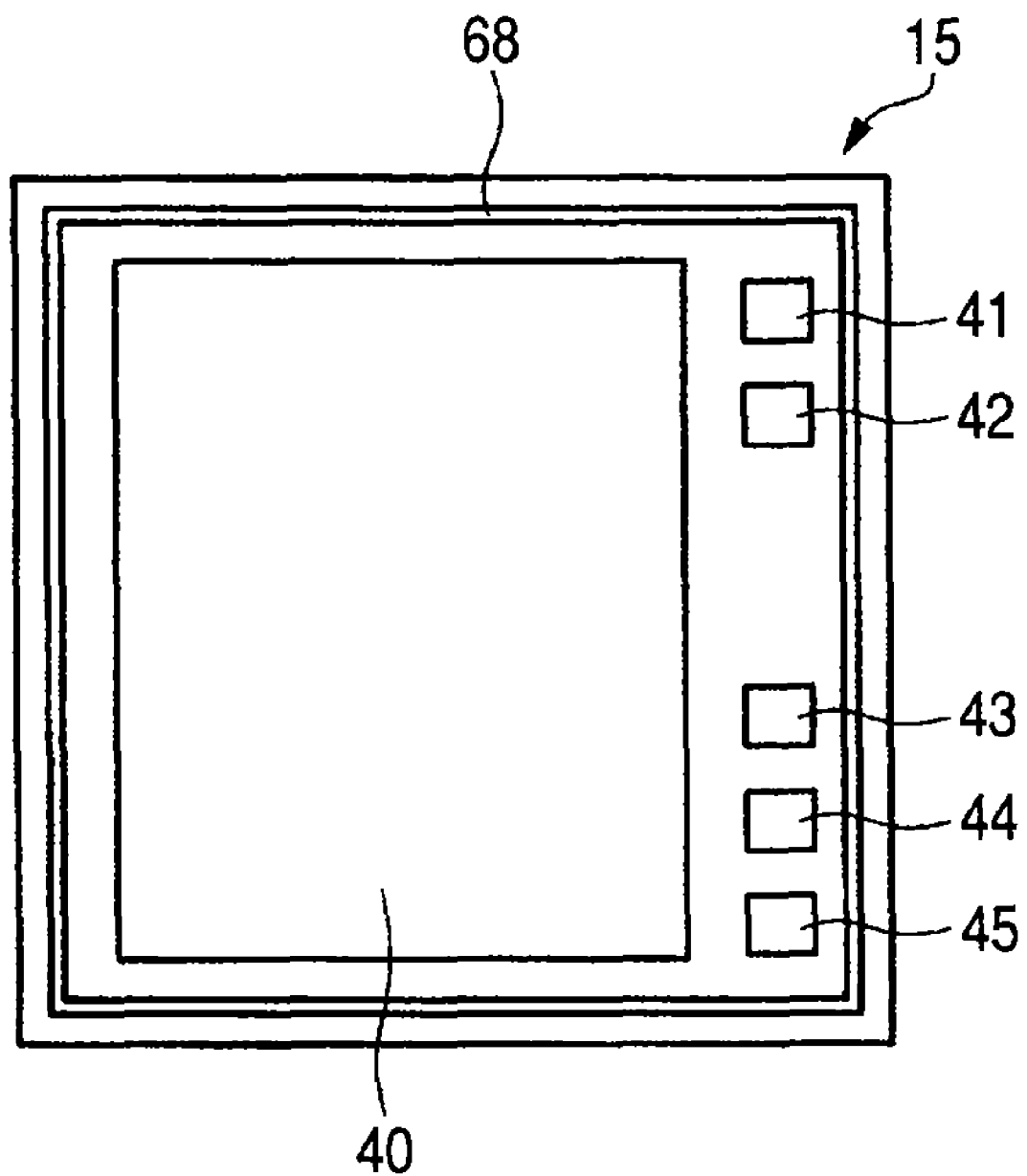
FIG. 19 is a plan view showing a state when voltage is applied to the whole semiconductor chip in which the IGBT is formed.

Further, there are advantages shown below by forming the width "a" of the clip 20 to be smaller than the width "b" of the semiconductor chip 15. FIG. 19 is a plan view showing a state when voltage is applied to the whole semiconductor chip 15 in which the IGBT is formed. As shown in FIG. 19, there are the emitter electrode and the plural bonding pads 41 to 45 at the upper surface of the semiconductor chip 15, and in addition to these regions, a region 68 is formed. The region 68 is formed so as to cover the periphery of the emitter electrode 40 and the plural bonding pads 41 to 45. The region 68 has the same potential as the collector electrode formed at the rear surface of the semiconductor chip 15. Since the region 68 is not electrically connected to the collector electrode in the structure of the semiconductor chip 15, it is not the collector electrode. However, since the region 68 has the same potential as the collector electrode, withstand voltage is lowered when the clip 20 is formed over the region 68. Specifically, an insulating film is formed between the region 68 and the clip 20. If the width "a" of the clip 20 is formed larger than the width "b" of the semiconductor chip 15, the clip 20 is arranged just over the region 68 formed at the periphery of the semiconductor chip 15. Since a voltage having the same potential as the emitter electrode 40 is applied to the clip 20, the potential difference is generated between the region 68 and the clip 20. Therefore, withstand voltage is lowered when the distance between the clip 20 and the region 68 is close. Particularly in high withstand voltage products, the problem appears more prominent. In Embodiment 1, the width "a" of the clip 20 is made smaller than the width "b" of the semiconductor chip 15. According to the structure, the clip 20 is not arranged over the region 68 formed at the periphery of the semiconductor chip 15, therefore, withstand voltage can be improved.

The semiconductor device 10 in Embodiment 1 is formed as the above, and a method of manufacturing thereof will be explained below.

First, as shown in FIG. 4, there are thin-plate regions and a thick-plate region including the die pad 11a on which the semiconductor chip 15 and the semiconductor chip 16 are mounted in the semiconductor device 10 of Embodiment 1.

Figure 21A:
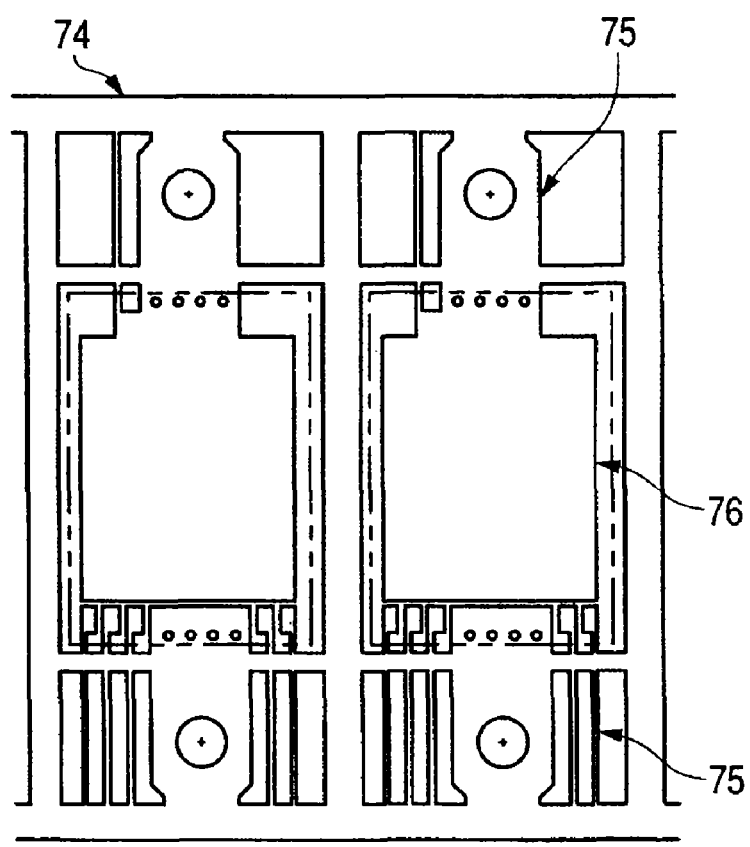
FIG. 21A is a plan view showing a lead frame in Embodiment 1.
Figure 21B:
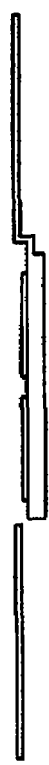
FIG. 21B is a side view of the lead frame.

FIG. 20A and FIG. 20B show a lead frame material 70 in which the thin-plate regions and the thick-plate region are formed. FIG. 20A shows a plan view of the lead frame material 70 according to Embodiment 1, and FIG. 20B shows a side view of the lead frame material 70. A manner of arranging the thick-plate region and thin-plate regions can be considered in various ways. In Embodiment 1, as shown in FIG. 20A and FIG. 20B, a thin-plate region 73, a thick-plate region 71, and a thin-plate region 72 are sequentially formed in a direction (Y direction) which is vertical to a stamping direction (arrow direction, X direction). Specifically, the thin-plate regions 72, 73 are formed so as to sandwich the thick-plate region 71. The lead frame material 70 in which the thick-plate region 71 and the thin-regions 72, 73 are formed is processed, thereby forming a lead frame 74 shown in FIG. 21A and FIG. 21B. That is, in Embodiment 1, leads 75 for forming electrodes in the thin-plate regions 72, 73 are formed and a die pad region 76 is formed in the thin-plate region 71. The reason that the lead frame material 70 is formed as shown in FIG. 20A and FIG. 20B is, in the lead frame 74 processed from the lead frame material 70, for forming a die pad region 76 is formed at the center, and for forming electrodes at a pair of edges of the die pad region 76 which are opposite to each other. That is, in Embodiment 1, the semiconductor device 10 has a structure in which the die pad 11a is arranged at the center and electrodes are formed at a pair of edges of the die pad 11a which is opposite to each other, therefore, the thin-plate regions 72, 73 and the thick-plate region 71 of the lead frame material 70 can be arranged as shown in FIG. 20A and FIG. 20B. By the above arrangement, the lead frame can be arranged closely, as shown in FIG. 21A and FIG. 21B. Specifically, since the pitch of forming the lead frame can be narrow, efficiency of using the lead frame material 70 can be improved, and costs of the semiconductor device 10 can be eventually reduced. In addition, processing in the manufacturing process becomes easy.

Here, a semiconductor device in which electrodes are formed not at a pair of edges of the die pad 11a, which are opposite to each other but at adjacent edges crossing each other is considered. In this case, processing of the lead frame is difficult when using the lead frame material 70 shown in FIG. 20A and FIG. 20B. Because it is necessary to form leads for forming electrodes also inside the thick-plate region 71 shown 20A and FIG. 20B for forming electrodes at edges crossing each other. Specifically, since the thickness of the thick-plate region 71 is thick, it is difficult to form leads for forming electrodes. Therefore, in this case, the lead frame material 70 in which thick-plate regions 77 and a thin-plate region 78 shown in FIG. 22 is used. According to the lead frame material 70 shown in FIG. 22, the thin-plate region 78 is formed at edges crossing each other, therefore, it is possible to form leads at the edges crossing each other. However, the pattern of the thick-plate regions 77 and the thin-plate region 78 formed in the lead frame material 70 shown in FIG. 22 is complicated as compared with the pattern of the thick-plate region 71 and the thin-plate regions 72, 73 in the lead frame material 70 shown in FIG. 20A and FIG. 20B. Therefore, manufacturing costs of the lead frame material 70 increase and manufacturing costs of the semiconductor device increase eventually. Further, in the structure in which electrodes are formed at edges crossing each other, the pitch of the lead frame is widened and it is difficult to use the lead frame material 70 efficiently. Also from this reason, manufacturing costs of the semiconductor device increase.

According to the above, as in the structure of the semiconductor device 10 in Embodiment 1, electrodes are formed only at a pair of edges of the die pad 11a, which is opposite to each other, thereby forming the lead frame from the lead frame material 70 efficiently. Therefore, according to the structure of the semiconductor device 10 of Embodiment 1, processing in the manufacturing process is easy and manufacturing costs can be reduced.

Figures 23A, 23B:
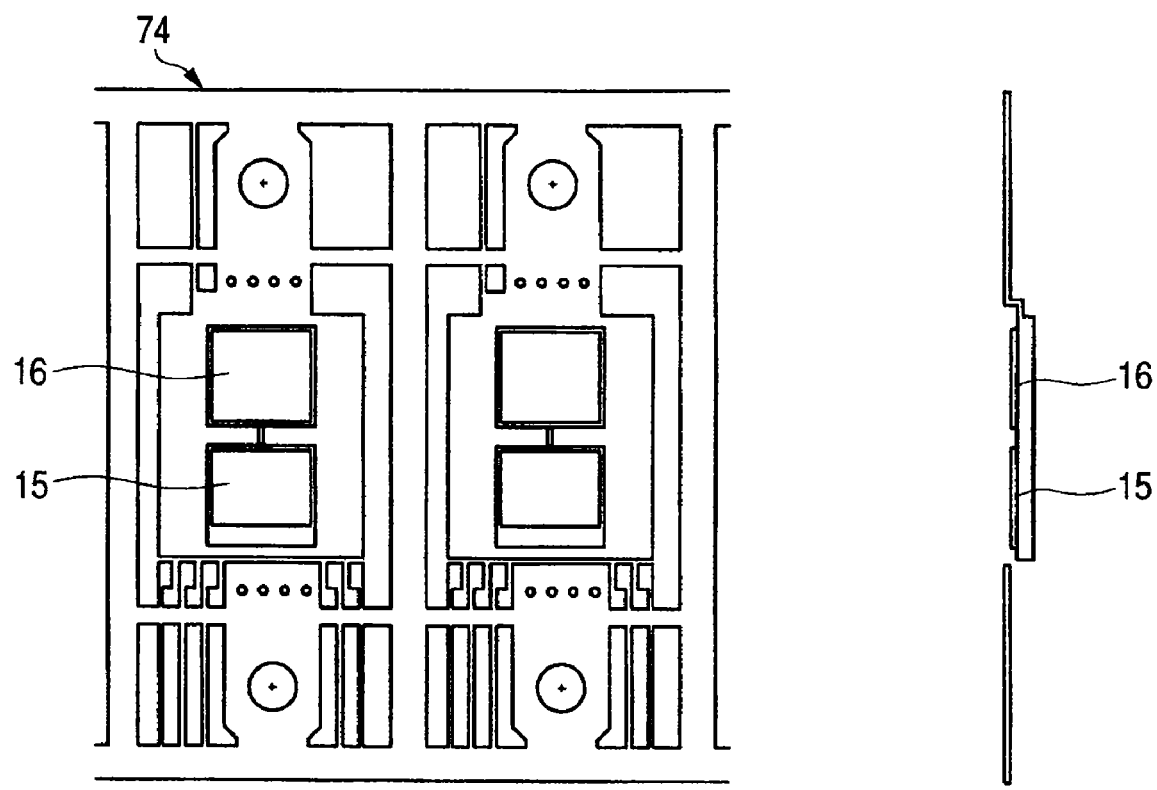
FIG. 23A is a plan view showing a manufacturing process of the semiconductor device in Embodiment 1.
FIG. 23B is a side view of FIG. 23A.

Next, a manufacturing process after forming the lead frame 74 will be explained with reference to the drawings. As shown in FIG. 23A and FIG. 23B, the semiconductor chip 15 in which the IGBT is formed and the semiconductor chip 16 in which the diode is formed are mounted over the die pad region of the lead frame 74. Here, the emitter electrode and the plural bonding pads (not shown) are formed over the upper surface of the semiconductor chip 15. On the other hand, the anode electrode (not shown) is formed at the upper surface of the semiconductor chip 16.

Figures 24A, 24B:
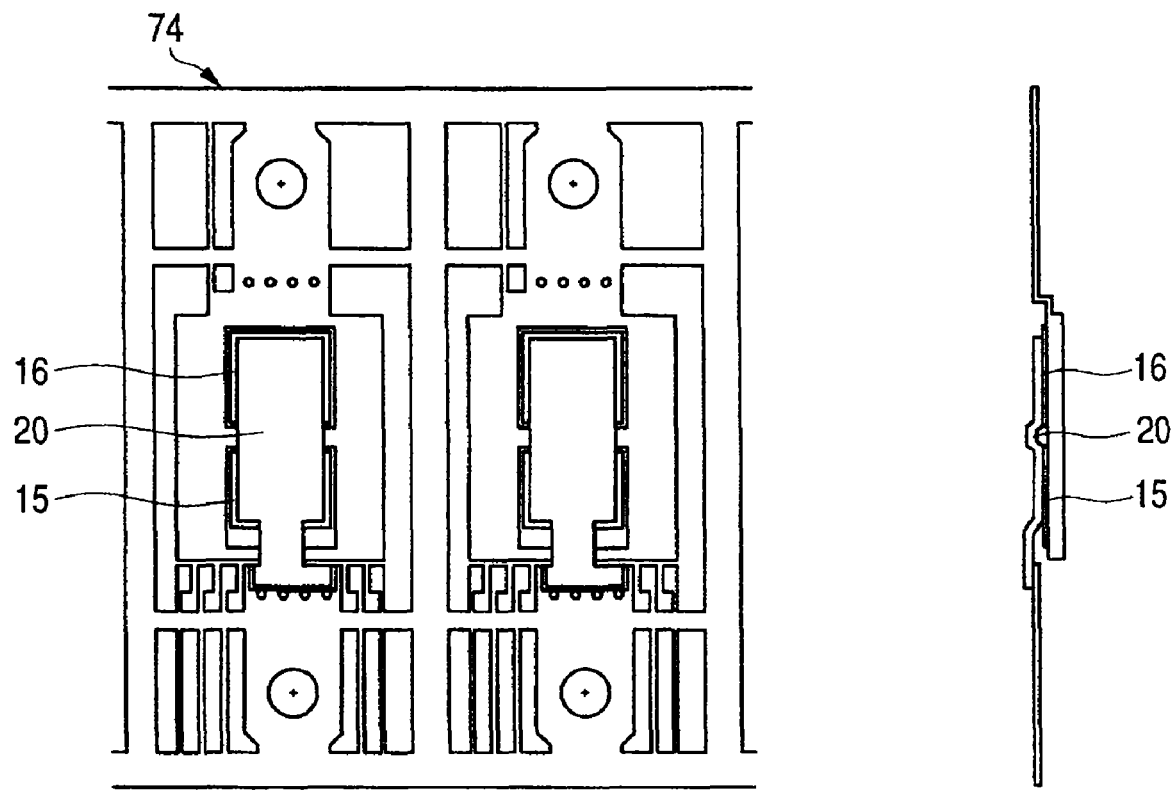
FIG. 24A is a plan view showing a manufacturing process of the semiconductor device continued from FIG. 23A.
FIG. 24B is a side view of FIG. 24A.

Subsequently, as shown in FIG. 24A and FIG. 24B, the clip 20 is formed so as to extend over the semiconductor chip 15 and the semiconductor chip 16. The clip 20 is arranged so as to connect the anode electrode of the semiconductor chip 16 to the emitter electrode of the semiconductor chip 15. Further, the clip 20 is arranged so that the plural bonding pads formed in the semiconductor chip 15 are not arranged at the region in which the bonding pads and the clip 20 overlap in a flat state. That is, the clip 20 is arranged so that the plural bonding pads are arranged at the region in which the bonding pads do not overlap with the clip 20 in a flat state.

Figures 25A, 25B:
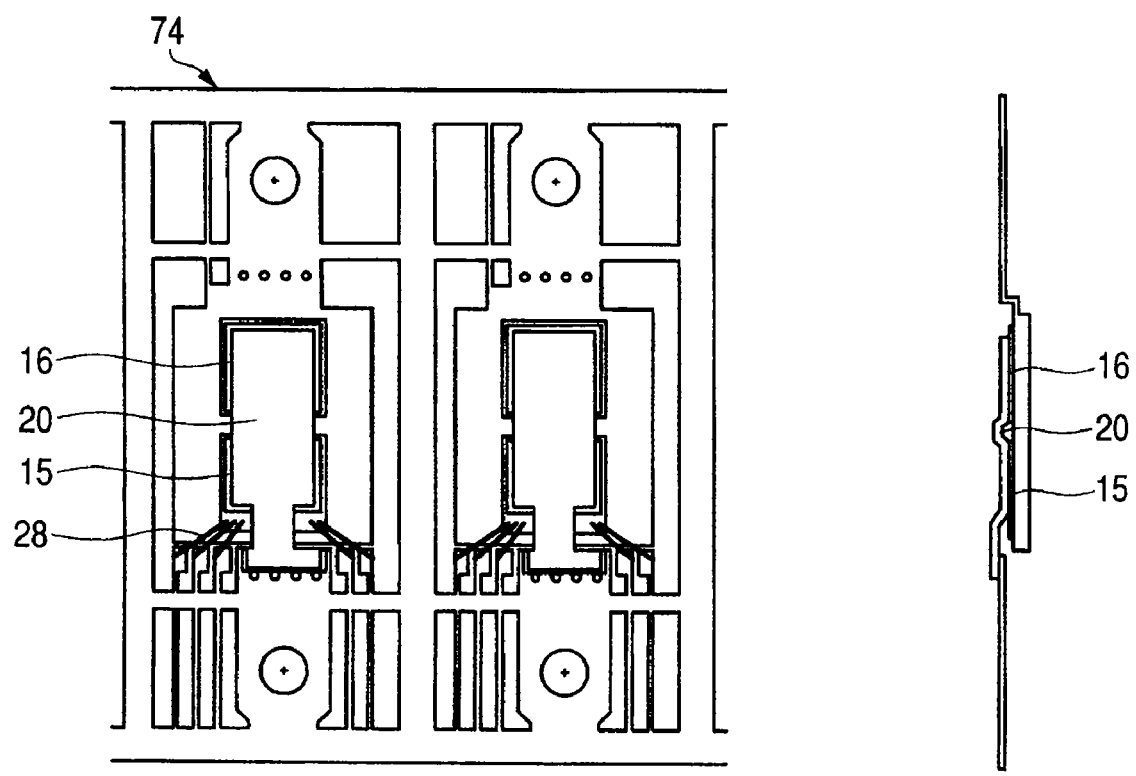
FIG. 25A is a plan view showing a manufacturing process of the semiconductor device continued from FIG. 24A.
FIG. 25B is a side view of FIG. 25A.

After reflowing, as shown in FIG. 25A and FIG. 25B, the bonding pads formed at the semiconductor chip 15 and leads to be electrodes are connected by the wires 28. The wires 28 are, for example, made of aluminum.

Figures 26A, 26B:
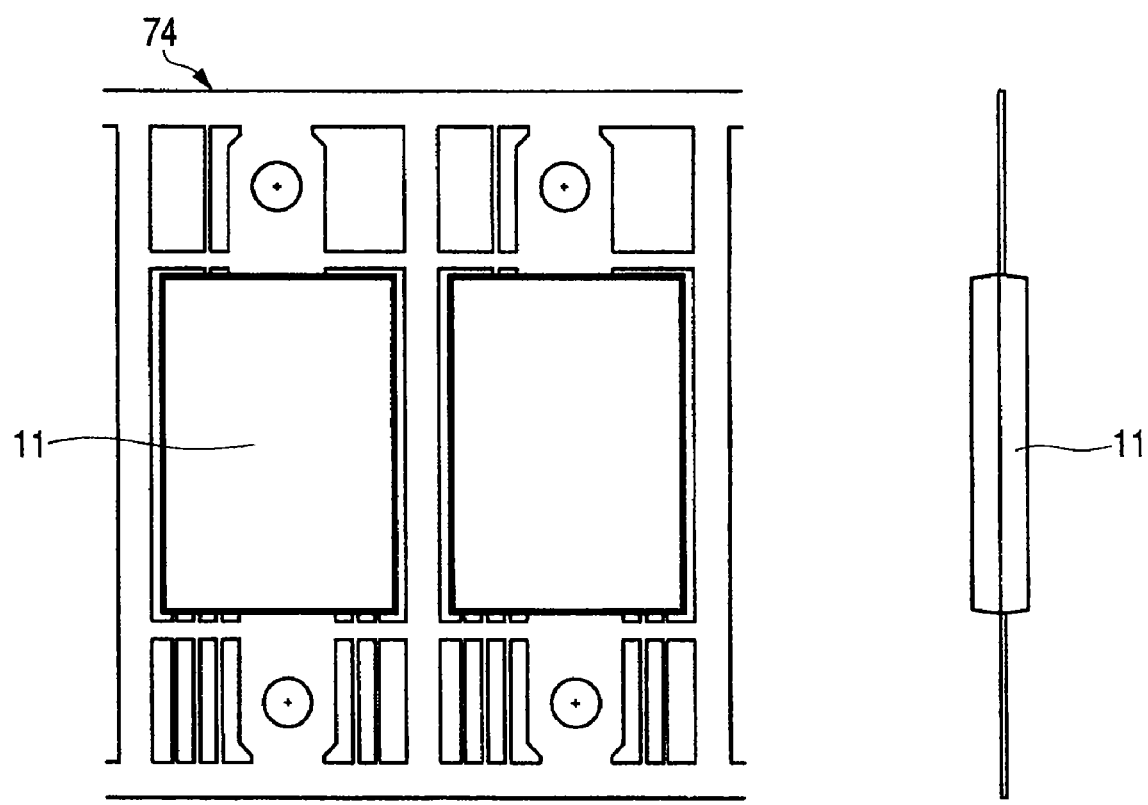
FIG. 26A is a plan view showing a manufacturing process of the semiconductor device continued from FIG. 25A.
FIG. 26B is a side view of FIG. 26A.
Figure 27A:
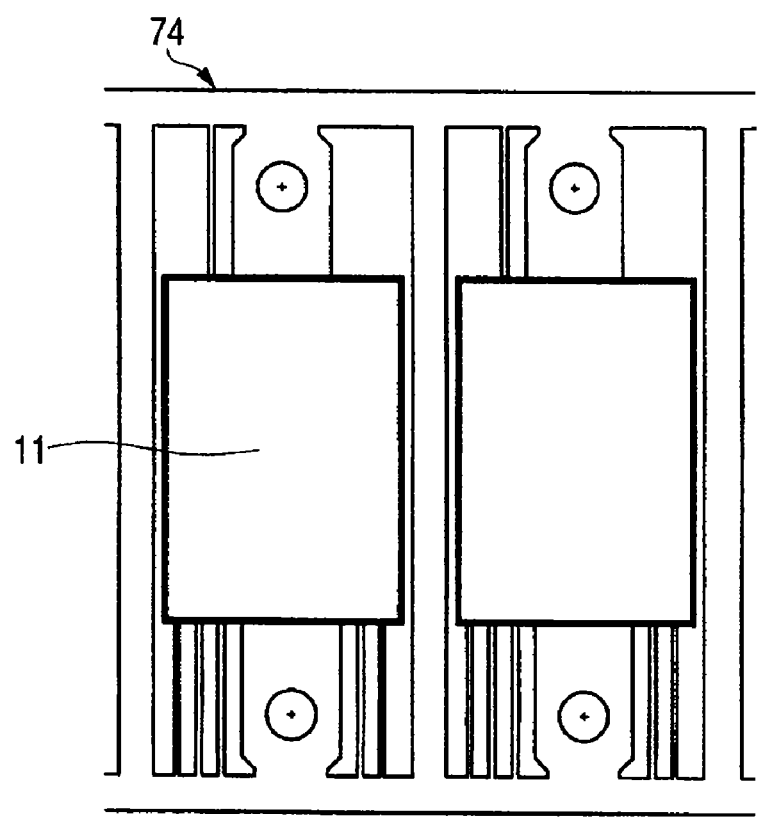
FIG. 27A is a plan view showing a manufacturing process of the semiconductor device continued from FIG. 26A.
Figure 27B:
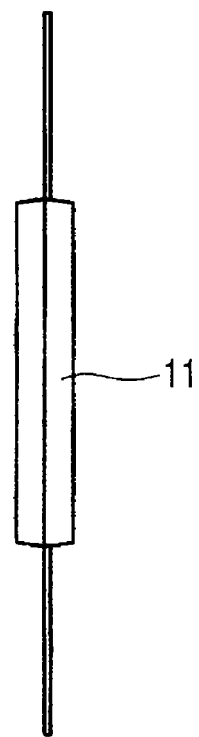
FIG. 27B is a side view of FIG. 27A.
Figure 28A:
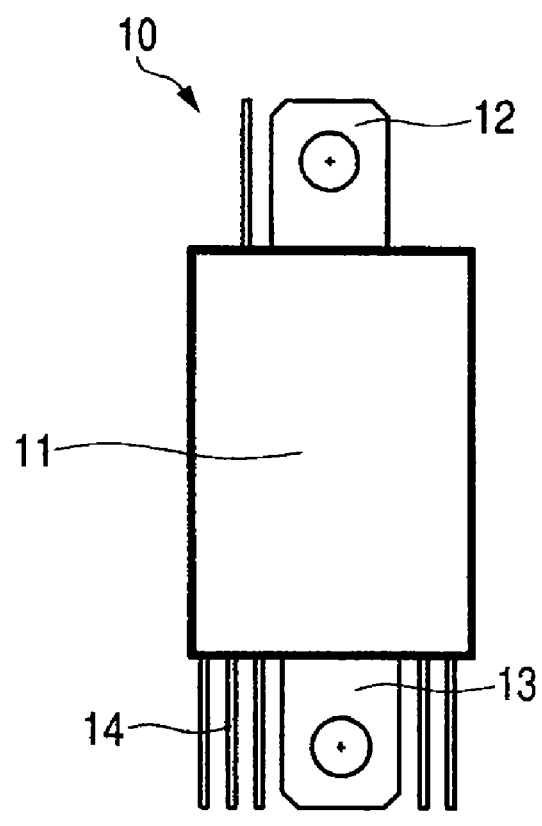
FIG. 28A is a plan view showing a manufacturing process of the semiconductor device continued from FIG. 27A.
Figure 28B:
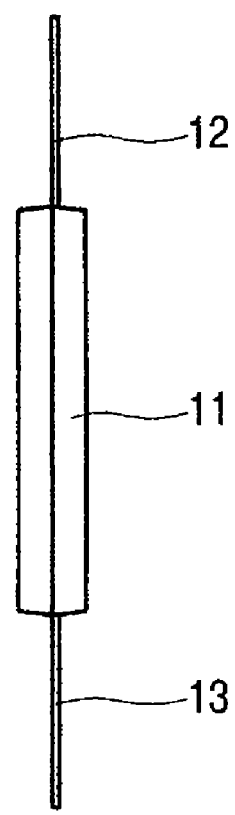
FIG. 28B is a side view of FIG. 28A.

Next, as shown in FIG. 26A and FIG. 26B, the die pad region on which the semiconductor chip 15 and the semiconductor chip 16 are mounted are sealed with the resin 11. Then, as shown in FIG. 27A and FIG. 27B, die bars are cut away. After that, plating processing is performed, then, cut into pieces as shown in FIG. 28A and FIG. 28B. At this time, the semiconductor device is formed. In the semiconductor device, the emitter electrode for external connection 13 and the signal electrode 14 protrude from the first edge side of the resin 11 and the collector electrode for external connection 12 and the signal electrodes 14 protrude from the second edge side which is opposite to the first edge. After that, signal electrodes 14 are fabricated to form the semiconductor device according to Embodiment 1 as shown in FIG. 29A and FIG. 29B.

Next, processes from a mounting process of the semiconductor chips to a process of wire bonding as one of features of the invention will be explained in more details.

Figure 30:
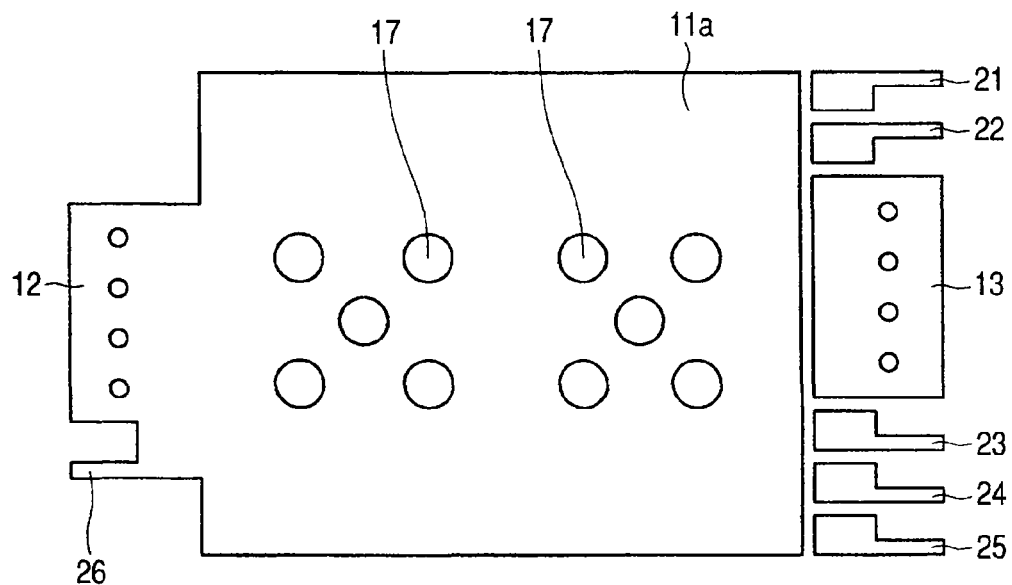
FIG. 30 is a plan view showing a manufacturing process of the semiconductor device in Embodiment 1.

As shown in FIG. 30, the solder 17 is formed over the semiconductor forming region (a first region and a second region) of the die pad 11a. The solder 17 can be formed by using, for example, a solder coating method or a solder printing method. As material for the solder 17, lead-free solder not including lead is used in consideration of environment. Specifically, solder including Tin (Sn), silver (Ag) and copper (Cu), or solder including Tin (Sn) and antimony (Sb) is used.

Here, at the first edge side of the die pad 11a, the emitter electrode for external connection 13, the electrodes for temperature detection 21, 22, the gate electrode for external connection 23, the electrode for Kelvin detection 24 and the electrode for current detection 25 are formed. These electrodes formed at the first edge side of the die pad 11a which are connected by using the clip 20 and the wires 28 are arranged. By arranging them in this manner, the process of wire bonding can be performed easily. On the other hand, at the second edge side which is opposite to the first edge of the die pad 11a, the collector electrode for external connection 12 is formed. Further, the electrode for Kelvin detection 26 which is electrically connected to the collector electrode for external connection 12 is formed. The electrode for Kelvin detection 26 is formed at the second edge side in the same way as the collector electrode for external connection 12 for being electrically connected to the collector electrode for external connection 12.

Figure 31:
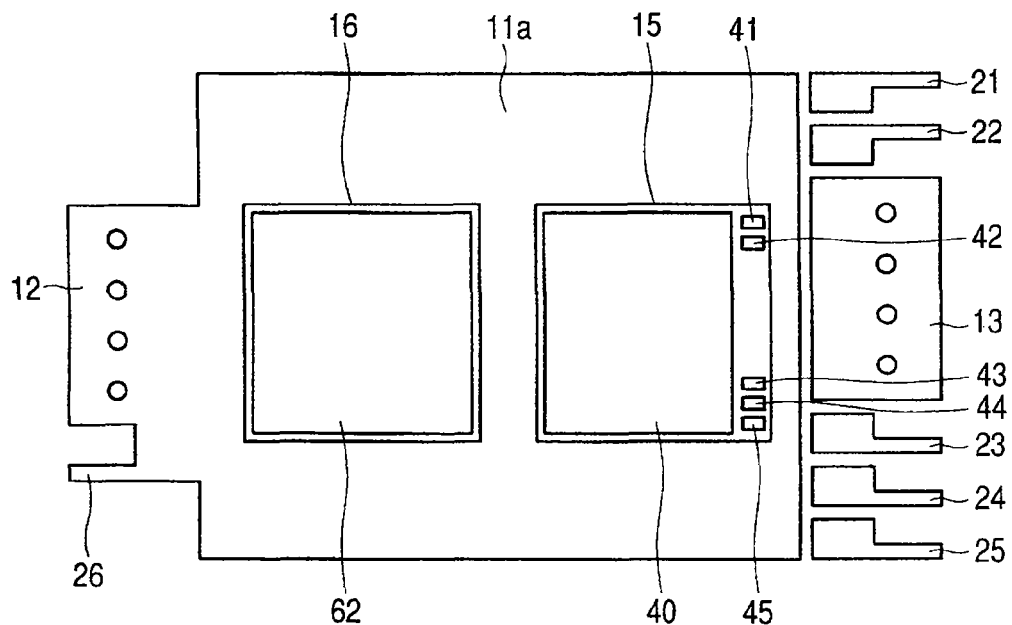
FIG. 31 is a plan view showing a manufacturing process of the semiconductor device continued from FIG. 30.

Next, as shown in FIG. 31, the semiconductor chip 15 and the semiconductor chip 16 are mounted over the die pad 11a over which the solder 17 is formed. Specifically, the semiconductor chip 15 is mounted over the first region of the die pad 11a and the semiconductor chip 16 is mounted over the second region of the die pad 11a. There is no preference in the mounting order of the semiconductor chip 15 and the semiconductor chip 16. However, concerning positions to be arranged, the semiconductor chip 15 in which the IGBT is formed is arranged at the side close to the first edge of the die pad 11a, and the semiconductor chip 16 in which the diode is formed is arranged at the side close to the second edge of the die pad 11a. It is because the plural bonding pads 41 to 45 are formed in addition to the emitter electrode 40 at the upper surface of the semiconductor chip 15 in which the IGBT is formed, and it is necessary that the plural bonding pads 41 to 45, the electrodes for temperature detection 21, 22, the gate electrode for external connection 23, the electrode for Kelvin detection 24 and the electrode for current detection 25 are respectively connected by using the wires 28. That is, it is necessary to arrange the plural bonding pads 41 to 45 formed at the semiconductor chip 15 at positions close to electrodes to be connected thereto. The anode electrode 62 is formed at the upper surface of the semiconductor chip 16 in which the diode is formed.

Figure 32:
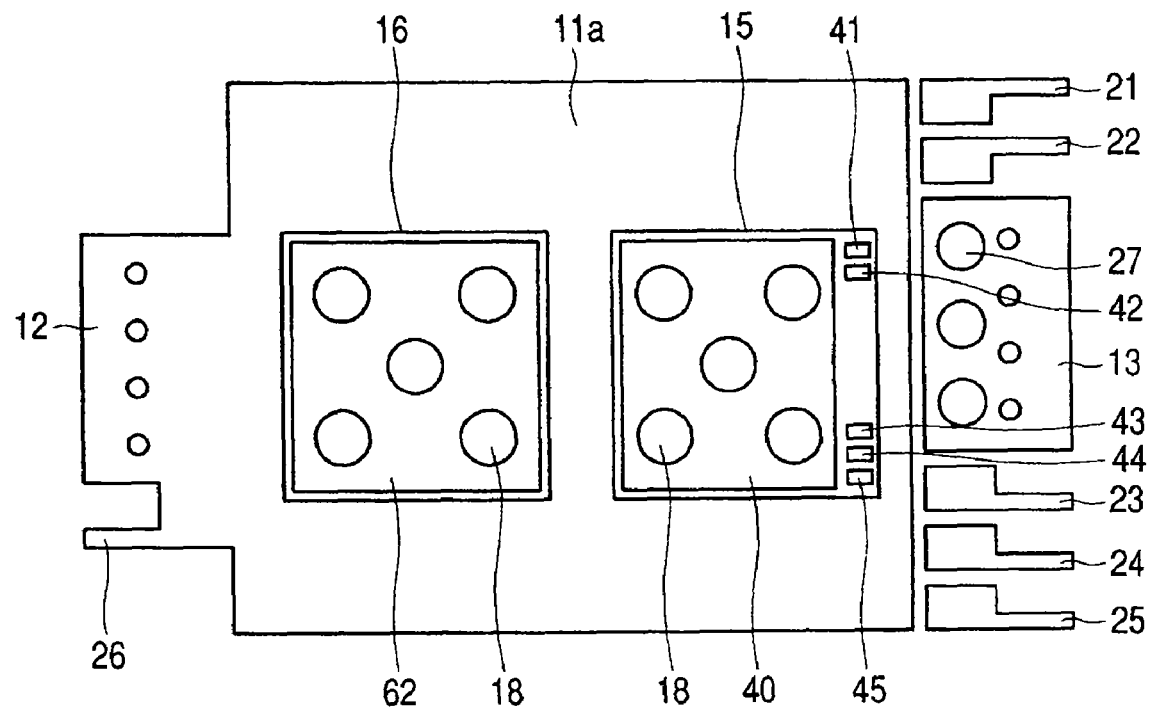
FIG. 32 is a plan view showing a manufacturing process of the semiconductor device continued from FIG. 31.

Subsequently, as shown in FIG. 32, the solder 18 is formed over the emitter electrode 40 of the semiconductor chip 15 and the anode electrode 62 of the semiconductor chip 16. Further, the solder 27 is formed over the emitter electrode for external connection 13. The solders 18, 27 can be formed by using the solder coating method or the solder printing method. As material for the solders 18, 27, lead-free solder not including lead is used in consideration of environment. Specifically, solder including Tin (Sn), silver (Ag) and copper (Cu), or solder including Tin (Sn) and antimony (Sb) is used.

Figure 33:
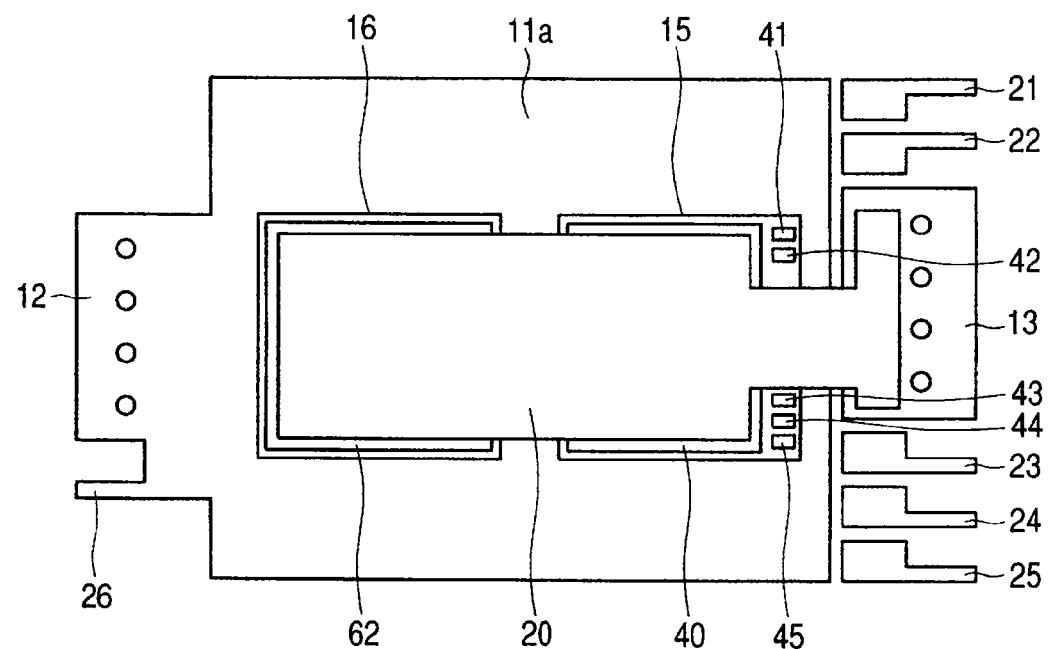
FIG. 33 is a plan view showing a manufacturing process of the semiconductor device continued from FIG. 32.

Next, as shown in FIG. 33, the clip 20 is mounted over the semiconductor chip 15 and the semiconductor chip 16. At this time, the clip 20 is arranged so as to touch the anode electrode 62 of the semiconductor chip 16 and the emitter electrode 40 of the semiconductor chip 15 through the solder 18. The clip 20 is also arranged so as to touch the emitter electrode for external connection 13 through the solder 27. A feature of the invention is that the clip 20 is arranged so that the clip 20 does not overlap with the plural bonding pads 41 to 45 formed at the semiconductor chip 15 in a flat state. According to the arrangement, the mounting process of the clip 20 can be performed before the connecting process by the wires 28. In addition, the shape of the clip 20 has a structure (convex shape) in which the region of the clip 20 between the semiconductor chip 15 and the semiconductor chip 16 protrudes upward from the regions of the clip 20 touching the semiconductor chip 15 and the semiconductor chip 16.

Figure 34:
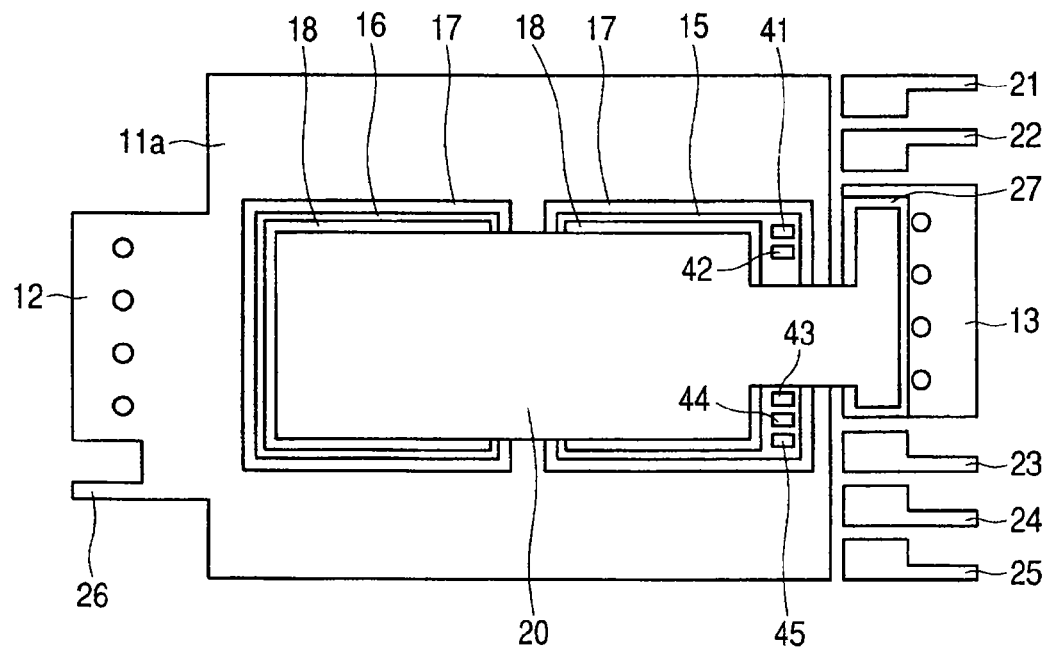
FIG. 34 is a plan view showing a manufacturing process of the semiconductor device continued from FIG. 33.

Subsequently, by reflowing as shown in FIG. 34, the solder 17, the solder 18 and the solder 27 are melted and fixed. Accordingly, the semiconductor chip 15 and the die pad 11a, the semiconductor chip 16 and the die pad 11a are fixed by the solder 17. Similarly, the semiconductor chip 15 and the clip 20, the semiconductor chip 16 and the clip 20 are fixed by the solder 18. Further, the clip 20 and the emitter electrode for external connection 13 are fixed by the solder 27. At this time, since the shape of the clip 20 has the structure (convex shape) in which the region of the clip 20 between the semiconductor chip 15 and the semiconductor chip 16 protrudes upward from the regions of the clip 20 touching the semiconductor chip 15 and the semiconductor chip 16, the molten solder 18 is absorbed in the convex shape of the clip 20 and does not flow to the side surface of the semiconductor chip 15 or the semiconductor chip 16. Therefore, short-circuit failure by the contact between the solder 18 and the solder 17 can be prevented.

Figure 35:
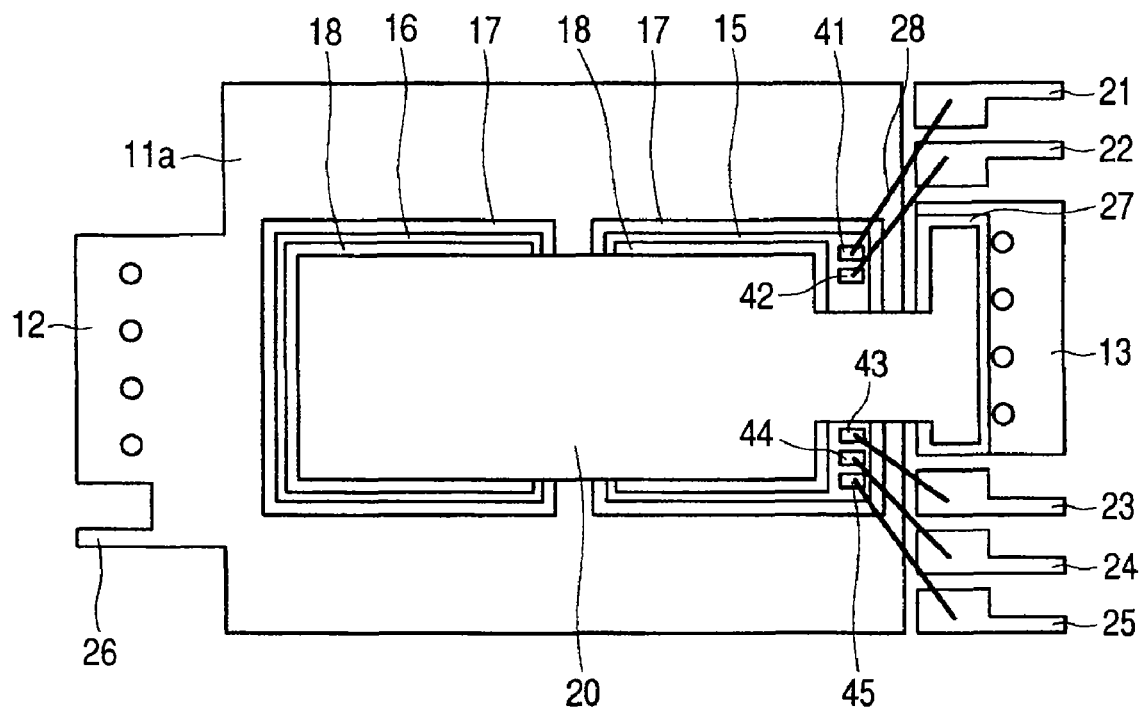
FIG. 35 is a plan view showing a manufacturing process of the semiconductor device continued from FIG. 34.

Next, as shown in FIG. 35, the bonding pads 41 to 45 formed at the semiconductor chip 15 are connected to the electrodes for temperature detection 21, 22, the gate electrode for external connection 23, the electrode for Kelvin detection 24 and the electrode for current detection 25 by the wires 28, respectively. Here, since the clip 20 is not formed just over the bonding pads 41 to 45, wire bonding using wires 28 can be performed.

The reason that the electrode for temperature detection 21, the electrode for temperature detection 22, the gate electrode for external connection 23, the electrode for Kelvin detection 24 and the electrode for current detection 25 are connected to the bonding pads 41 to 45 formed at the upper surface of the semiconductor chip 15 in which IGBT is formed, not by using the clip but by using the wires 28 is shown below. Purposes for using the clip 20 are to allow large current to flow, and to allow resistance to be low. Specifically, it is necessary that large current flows at the emitter electrode of the semiconductor chip 15 as well as necessary to allow the resistance of the electrode to be low, therefore, the clip 20 is used for the connection of the emitter electrode of the semiconductor chip 15, the anode electrode of the semiconductor chip 16 and the emitter electrode for external connection 13. On the other hand, the electrode for temperature detection 21, the electrode for temperature detection 22, the gate electrode for external connection 23, the electrode for Kelvin detection 24 and the electrode for current detection 25 (these electrodes are referred to as sensing electrodes) are electrodes for signal processing, therefore, it is not necessary that large current flows at these electrodes, and is not necessary to use the clip. Accordingly, the wires 28 are used for these electrodes, not using the clip. From a viewpoint of the manufacturing process, it seems that the process is more simplified when using not the wires 28 but the clip for the sensing electrodes because all electrodes can be connected by the clip formed at the same process. However, since the emitter electrode 40 formed at the semiconductor chip 15 and the anode electrode 62 formed at the semiconductor chip 16 have sufficiently large areas, they can be connected by using the clip 20. Whereas, the plural bonding pads 41 to 45 formed at the semiconductor chip 15 are small and adjacent to each other. When the bonding pads 41 to 45 are connected to the sensing electrodes by the clip, it is necessary to use a smaller clip, therefore, processing will be difficult. Since the clip is small, it is difficult to secure the accuracy of a mounting position for a clip, and short-circuit failure or open failure caused by the positional displacement of the clip tends to occur. Moreover, since the clip is small, there is a problem that the connection strength of the clip is insufficient and it is difficult to secure connection reliability. In addition, the clip requires much time to be mounted as compared with the wires 28, and there is a fear that costs increase by using more than the prescribed number of clips. According to the above, not the clip but the wires 28 are used for the connection between the sensing electrodes and the bonding pads 41 to 45.

One of features of the invention is in a point that wire bonding is performed after the clip 20 is mounted. For example, when the process of mounting the clip 20 is performed after wire bonding is performed, heat treatment by reflowing is performed after junctions by the wires 28 are formed. The heat load by the heat treatment is given to the junctions by the wires 28 and an alloy layer is formed to reduce the junction strength. That is to say, there is a fear that a break and the like occur by the reduction of the junction strength of the wires 28, which decreases reliability of the semiconductor device. In Embodiment 1, after the clip 20 is mounted and reflow processing is performed, the wire bonding process by the wires 28 are performed. Consequently, it is possible that heat load by reflowing is not given to the junctions by the wires 28. Therefore, the junction strength at the junctions of the wires 28 can be improved and the reliability of the semiconductor device is also improved.

As described above, a feature of the invention is in the point that the wire bonding process is performed after the clip 20 is mounted, and the reason that the manufacturing processes can be performed in that order is shown as follows. For example, as described in Patent Documents 3 to 5, when wires exist just under the clip, the clip is mounted inevitably after wire bonding is performed. However, in the manufacturing process, there arises the problem that heat load is given to the junctions of the wires and the junction strength of wires reduces as described above. In Embodiment 1, the clip 20 is not formed over the bonding pads 41 to 45 when the clip 20 is mounted. In other words, the clip 20 is formed at the region in which the clip 20 does not overlap with the bonding pads 41 to 45 in a flat state. According to the arrangement, it is possible to perform the wire bonding even when the clip 20 is mounted in advance.

Next, a feature of the invention is in a point that reflowing of the solder 17, the solder 18 and the solder 27 are performed at the same time. For example, it is possible that, after the semiconductor chip 15 and the semiconductor chip 16 are formed over the die pad 11a through the solder 17, a first reflow processing is performed, then, a second reflow processing is performed after the clip 20 is mounted over the semiconductor chip 15 and the semiconductor chip 16 through the solder 18. However, it is necessary to perform the reflow processing twice, which complicates the manufacturing process. Consequently, focusing attention on the points that the semiconductor chips 15, 16 and the die pad 11a are connected by the solder 17 and that the semiconductor chips 15, 16 and the clip 20 are connected by the solder 18, reflowing of the solder 17 and the solder 18 are performed at the same time as in Embodiment 1. The manufacturing process can be simplified by reflowing of the solder 17, the solder 18 and the solder 27 are performed at the same time.

It is also possible that the solder 17 and the solder 18 are formed from different kinds of solders, however, when using different kinds of solders, the reflowing temperature is different, therefore, reflowing is performed at the temperature corresponding to a solder having higher reflowing temperature when reflow processing is performed at the same time. It is difficult to optimize the reflow temperature in that case. Consequently, it is preferable that the solder 17 and the solder 18 are formed by the same solder material. It is possible to perform the batch reflowing at the optimum temperature by forming the solder 17 and the solder 18 by the same solder material. Moreover, there is an advantage that costs are reduced by forming the solder 17 and the solder 18 by the same solder material.

Figure 36A:
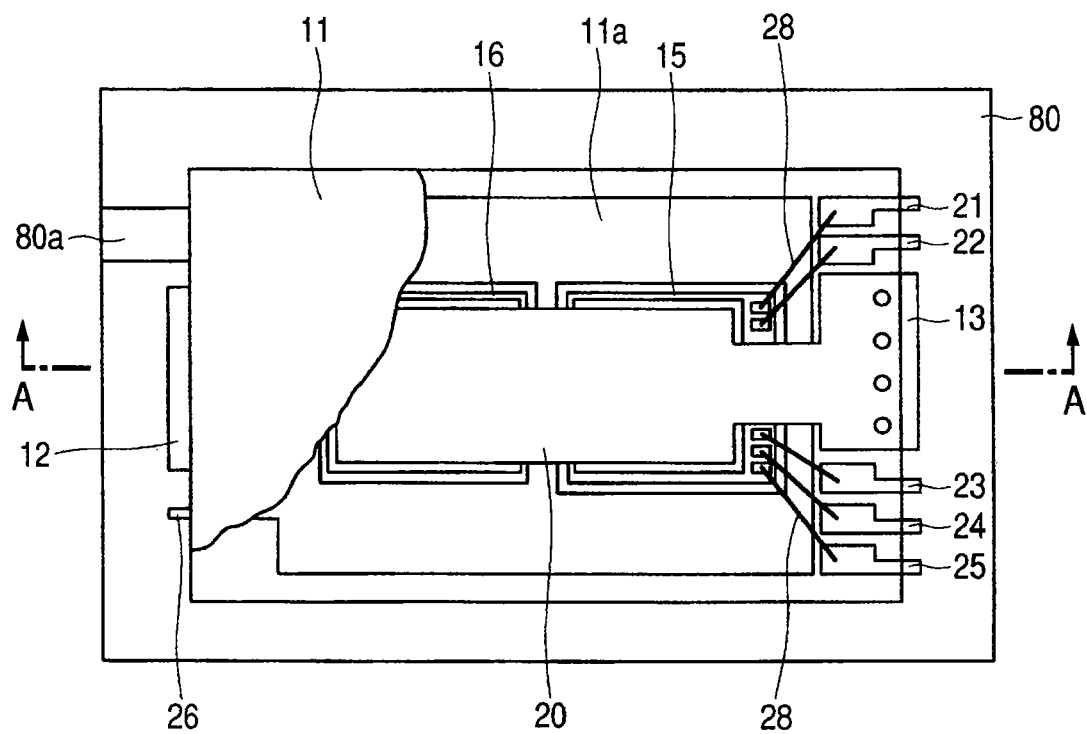
FIG. 36A is a plan view showing a manufacturing process of the semiconductor device.
Figure 36B:
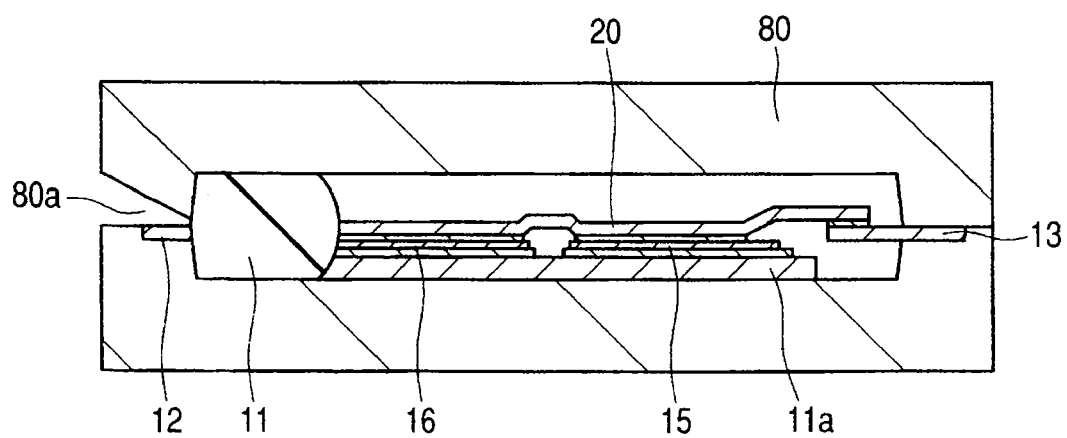
FIG. 36B is a cross-sectional view taken along an A-A line of FIG. 36A.

Next, a sealing process will be explained in detail. FIG. 36A is a plan view showing a state in which a lead frame after the wire bonding process is performed is fixed to a mold 80, and FIG. 36B is a cross-sectional view taken along an A-A line in the FIG. 36A. As shown in FIG. 36A and FIG. 36B, the resin 11 is allowed to flow in from a gate 80a. At this time, there is a feature in a point that the resin 11 flows from the second edge side of the die pad 11a. Specifically, the first edge side of the die pad 11a is made apart from the gate 80a, in which the wires 28 are formed. Accordingly, it is possible to prevent the wires 28 from receiving flow pressure of the resin 11 as much as possible, and possible to prevent deformation or breaks of the wires 28 occurring when the resin 11 flows in.

Figure 37A:
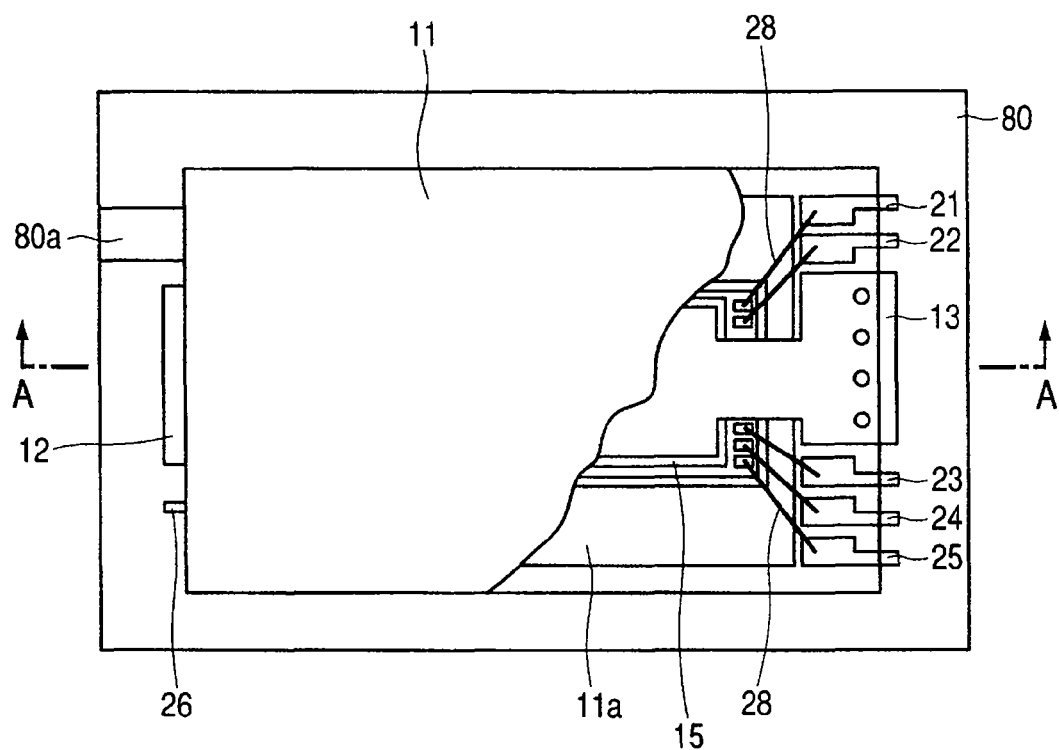
FIG. 37A is a plan view showing a manufacturing process of the semiconductor device.
Figure 37B:
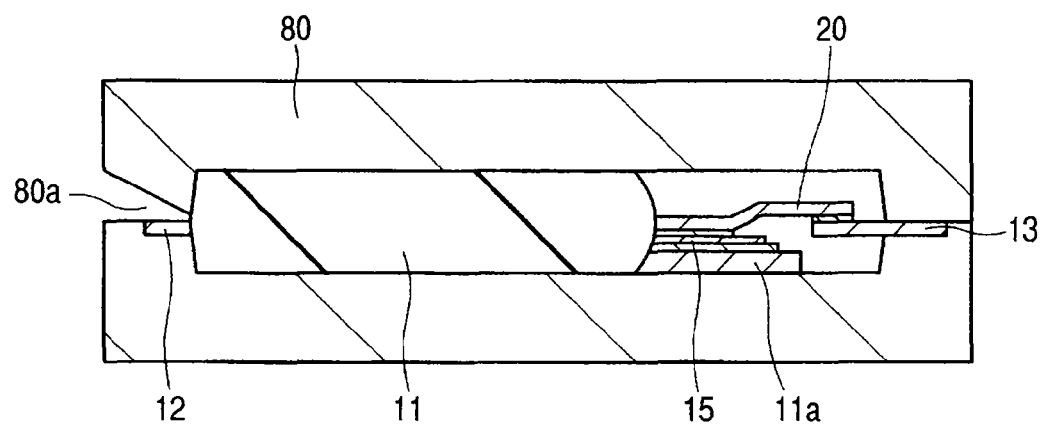
FIG. 37B is a cross-sectional view taken along an A-A line of FIG. 37A.
Figure 38A:
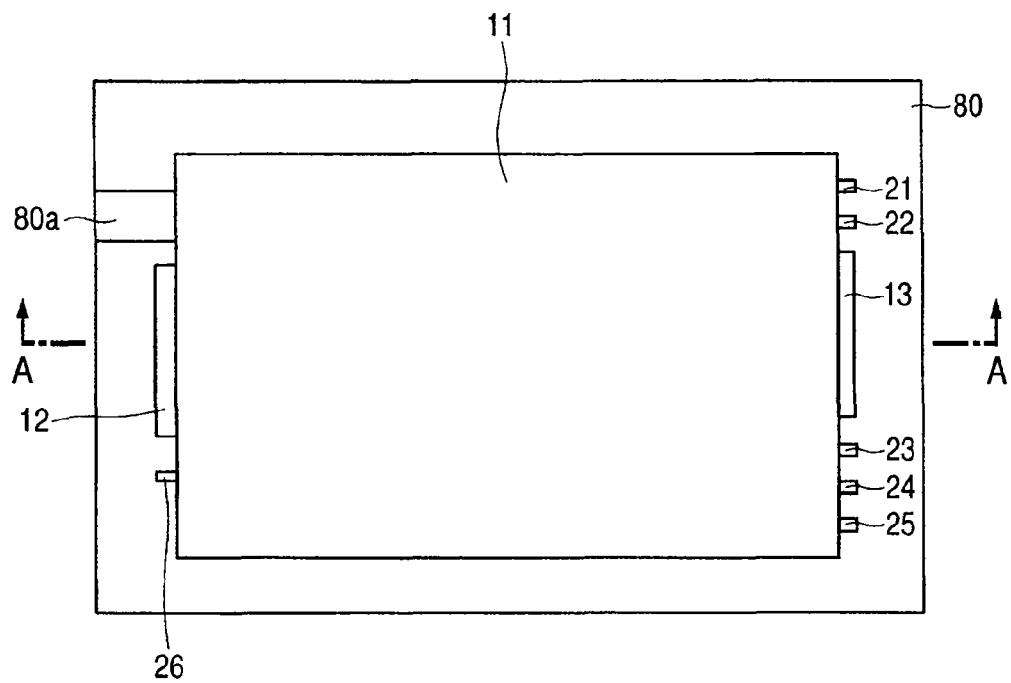
FIG. 38A is a plan view showing a manufacturing process of the semiconductor device.
Figure 38B:
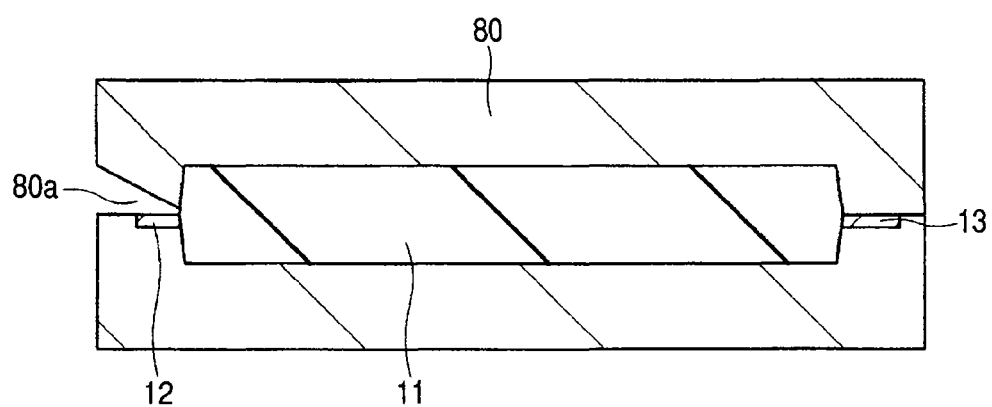
FIG. 38B is a cross-sectional view taken along an A-A line of FIG. 38A.

Subsequently, as shown in FIG. 37A and FIG. 37B, the resin 11 is kept on flowing in. Even when most of the die pad 11a is covered with the resin 11, the wires 28 do not touch the resin 11 yet. Therefore, the deformation or breaks of the wires 28 can be prevented. Then, as shown in FIG. 38A and FIG. 38B, the resin 11 is filled inside the mold 80 to finish the sealing process. Since the wires 28 are not covered with the resin 11 till this stage, a period of time while the wires 28 receives pressure from the resin 11 can be minimized. Accordingly, an effect of suppressing the deformation and breaks of the wires 28 can be obtained. As described above, the semiconductor device in Embodiment 1 can be formed.

Figure 39:
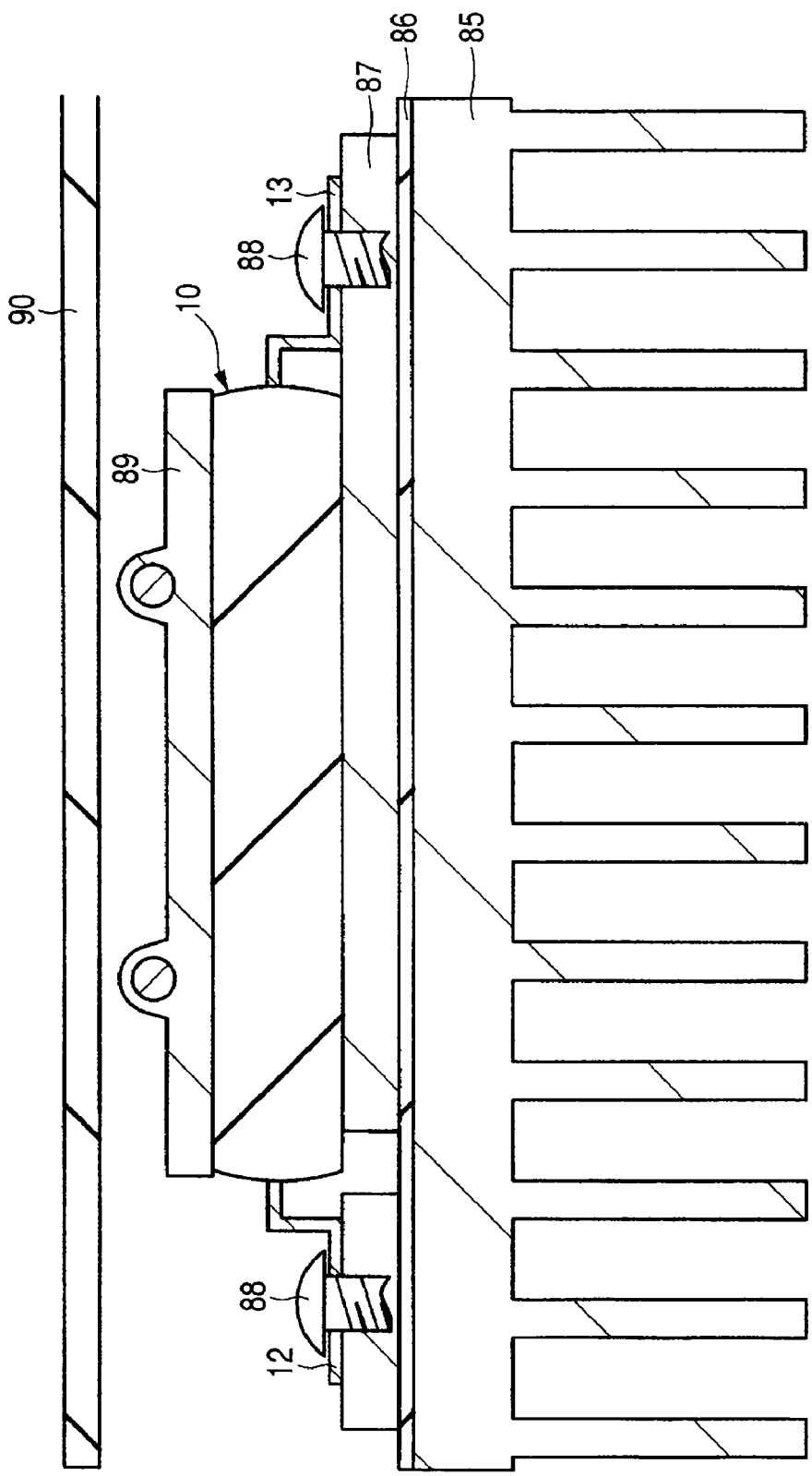
FIG. 39 is a cross-sectional view of the semiconductor device in Embodiment 1 mounted on a mounting substrate.

Next, FIG. 39 is a cross-sectional view showing the semiconductor device in Embodiment 1 mounted on a mounting substrate. In FIG. 39, a wiring substrate 87 is formed over a casing (heat sink) 85 through an insulating layer 86, and the semiconductor device 10 in Embodiment 1 is mounted over the wiring substrate 87. Specifically, a screw 88 is inserted into the screw opening of the emitter electrode for external connection 13 to be fixed, which protrudes from the resin portion of the semiconductor device 10. In the same manner, the screw 88 is inserted into the screw opening of the collector electrode for external connection 12 to be fixed. In addition, for example, a water-cooling heat sink 89 is provided above the semiconductor device 10. A signal processing substrate 90 is further provided above the semiconductor device 10 over which the heat sink 89 is provided. In the signal processing substrate 90, the control circuit to be connected to the gate electrode for external connection of the semiconductor device 10, the temperature detection circuit to be connected to the electrode for temperature detection, the Kelvin detection circuit to be connected to the electrode for Kelvin detection and the current detection circuit to be connected to the electrode for current detection and the like are formed. Though not shown in FIG. 39, the electrode for temperature detection, the gate electrode for external connection, the electrode for Kelvin detection and the electrode for current detection which are drawn from the resin portion of the semiconductor device 10 are folded upward to be electrically connected to the signal processing substrate 90.

Figure 40:
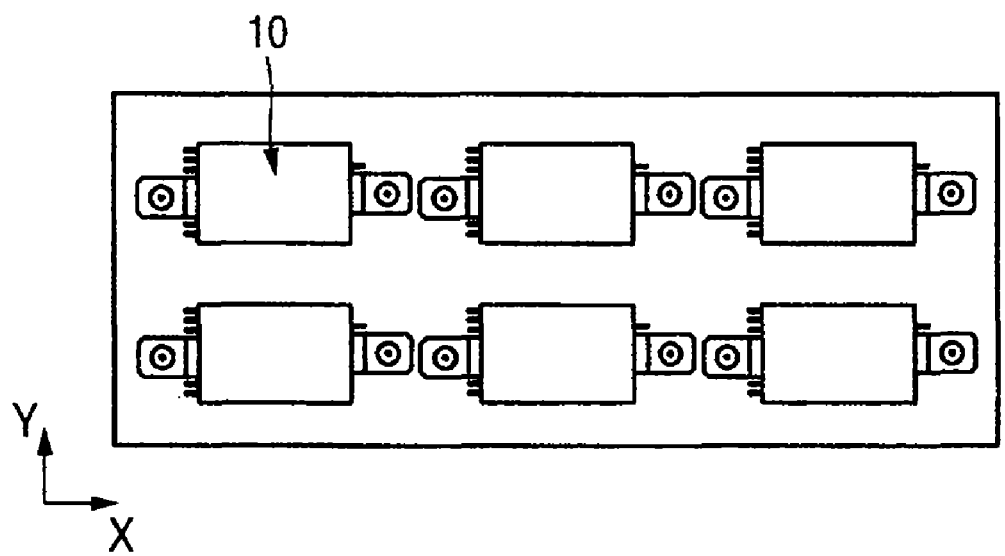
FIG. 40 is a plan view showing a layout structure in which the semiconductor device is mounted on the mounting substrate.
Figure 41:
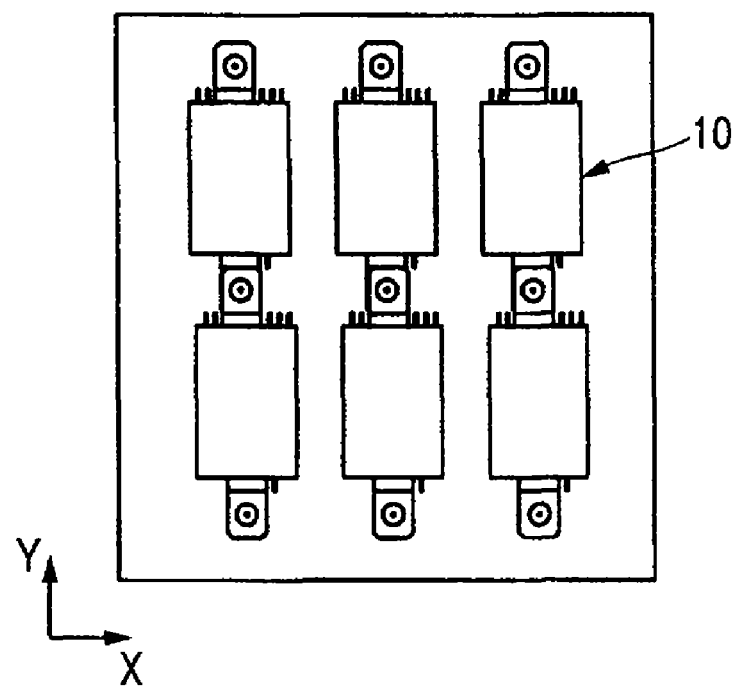
FIG. 41 is a plan view showing a layout structure in which the semiconductor device is mounted on the mounting substrate.
Figure 42:
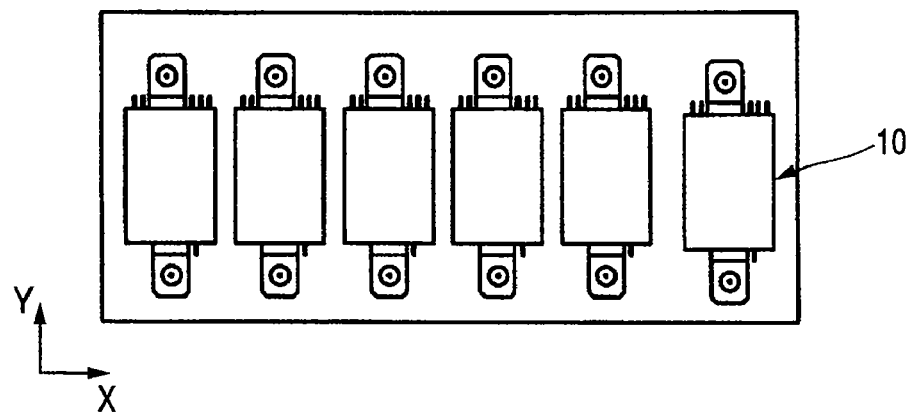
FIG. 42 is a plan view showing a layout structure in which the semiconductor device is mounted on the mounting substrate.

As described above, the semiconductor device 10 in Embodiment 1 is mounted on the mounting substrate (casing), and one IGBT and one diode are formed in the semiconductor device 10. Therefore, in the power semiconductor device forming the drive circuit of the three-phase motor requires six semiconductor devices 10 in Embodiment 1. A layout structure in which the six semiconductor devices 10 are mounted on the mounting substrate is shown in FIG. 40 to FIG. 42. FIG. 40 and FIG. 41 show examples in which three semiconductor devices 10 in the X direction and two semiconductor devices 10 in the Y direction are arranged, and FIG. 42 shows an example in which six semiconductor devices 10 are arranged in the X direction. According to the semiconductor device 10 in which one IGBT and one diode are formed in one package as in the semiconductor device 10 in Embodiment 1, mounting flexibility can be improved. Also according to the semiconductor device 10 in which one IGBT and one diode are formed in one package, general versatility can be increased, and the device can be applied to various products.

On the other hand, for example, in the semiconductor device in which two IGBTs and two diodes are formed in one package, the package size increases and general versatility is poor. In addition, there is a problem that costs increase. However, as in Embodiment 1, in the semiconductor device 10 in which one IGBT and one diode are formed in one package, the package size does not increase so much and costs can be saved. Moreover, it has lower integration degree as compared with the semiconductor device in which two IGBTs and two diodes are formed in one package, therefore, heating value is small and heat radiation efficiency can be improved.

According to a unit of the semiconductor device in which one IGBT is formed in one package, the number of mounting processes on the mounting substrate, however, according to the semiconductor device 10 in Embodiment 1, the number of mounting processes can be relatively decreased.

Embodiment 2

In Embodiment 2, in the clip to be mounted to the semiconductor chip, an example in which the thickness of portions of the clip touching the semiconductor chip is allowed to be thicker than other portions of the clip will be explained.

Figure 43:
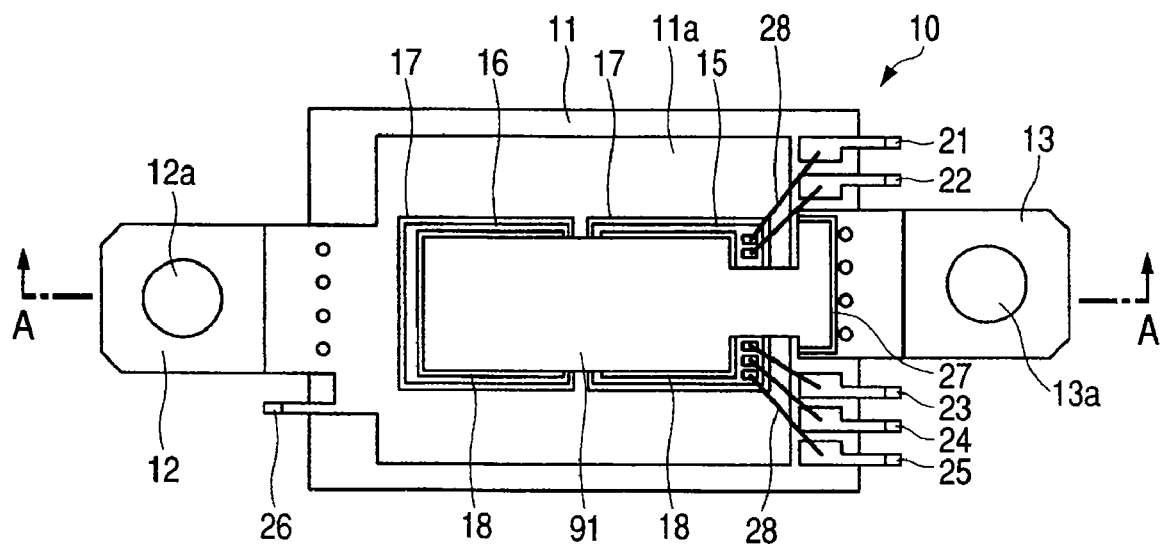
FIG. 43 is a plan view showing an internal structure of a semiconductor device in Embodiment 2.
Figure 44:
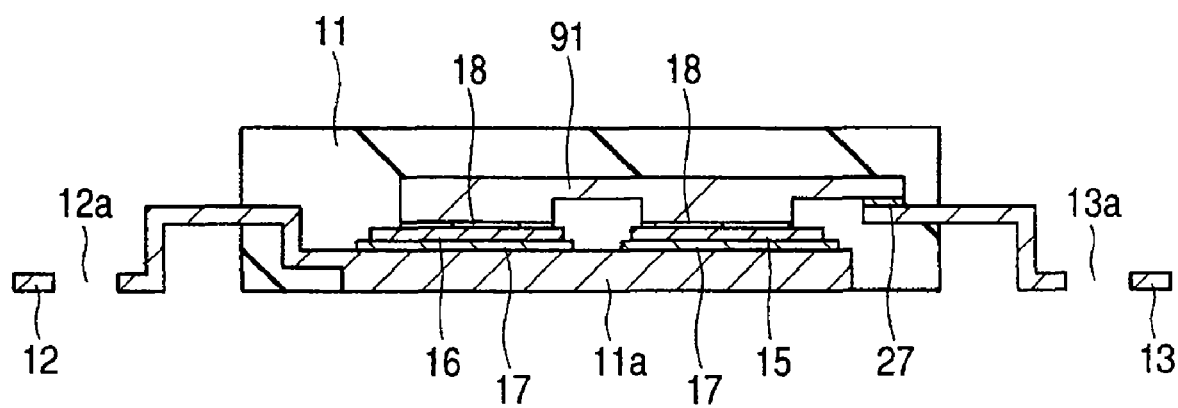
FIG. 44 is a cross-sectional view showing a cross section taken along an A-A line of FIG. 43.

FIG. 43 is a plan view showing an internal structure of a semiconductor chip 10 in Embodiment 2. The structure shown in FIG. 43 is the same structure as the internal structure of the semiconductor device 10 in Embodiment 1. FIG. 44 is a cross-sectional view showing a cross section taken along an A-A line in FIG. 43. In FIG. 44, a feature of the semiconductor device 10 in Embodiment 2 is in a point in which the shape of a clip 91 is devised. Specifically, the clip 91 is connected to the semiconductor chip 15 and the semiconductor chip 16 through the solder 18, and further, connected to the emitter electrode for external connection 13 through the solder 27. In the clip 91, the thickness of portions touching the semiconductor chip 15 and the semiconductor chip 16 is thicker than other portions. Accordingly, the clip 91 formed just over the semiconductor chip 15 and the semiconductor chip 16 can be thick, therefore, heat generated at the semiconductor chip 15 and the semiconductor chip 16 can be radiated immediately. That is, the thermal resistance of the clip 91 can be reduced. Particularly, since transient heat resistance can be reduced, a tolerated dose for breakdown of the semiconductor chip 15 and the semiconductor chip 16 by momentary thermal load can be improved.

Embodiment 3

In Embodiment 3, an example of changing drawing positions of electrodes which are drawn from the resin portion of the semiconductor device will be explained.

Figure 45:
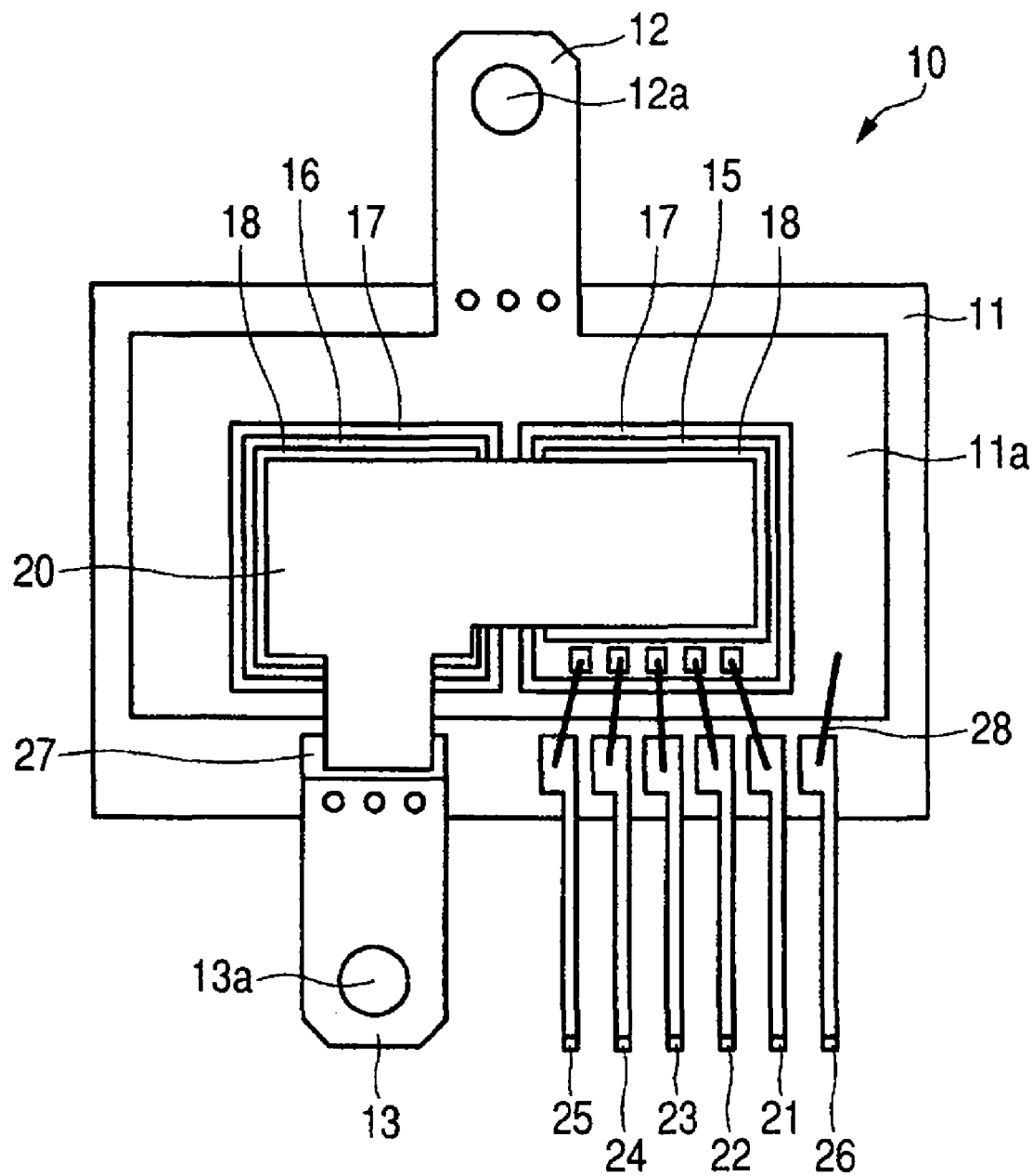
FIG. 45 is a plan view showing an internal structure of a semiconductor device in Embodiment 3.

FIG. 45 is a plan view showing an internal structure of the semiconductor device 10 in Embodiment 3. A point in which the semiconductor device 10 shown in FIG. 45 differs from Embodiment 1 is that drawing positions of the collector electrode for external connection 12, the emitter electrode for external connection 13, the electrodes for temperature detection 21, 22, the gate electrode for external connection 23, the electrode for Kelvin detection 24, the electrode for current detection 25 and the electrode for Kelvin detection 26 are different. In Embodiment 1, these electrodes are formed at the short edge sides of the die pad 11a whose planar shape is a rectangle shape. In Embodiment 3, these electrodes are formed at two edges at the long edge sides of the die pad 11a, which is opposite to each other. Specifically, the emitter electrode for external connection 13, the electrodes for temperature detection 21, 22, the gate electrode for external connection 23, the electrode for Kelvin detection 24, the electrode for current detection 25 and the electrode for Kelvin detection 26 are formed at one edge forming a long edge of the die pad 11a. The collector electrode for external connection 12 is formed at the edge which is opposite to one edge forming the long edge of the die pad 11a. The layout flexibility for arranging electrodes can be expanded by forming these electrodes at the long edge sides of the die pad 11a. Because there is a plenty of space for arrangement in the case that these electrodes are arranged at the long edge sides of the die pad 11a. In addition, since the long edge sides of the die pad 11a has a plenty of space for arranging the electrodes as compared with the short edge sides, it is possible to respond flexibly even when the number of electrodes increases. Moreover, the pitch between electrodes can be widened relatively easily.

Figure 46:
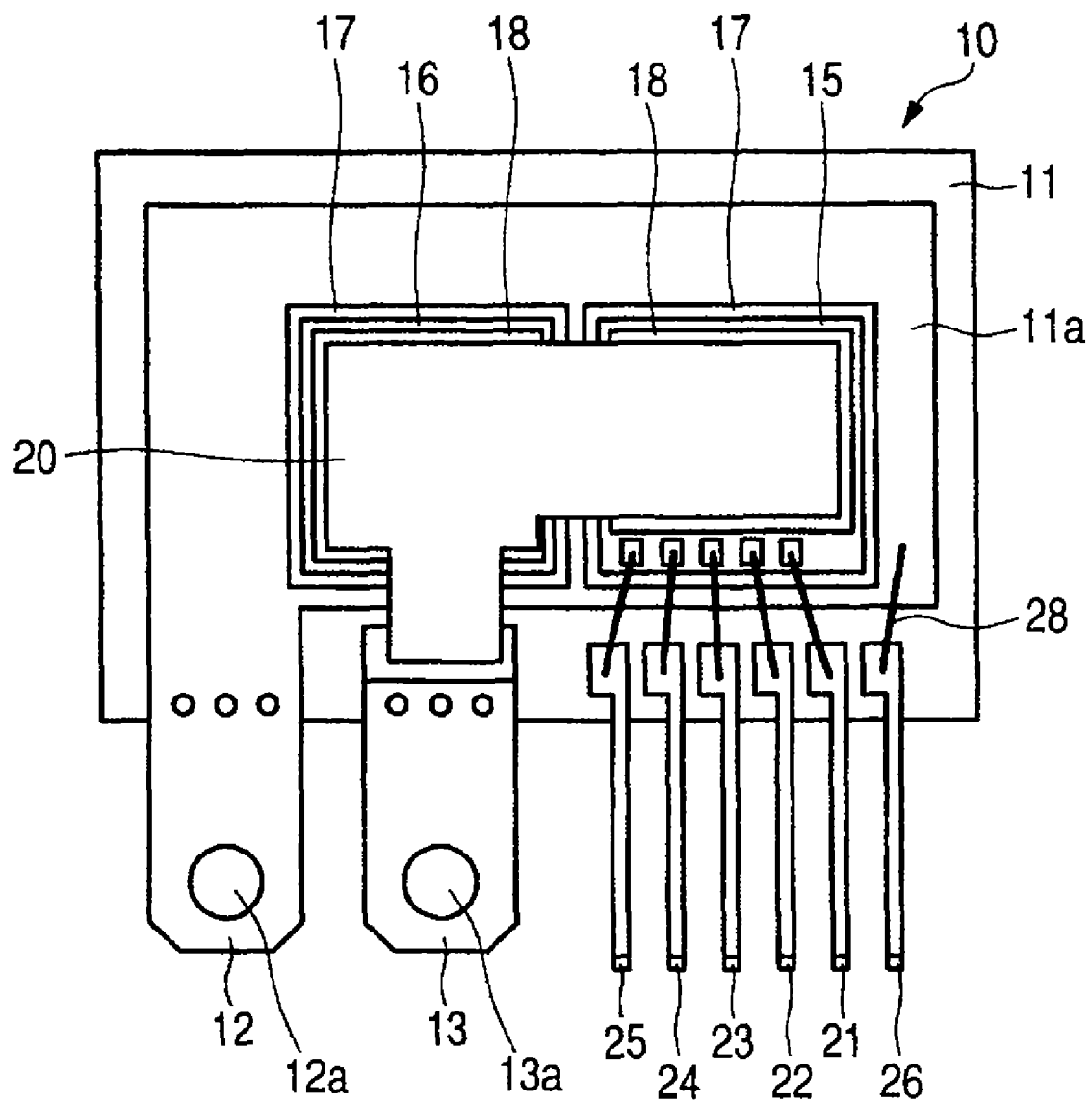
FIG. 46 is a plan view showing an internal structure of a semiconductor device in a modification example of Embodiment 3.

FIG. 46 is a plan view showing an internal structure of the semiconductor device 10 according to a modification example of Embodiment 3. A point different between FIG. 45 and FIG. 46 is that electrodes are formed at one edge of the long edge side and the edge opposite to one edge of the long edge side of the die pad 11a in FIG. 45 and that all electrodes are formed at one edge forming a long edge of the die pad 11a in FIG. 46. The all electrodes are formed at one edge forming the long edge of the die pad 11a in this manner, thereby having an effect shown in FIG. 45, as well as reducing the area occupied by the semiconductor device 10, which leads to miniaturization of the semiconductor device 10. According to the modification example of Embodiment 3, since the miniaturization of the semiconductor device 10 can be realized, mounting density for mounting the semiconductor device 10 on the mounting substrate can be improved.

Embodiment 4

In Embodiment 4, an example in which stress generated between the resin portion of the semiconductor device and electrodes drawing from the resin portion can be alleviated will be explained.

Figure 47:
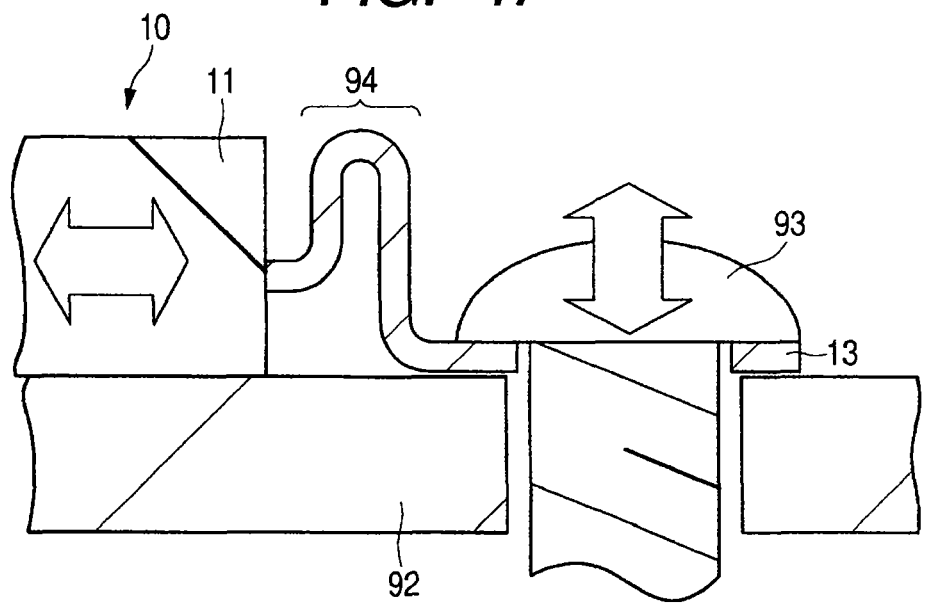
FIG. 47 is a partially enlarged view showing a state in which a semiconductor device is mounted on a mounting substrate in Embodiment 4.

FIG. 47 is a partially enlarged view showing a state in which the semiconductor device 10 is mounted on a mounting substrate 92. In FIG. 47, in the semiconductor device 10 in Embodiment 4, the emitter electrode for external connection 13 is drawn from the resin 11, and a screw 93 is inserted into a screw opening formed at the emitter electrode for external connection 13, thereby fixing the semiconductor device 10 to the mounting substrate 92. There is a portion in which a U-shape portion 94 is formed between the screw opening of the emitter electrode for external connection 13 and the resin 11. By providing the portion in which the U-shape portion 94 is formed at the emitter electrode for external connection 13, deformation of the emitter electrode for external connection 13 caused by screwing can be alleviated, and stress generated between the resin 11 and the screw 93 can be suppressed. Moreover, the resin 11 is thermally expanded by heat generation of the semiconductor device 10, at this time, stress is generated between the emitter electrode for external connection 13 which is screwed and the resin 11. However, since there is the U-shape portion 94 at the emitter electrode for external connection 13, the stress can be alleviated. As described above, it is possible to suppress the stress putting on the fixing portion of the clip formed inside the resin 11 and to prevent breakdown of the fixing portion of the clip by forming the U-shape portion 94 at the emitter electrode for external connection 13. In Embodiment 4, the example in which the U-shape portion 94 is formed at the emitter electrode for external connection 13 has been explained, however, it is also preferable to form the U-shape portion 94 at the collector electrode for external connection.

Embodiment 5

In Embodiment 5, an example in which a convex protrusion is provided at the junction between the clip and the emitter electrode for external connection, and a hole corresponding to the protrusion is provided at the emitter electrode for external connection will be explained.

Figure 48:
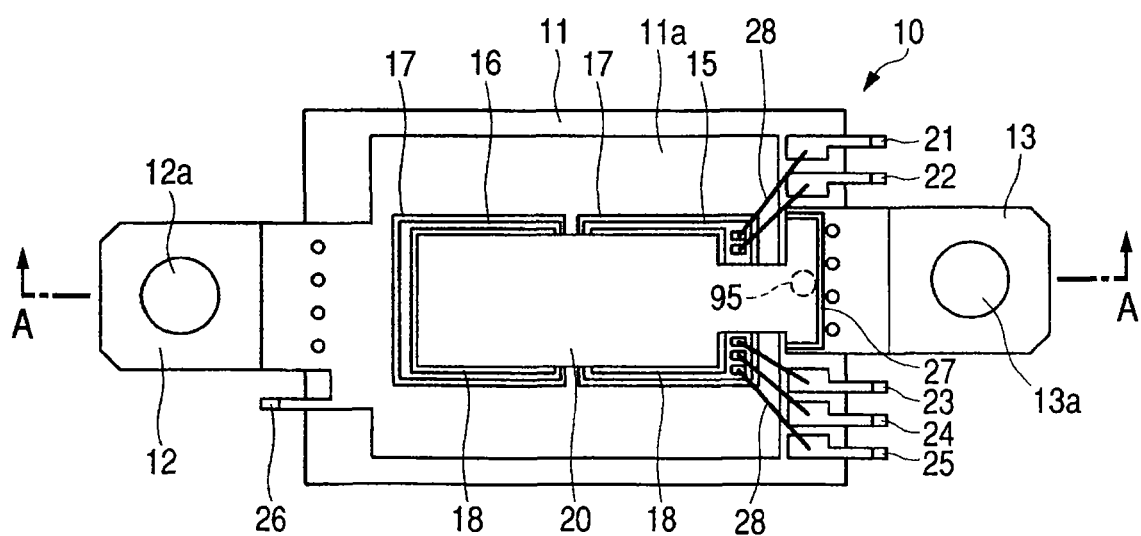
FIG. 48 is a plan view showing an internal structure of a semiconductor device in Embodiment 5.
Figure 49:
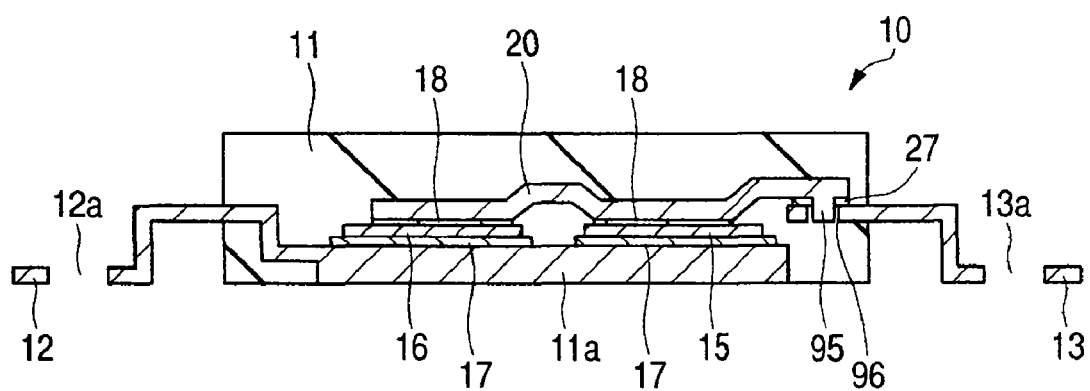
FIG. 49 is a cross-sectional view showing a cross section taken along an A-A line of FIG. 48.
Figure 50:
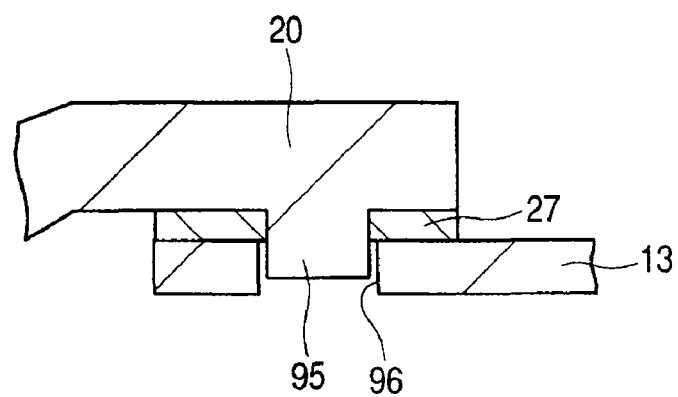
FIG. 50 is an enlarged view in which a junction between the clip and the emitter electrode for external connection is enlarged.

FIG. 48 is a plan view showing an internal structure of a semiconductor device 10 in Embodiment 5. In FIG. 48, a point in which the semiconductor device 10 in Embodiment 5 is different from Embodiment 1 is a point in which a convex protrusion 95 is provided at the junction between the clip 20 and the emitter electrode for external connection 13. FIG. 49 is a cross-sectional view showing a cross section taken along an A-A line in FIG. 48. As shown in FIG. 49, the protrusion 95 is provided at the junction between the clip 20 and the emitter electrode for external connection 13, and a hole 96 is formed at the emitter electrode for external connection 13, corresponding to the protrusion 95. FIG. 50 is an enlarged view in which the junction between the clip 20 and the emitter electrode for external connection 13 is enlarged. As shown in FIG. 50, the protrusion 95 is formed at the clip 20, and the protrusion 95 is inserted in the hole 96 formed at the emitter electrode for external connection 13. The solder 27 is used for connection between the clip 20 and the emitter electrode for external connection 13 as well as a lock mechanism by the protrusion 95 and the hole 96 is provided, thereby improving the junction strength at the junction and preventing breakdown by thermal fatigue caused by solder connection. Moreover, the mounting position of the clip 20 can be fixed by the mechanical lock mechanism by the protrusion 95 and the hole 96, which leads to improvement of positioning accuracy of the clip 20. In Embodiment 5, the protrusion 95 is provided at the clip 20 and the hole 96 is provided at the emitter electrode for external connection 13, however, it is also preferable that the hole is provided at the clip 20 and the protrusion is provided at the emitter electrode for external connection 13.

Embodiment 6

In Embodiment 6, protrusions are provided at the surface of the clip which touches the semiconductor chips will be explained.

Figure 51:
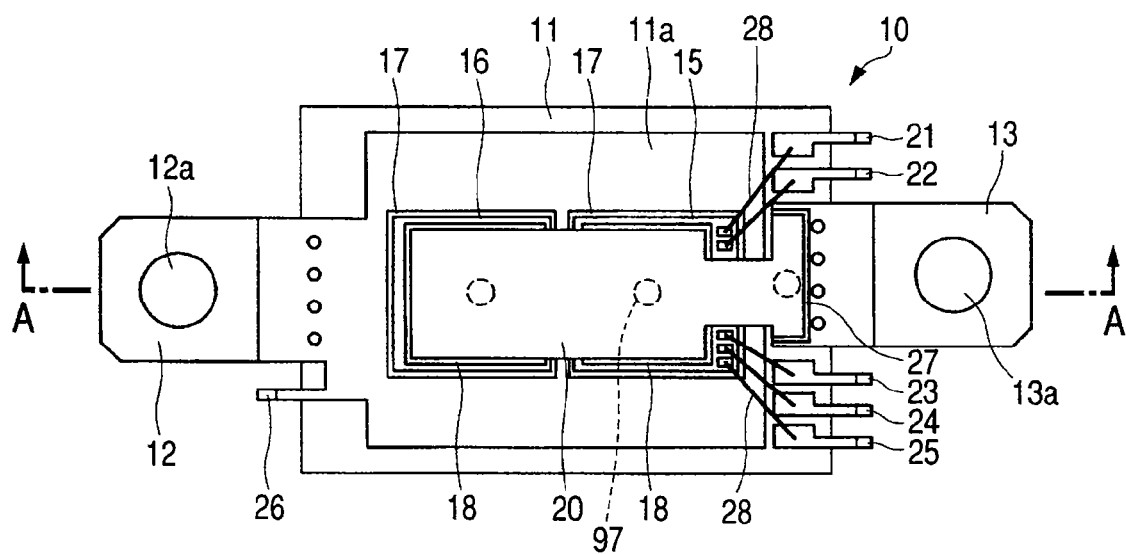
FIG. 51 is a plan view showing an internal structure of a semiconductor device in Embodiment 6.
Figure 52:
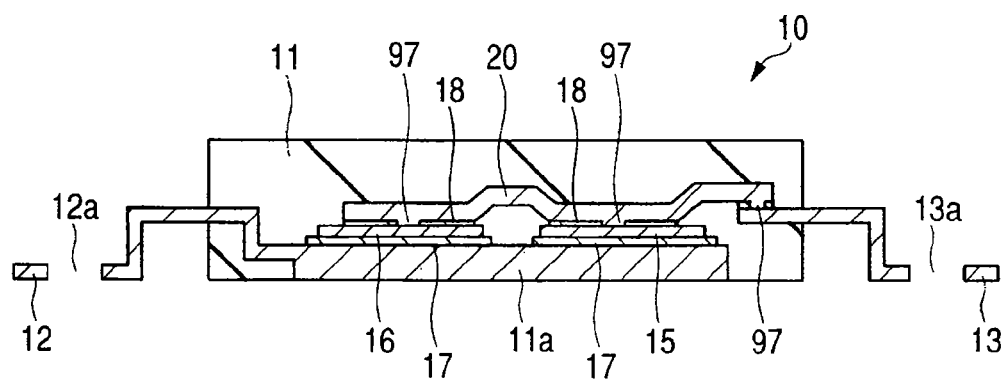
FIG. 52 is a cross-sectional view showing a cross-section taken along an A-A line of FIG. 51.
Figure 53:
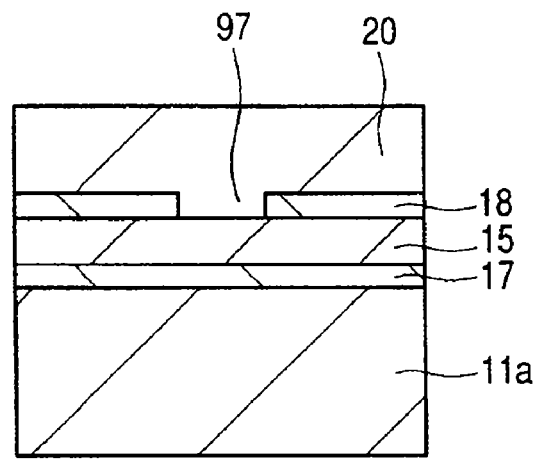
FIG. 53 is an enlarged view in which a junction between the clip and the semiconductor chip is enlarged.

FIG. 51 is a plan view showing an internal structure of a semiconductor device 10 in Embodiment 6. In FIG. 51, a point in which the semiconductor device 10 in Embodiment 6 is different from Embodiment 1 is a point in which convex protrusions 97 are provided at a contact surface between the clip 20 and the semiconductor chips 15, 16 and at a junction between the clip 20 and the emitter electrode for external connection 13. FIG. 52 is a cross-sectional view showing a cross section taken along an A-A line in FIG. 51. As shown in FIG. 52, the protrusions 97 are provided at contact portions between the clip 20 and the semiconductor chips 15, 16 and at the junction between the clip 20 and the emitter electrode for external connection 13, and the clip 20 is fixed over the semiconductor chips 15, 16 and the emitter electrode for external connection 13 by the protrusions 97. FIG. 53 is an enlarged view showing the clip 20 formed over the semiconductor chip 15. As shown in FIG. 53, the semiconductor chip 15 is mounted over the die pad 11a, and the die pad 11a and the semiconductor chip 15 are connected by the solder 17. The clip 20 is formed over the semiconductor chip 15, and the protrusion 97 formed at the clip 20 touches the semiconductor chip 15. In the case that the clip 20 is fixed over the semiconductor chip 15 by the protrusion 97 as in this case, the accuracy of height position of the clip 20 can be maintained.

In the case that there is not a protrusion 97, the height of the clip 20 varies depending on the solder 18. However, a fixed space is kept between the clip 20 and the semiconductor chip 15 by providing the protrusion 97, and the film thickness of the solder 18 can be kept constant by filling the space with the solder 18. Therefore, since the film thickness of the solder 18 can be naturally secured, reliability of solder connection can be improved. In addition, since the film thickness of the solder 18 is made thick, stress putting on the solder 18 can be alleviated as well as breakdown of solder connection and a chip crack caused at the semiconductor chip 15 can be prevented.

Embodiment 7

Figure 54:
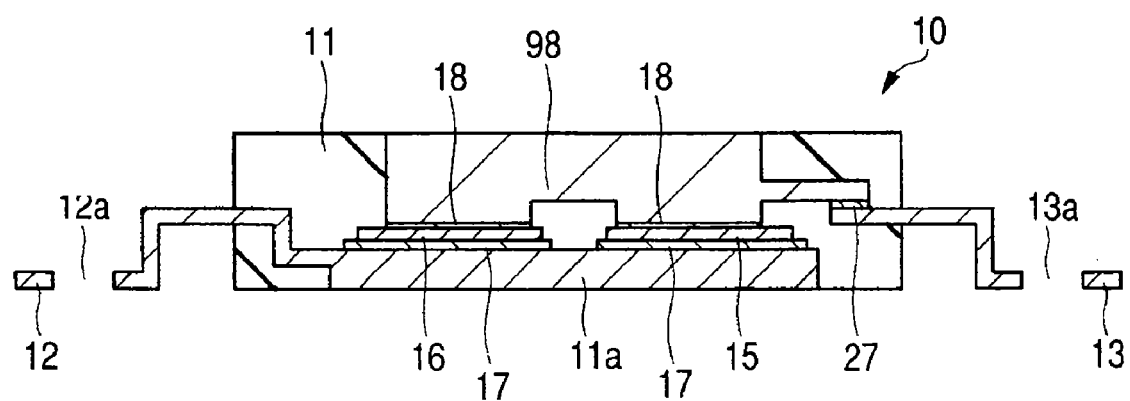
FIG. 54 is a cross-sectional view showing an internal structure of a semiconductor device in Embodiment 7.

In Embodiment 7, an example of a semiconductor device capable of improving heat radiation efficiency will be explained. FIG. 54 is a cross-sectional view showing a semiconductor device 10 in Embodiment 7. A point in which the semiconductor device 10 of Embodiment 7 shown in FIG. 54 is different from Embodiment 1 is a point in which an upper surface of a clip 98 is exposed from the resin 11. Specifically, the clip 98 is formed over the semiconductor chip 15 and the semiconductor chip 16 through the solder 18, and the upper surface of the clip 98 (surface opposite to the surface touching the semiconductor chip) is exposed from the resin 11. Therefore, in Embodiment 7, the lower surface (rear surface) of the die pad 11a is exposed from the resin 11 as well as the upper surface of the clip 98 is exposed from the resin 11. Since the die pad 11a and the clip 98 are exposed from the resin 11 in that manner, heat radiation efficiency of the semiconductor device 10 can be improved. Heat quantity to be generated is large, especially when using the high-power semiconductor device 10. According to Embodiment 7, since the die pad 11a and the clip 98 having high heat conductivity are exposed from upper and lower surfaces of the resin 11, heat radiation efficiency can be improved. That is, heat radiation efficiency can be improved even in the case of the high-power semiconductor device 10, therefore, reliability of the semiconductor device 10 can be improved.

In order to expose the upper surface of the clip 98 from the resin 11, the following technique can be used. First, the clip 98 is sealed with the resin 11 so that the clip 98 is covered. After that, there is a method, for example, that the resin 11 is polished by a liquid honing technique to expose the upper surface of the clip 98. The liquid honing technique is a method of polishing only the resin 11 by spraying abrasive and water to the resin 11 with high pressure. There is the liquid honing method as the method for exposing the upper surface of the clip 98 from the resin 11, however, it is also preferable that the resin 11 which covers the clip 98 is polished by a mechanical polishing to expose the upper surface of the clip 98.

Embodiment 8

In Embodiment 8, an example in which a process of mounting the semiconductor device on the mounting substrate can be simplified will be explained.

Figure 55:
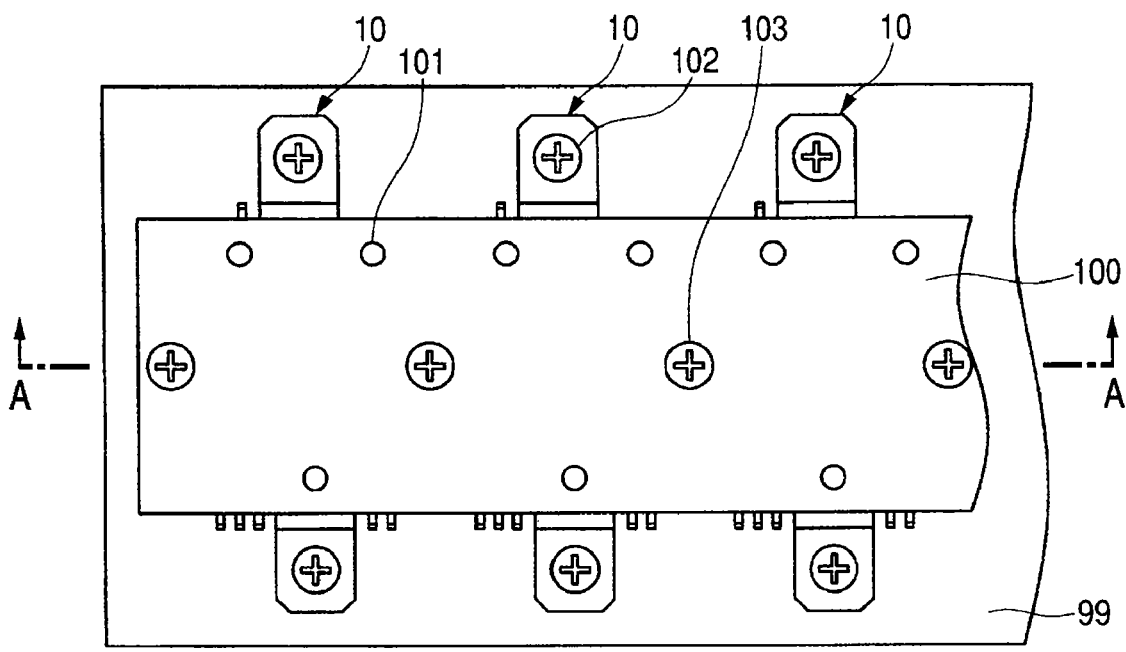
FIG. 55 is a cross-sectional view in which semiconductor devices in Embodiment 8 are mounted on a mounting substrate.
Figure 56:
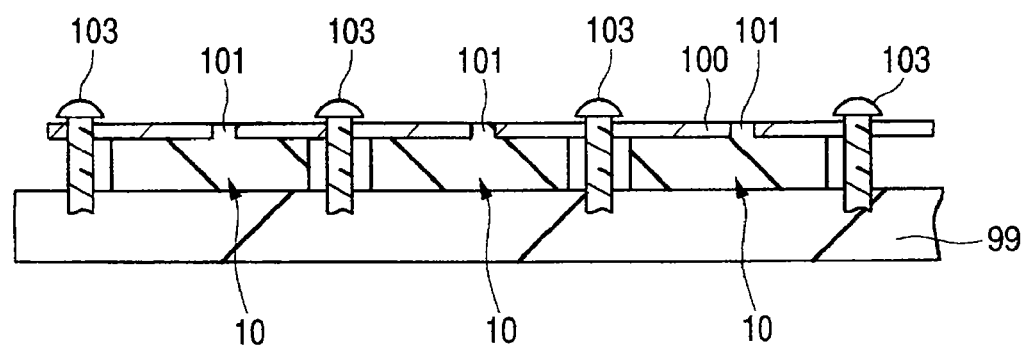
FIG. 56 is a cross-sectional view showing a cross section taken along an A-A line of FIG. 55.

FIG. 55 is a plan view showing a state in which semiconductor devices 10 in Embodiment 8 are mounted over a mounting substrate 99. FIG. 56 is a cross-sectional view showing a cross section taken along an A-A line in FIG. 55. As shown in FIG. 55, a plurality of semiconductor devices 10 are fixed to the mounting substrate 99 by screws 102. As shown in FIG. 56, protrusions 101 are formed at the resin portions of respective semiconductor devices 10 and a holding plate (heat sink) 100 is fitted to the protrusions 101. The holding plate 100 is formed over the plural semiconductor devices 10. In addition, the holding plate 100 is fixed to the mounting substrate 99 by screws 103. According to Embodiment 8, first, the plural semiconductor devices 10 are fixed to the mounting substrate 99 by the screws 102. Then, the protrusions 101 formed at the resin portions of the plural semiconductor devices 10 are fitted to concave portions formed at the holding plate 100 to be set. After that, the holding plate 100 is fixed to the mounting substrate 99 by screws 103. Accordingly, the plural semiconductor devices 10 can be mounted to the mounting substrate 99. Here, one holding plate is usually used with respect to one semiconductor device 10. However, according to the structure, it is necessary to fit holding plates corresponding to the number of semiconductor devices 10, and the mounting process is complicated. In Embodiment 8, one holding plate 100 is fit to the plural semiconductor devices 10 at a time. In this case, to fix the holding plate over the plural semiconductor devices 10 firmly, the protrusions 101 are provided at the resin portions of the semiconductor devices 10, and the concave portions corresponding to the protrusions 101 are formed in the holding plate 100 to be fixed thereto. The holding plate 100 is fixed to the mounting substrate 99 by the screws 103, and a screwing process can be simplified as compared with the case of fitting the holding plates to respective semiconductor devices 10 since one holding plate 100 is used with respect to the plural semiconductor devices 10.

The protrusions 101 are provided at the semiconductor devices 10 and the concave portions are provided at the holding plate 100, however, it is also preferable that the concave portions are provided at the semiconductor devices 10 and the protrusions are provided at the holding plate 100 in the opposite way.

As described above, the invention made by the inventors has been explained concretely based on the embodiments. It goes without saying that the invention is not limited to the embodiments and can be variously modified within the range not departing from the gist thereof.

The semiconductor device according to the invention can be broadly applied to, for example, the power semiconductor device used for an on-vehicle motor and the like. The method of manufacturing the semiconductor device according to the invention can be broadly applied to manufacturing industries manufacturing semiconductor devices.

What is claimed is:
1. A semiconductor device comprising:
(a) a first semiconductor chip having an upper surface and a rear surface opposite each other, and having a first pair of sides opposite each other in a plan view,
the first semiconductor chip including
an IGBT,
an emitter electrode formed at the upper surface,
a gate electrode bond pad formed at the upper surface,
a bonding pad formed at the upper surface, and
a collector electrode formed at the rear surface;
(b) a second semiconductor chip having an upper surface and a rear surface,
the second semiconductor chip including:
a diode,
an anode electrode formed at the upper surface of the second semiconductor chip, and a cathode formed at the rear surface of the second semiconductor chip;
(c) a die pad over which the first semiconductor chip and the second semiconductor chip are mounted;
(d) an external collector electrode integrally formed with the die pad;
(e) a plate electrode which is electrically connected to the emitter electrode of the first semiconductor chip and the anode electrode of the second semiconductor chip;
(f) an external emitter electrode which is electrically connected to the plate electrode;
(g) an external gate electrode which is electrically connected to the gate electrode bond pad of the first semiconductor chip;
(h) an external detection electrode provided for detecting a state of the IGBT of the first semiconductor chip;
(i) a first wire which is electrically connected to the external gate electrode and the gate electrode bond pad of the first chip; and
(j) a second wire which is electrically connected to the external detection electrode and the bonding pad of the first chip; and
(k) a sealing body sealing the first and second semiconductor chips, the first and second wires, the plate electrode, a part of the die pad, a part of the external emitter electrode, a part of the external collector electrode, and a part of the external gate electrode,
wherein the plate electrode overlaps with parts of both of the first pair of sides of the first semiconductor chip in the plan view,
wherein the plate electrode does not overlap with the gate electrode bond pad and the bonding pad in the plan view, and
wherein the first and second wires overlap with one of the first pair of sides of the first semiconductor chip in the plan view,
wherein the external emitter electrode is electrically connected to the plate electrode using solder,
wherein a region is formed at the upper surface of the first semiconductor chip so as to substantially surround the emitter electrode and the bonding pad, said region having a same potential as that of the collector electrode,
wherein the plate electrode extends over a side of said region and of the first semiconductor chip adjacent to the bonding pad and is configured to overlap with only a part of said side of said region in the plan view,
wherein, in the plan view, the plate electrode has a pair of sides that extend in a direction orthogonal to the first pair of sides of the first semiconductor chip, with a first cutout portion being formed in one of the pair of sides of the plate electrode such that the gate electrode bond pad is not covered by the plate electrode, and with a second cutout portion being formed in the other one of the pair of sides of the plate electrode such that the bonding pad is not covered by the plate electrode.

2. A semiconductor device according to claim 1,
wherein the second semiconductor chip has a pair of sides opposite each other in the plan view, and
wherein the plate electrode overlaps with one side of the pair of sides of the second semiconductor chip in the plan view.

3. A semiconductor device according to claim 1,
wherein, in the plan view, the plate electrode is disposed between the gate electrode bond pad and the bonding pad.

4. A semiconductor device according to claim 1,
wherein, in the plan view, a width of a portion of the plate electrode between the first cutout portion and the second cutout portion is narrower than a width of an exposed portion of the external emitter electrode.

5. A semiconductor device according to claim 4,
wherein the second semiconductor chip has a pair of sides opposite each other in the plan view,
wherein the first and the second semiconductor chips are mounted over the die pad such that one of the first pair of sides of the first semiconductor chip faces toward one of the pair of sides of the second semiconductor chip,
wherein the plate electrode overlaps with part of one side of the pair of sides of the second semiconductor chip,
wherein said exposed portion of the external emitter electrode extends outwardly from an edge of said semiconductor device, and
wherein said first semiconductor chip and said second semiconductor chip are arranged over said die pad such that a distance of said first semiconductor chip to said edge of the semiconductor device from which said exposed portion of the external emitter electrode extends is less than a distance of said second semiconductor chip to said edge of the semiconductor device from which said exposed portion of the external emitter electrode extends.

6. A semiconductor device according to claim 1,
wherein the die pad is electrically connected to the collector of the first semiconductor chip and the cathode of the second semiconductor chip.

7. A semiconductor device according to claim 6,
wherein the first and second semiconductor chips are mounted over the die pad using solder.

8. A semiconductor device according to claim 1,
wherein a surface of the die pad opposite to a surface on which the first and second semiconductor chips are mounted is exposed from the sealing body.

9. A semiconductor device according to claim 1,
wherein the plate electrode is electrically connected to the emitter electrode of the first semiconductor chip and the anode electrode of the second semiconductor chip using solder.

10. A semiconductor device according to claim 1,
wherein the plate electrode is copper.

11. A semiconductor device according to claim 1,
wherein portions of the external collector electrode and the external emitter electrode exposed from the sealing body each have a screw opening.

12. A semiconductor device according to claim 1,
wherein the first semiconductor chip has a rectangular shape in the plan view,
wherein the first semiconductor chip has a second pair of sides in the plan view, and
the plate electrode does not overlap with the second pair of sides in the plan view.

13. A semiconductor device according to claim 1,
wherein a part of upper and lower surfaces of the external emitter electrode is covered with the sealing body.

14. A semiconductor device according to claim 1,
wherein a connecting portion of the plate electrode and the external emitter electrode is covered with the sealing body.

15. A semiconductor device comprising:
(a) a first semiconductor chip having an upper surface and a rear surface opposite each other, and having a first pair of sides opposite each other in a plan view, the first semiconductor chip including
an IGBT,
an emitter electrode formed at the upper surface,
a gate electrode bond pad formed at the upper surface,
a bonding pad formed at the upper surface, and
a collector electrode formed at the rear surface;
(b) a second semiconductor chip having an upper surface and a rear surface opposite each other, and having a pair of sides opposite each other in the plan view,
the second semiconductor chip including:
a diode,
an anode electrode formed at the upper surface of the second semiconductor chip, and
a cathode formed at the rear surface of the second semiconductor chip;
(c) a die pad over which the first semiconductor chip and the second semiconductor chip are mounted;
(d) an external collector electrode integrally formed with the die pad;
(e) a plate electrode which is electrically connected to the emitter electrode of the first semiconductor chip and the anode electrode of the second semiconductor chip;
(f) an external emitter electrode which is electrically connected to the plate electrode;
(g) an external gate electrode which is electrically connected to the gate electrode bond pad of the first semiconductor chip;
(h) an external detection electrode provided for detecting a state of the IGBT of the first semiconductor chip;
(i) a first wire which is electrically connected to the external gate electrode and the gate electrode bond pad of the first chip; and
(j) a second wire which is electrically connected to the external detection electrode and the bonding pad of the first chip; and
(k) a sealing body sealing the first and second semiconductor chips, the first and second wires, the plate electrode, a part of the die pad, a first portion of the external emitter electrode, a part of the external collector electrode, and a part of the external gate electrode,
wherein the plate electrode overlaps with parts of both of the first pair of the sides of the first semiconductor chip in the plan view,
wherein the plate electrode does not overlap with the gate electrode bond pad and the bonding pad in the plan view,
wherein, in the plan view, the plate electrode overlaps with part of one side of the pair of sides of the second semiconductor chip,
wherein an exposed portion of the external emitter electrode extends outwardly from an edge of said semiconductor device,
wherein said first semiconductor chip and said second semiconductor chip are arranged over said die pad such that a distance of said first semiconductor chip to said edge of the semiconductor device from which said exposed portion of the external emitter electrode extends is less than a distance of said second semiconductor chip to said edge of the semiconductor device from which said exposed portion of the external emitter electrode extends,
wherein the external emitter electrode is electrically connected to the plate electrode using solder,
wherein a region is formed at the upper surface of the first semiconductor chip so as to substantially surround the emitter electrode and the bonding pad, said region having a same potential as that of the collector electrode,
wherein the plate electrode extends over a side of said region and of the first semiconductor chip adjacent to the bonding pad and is configured to overlap with only a part of said side of said region in the plan view, and wherein, in the plan view, the plate electrode has a pair of sides that extend in a direction orthogonal to the first pair of sides of the first semiconductor chip, with a first cutout portion being formed in one of the pair of sides of the plate electrode such that the gate electrode bond pad is not covered by the plate electrode, and with a second cutout portion being formed in the other of the pair of sides of the plate electrode such that the bonding pad is not covered by the plate electrode.

16. A semiconductor device according to claim 15,
wherein the plate electrode overlaps with only one side of the pair of sides of the second semiconductor chip in the plan view.

17. A semiconductor device according to claim 15,
wherein, in the plan view, the plate electrode is disposed between the gate electrode bond pad and the bonding pad.

18. A semiconductor device according to claim 15,
wherein, in the plan view, a width of a portion of the plate electrode between the first cutout portion and the second cutout portion is narrower than a width of the exposed portion of the external emitter electrode.

19. A semiconductor device according to claim 15,
wherein the first and the second semiconductor chips are mounted over the die pad such that one of the first pair of sides of the first semiconductor chip faces toward one of the pair of sides of the second semiconductor chip.

20. A semiconductor device according to claim 15,
wherein the die pad is electrically connected to the collector of the first semiconductor chip and the cathode of the second semiconductor chip.

21. A semiconductor device according to claim 20,
wherein the first and second semiconductor chips are mounted over the die pad using solder.

22. A semiconductor device according to claim 15,
wherein a surface of the die pad opposite to a surface on which the first and second semiconductor chips are mounted is exposed from the sealing body.

23. A semiconductor device according to claim 15,
wherein the plate electrode is electrically connected to the emitter electrode of the first semiconductor chip and the anode electrode of the second semiconductor chip using solder.

24. A semiconductor device according to claim 15,
wherein the plate electrode is copper.

25. A semiconductor device according to claim 15,
wherein portions of the external collector electrode and the external emitter electrode exposed from the sealing body each have a screw opening.

26. A semiconductor device according to claim 15,
wherein the first and second wires overlap with only one of the two first sides of the first semiconductor chip in the plan view.

27. A semiconductor device according to claim 15,
wherein the first semiconductor chip has a rectangular shape in the plan view,
wherein the first semiconductor chip has a second pair of sides in the plan view, and
the plate electrode does not overlap with the second pair of sides in the plan view.

28. A semiconductor device according to claim 15,
wherein a part of upper and lower surfaces of the external emitter electrode is covered with the sealing body.

29. A semiconductor device according to claim 15,
wherein a connecting portion of the plate electrode and the external emitter electrode is covered with the sealing body.

* * * * *